United States Patent
Sung et al.

(10) Patent No.: US 11,335,762 B2
(45) Date of Patent: *May 17, 2022

(54) DISPLAY DEVICE HAVING ENHANCED UV LIGHT BLOCKING

(71) Applicant: SAMSUNG DISPLAY CO., LTD., Yongin-si (KR)

(72) Inventors: Wooyong Sung, Seoul (KR); Junghan Seo, Seoul (KR); Kwanhyuck Yoon, Asan-si (KR); Sooyoun Kim, Siheung-si (KR); Jongki Kim, Seoul (KR); Seungho Yoon, Hwaseong-si (KR); Heeyeon Lee, Hwaseong-si (KR); Moonwon Chang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/989,253

(22) Filed: Aug. 10, 2020

(65) Prior Publication Data

US 2020/0373376 A1 Nov. 26, 2020

Related U.S. Application Data

(63) Continuation of application No. 16/173,554, filed on Oct. 29, 2018, now Pat. No. 10,756,156.

(30) Foreign Application Priority Data

Oct. 30, 2017 (KR) .................. 10-2017-0142792
Jan. 30, 2018 (KR) .................. 10-2018-0011478

(51) Int. Cl.
*H01L 27/32* (2006.01)
*H01L 51/52* (2006.01)
(Continued)

(52) U.S. Cl.
CPC ....... *H01L 27/3276* (2013.01); *G09G 3/3233* (2013.01); *G09G 3/3266* (2013.01);
(Continued)

(58) Field of Classification Search
CPC ............ H01L 27/3276; H01L 51/5284; H01L 51/5275; H01L 51/5253; H01L 51/5012;
(Continued)

(56) References Cited

U.S. PATENT DOCUMENTS 8,395,569 B2 3/2013 Min et al.
8,415,872 B2 4/2013 Choi et al.
(Continued)

FOREIGN PATENT DOCUMENTS

KR 1020110111746 A 10/2011
KR 1020130131147 A 12/2013
(Continued)

OTHER PUBLICATIONS

Exfended European Seach Report for Application No. 18203562.6 dated Aug. 7, 2019.
(Continued)

*Primary Examiner* — Quoc D Hoang
(74) *Attorney, Agent, or Firm* — Cantor Colburn LLP

(57) ABSTRACT

A display device includes a substrate, a pixel circuit unit which is disposed on the substrate and having a first hole, a light blocking layer which is disposed on the pixel circuit unit and having a second hole corresponding to the first hole, a light emitting layer disposed on the pixel circuit unit, and a sealing unit on the light blocking layer. The substrate includes a first layer having a depression corresponding to the first hole, and a second layer which is disposed between the first layer and the pixel circuit unit and having a third hole between the depression and the second hole. The sealing unit includes a cover portion on the light blocking
(Continued)

layer, and an extension portion extending from the cover portion. The depression has a width larger than a width of the third hole.

15 Claims, 60 Drawing Sheets

(51) Int. Cl.
| | | |
|---|---|---|
| G09G 3/3233 | (2016.01) | |
| G09G 3/3266 | (2016.01) | |
| G09G 3/3291 | (2016.01) | |
| H01L 51/50 | (2006.01) | |
| H01L 51/56 | (2006.01) | |

(52) U.S. Cl.
CPC ........ *G09G 3/3291* (2013.01); *H01L 27/3211* (2013.01); *H01L 27/3246* (2013.01); *H01L 27/3258* (2013.01); *H01L 27/3272* (2013.01); *H01L 51/5012* (2013.01); *H01L 51/524* (2013.01); *H01L 51/5206* (2013.01); *H01L 51/5221* (2013.01); *H01L 51/5253* (2013.01); *H01L 51/5256* (2013.01); *H01L 51/5275* (2013.01); *H01L 51/5284* (2013.01); *H01L 51/56* (2013.01); *G09G 2300/0426* (2013.01); *G09G 2300/0819* (2013.01); *G09G 2300/0842* (2013.01); *G09G 2300/0861* (2013.01)

(58) Field of Classification Search
CPC ............. H01L 51/5206; H01L 51/5221; H01L 51/524; H01L 51/56; H01L 51/5256
See application file for complete search history.

(56) References Cited

U.S. PATENT DOCUMENTS

| | | |
|---|---|---|
| 9,831,468 B2 | 11/2017 | Oh et al. |
| 9,905,629 B2 | 2/2018 | Kim et al. |
| 10,756,156 B2* | 8/2020 | Sung .................... H01L 51/5221 |
| 2013/0313547 A1 | 11/2013 | Nakano et al. |
| 2013/0314651 A1 | 11/2013 | Hwang et al. |
| 2014/0145979 A1 | 5/2014 | Lee |
| 2014/0216532 A1 | 8/2014 | Kim et al. |
| 2014/0322527 A1 | 10/2014 | Cho et al. |
| 2015/0047969 A1 | 2/2015 | Lee et al. |
| 2015/0221891 A1 | 8/2015 | Ghosh et al. |
| 2017/0154935 A1 | 6/2017 | Cai |
| 2017/0222188 A1 | 8/2017 | Lee et al. |
| 2018/0101276 A1 | 4/2018 | Hanari |
| 2021/0043873 A1* | 2/2021 | Sung .................... H01L 27/322 |

FOREIGN PATENT DOCUMENTS

| | | |
|---|---|---|
| KR | 1020150019890 A | 2/2015 |
| KR | 101569245 B1 | 11/2015 |
| KR | 1020160038552 A | 4/2016 |
| KR | 1020160054822 A | 5/2016 |
| KR | 1020170115177 A | 10/2017 |

OTHER PUBLICATIONS

European Partial Search Report for Application No. 18203562.6 dated Feb. 26, 2019.

\* cited by examiner

|  | TiO$_2$ | SiNx | SiNx | AlOx | AlOx | SiOx | SiOx |
|---|---|---|---|---|---|---|---|
| Refractive index (n) | 2.288 | 1.882 | 1.833 | 1.677 | 1.627 | 1.487 | 1.463 |
| Refractive index difference with TiO$_2$ | — | 0.406 | 0.455 | 0.611 | 0.661 | 0.801 | 0.825 |

|  | ①(TiO$_2$-SiNx) | ②(TiO$_2$-SiNx) | ③(TiO$_2$-AlOx) | ④(TiO$_2$-AlOx) | ⑤(TiO$_2$-SiOx) | ⑥(TiO$_2$-SiOx) |
|---|---|---|---|---|---|---|
| @405nm | 11.46 | 10.60 | 8.60 | 8.08 | 7.41 | 7.25 |
| @450nm | 70.88 | 74.35 | 76.89 | 77.33 | 78.10 | 78.30 |

| Transmittance | 5 pairs | 6 pairs | 7 pairs | 8 pairs | 9 pairs | 10 pairs |
|---|---|---|---|---|---|---|
| @405nm | 23.76 | 17.55 | 12.74 | 9.04 | 6.37 | 4.50 |
| @450nm | 80.08 | 81.93 | 83.68 | 84.08 | 82.54 | 80.14 |

| Transmittance | 3 pairs | 4 pairs | 5 pairs | 6 pairs | 7 pairs | 8 pairs |
|---|---|---|---|---|---|---|
| @405nm | 21.46 | 14.87 | 9.97 | 7.72 | 7.60 | 6.47 |
| @450nm | 79.50 | 79.86 | 80.16 | 79.48 | 79.61 | 79.93 |
| Thickness (Å) | 3650 | 4670 | 5740 | 6820 | 8130 | 9400 |

|  | TiO$_2$-SiNx | TiO$_2$-SiNx | TiO$_2$-AlOx | TiO$_2$-AlOx | TiO$_2$-SiOx | TiO$_2$-SiOx |
|---|---|---|---|---|---|---|
| @405nm | 11.46 | 10.60 | 8.60 | 8.08 | 7.41 | 7.25 |
| @450nm | 70.88 | 74.35 | 76.89 | 77.33 | 78.10 | 78.30 |

FIG. 35

| # | | | L1 | | L2 | | L3 | | L4 | | L5 | | L6 | | L7 | | Thickness | | |
|---|---|---|---|---|---|---|---|---|---|---|---|---|---|---|---|---|---|---|---|
| ① 5 pairs | $SiN_x$ | 5000 | | | | | | | | | | | | | | | $TiO_2$ | 1360 | Total |
| | $TiO_2$ | | 189 | 771 | 173 | 969 | 152 | 713 | 403 | 318 | 443 | 1061 | | | | | $Al_2O_3$ | 4407 | 5767 |
| | $Al_2O_3$ | 575 | | | | | | | | | | | | | | | | | |
| ② 7 pairs | $SiN_x$ | 5000 | | | | | | | | | | | | | | | $TiO_2$ | 1578 | Total |
| | $TiO_2$ | | 74 | 1470 | 87 | 733 | 248 | 645 | 202 | 1079 | 108 | 747 | 406 | 295 | 453 | 1046 | $Al_2O_3$ | 6577 | 8155 |
| | $Al_2O_3$ | 562 | | | | | | | | | | | | | | | | | |
| ③ 5 pairs | $SiN_x$ | 3000 | | | | | | | | | | | | | | | $TiO_2$ | 1360 | Total |
| | $TiO_2$ | | 189 | 771 | 173 | 969 | 152 | 713 | 403 | 318 | 443 | 1061 | | | | | $Al_2O_3$ | 4407 | 5767 |
| | $Al_2O_3$ | 575 | | | | | | | | | | | | | | | | | |
| ④ 7 pairs | $SiN_x$ | 3000 | | | | | | | | | | | | | | | $TiO_2$ | 1578 | Total |
| | $TiO_2$ | | 74 | 1470 | 87 | 733 | 248 | 645 | 202 | 1079 | 108 | 747 | 406 | 295 | 453 | 1046 | $Al_2O_3$ | 6577 | 8155 |
| | $Al_2O_3$ | 562 | | | | | | | | | | | | | | | | | |
| ⑤ 5 pairs | $SiN_x$ | 1000 | | | | | | | | | | | | | | | $TiO_2$ | 1460 | Total |
| | $TiO_2$ | | 164 | 709 | 250 | 730 | 234 | 643 | 253 | 962 | 409 | 1107 | 459 | 259 | 470 | 1047 | $Al_2O_3$ | 3668 | 5128 |
| | $Al_2O_3$ | 117 | | | | | | | | | | | | | | | | | |
| ⑥ 7 pairs | $SiN_x$ | 1000 | | | | | | | | | | | | | | | $TiO_2$ | 1947 | Total |
| | $TiO_2$ | | 35 | 1040 | 206 | 545 | 371 | 531 | 253 | 962 | 153 | 667 | 459 | 259 | 470 | 1047 | $Al_2O_3$ | 5168 | 7115 |
| | $Al_2O_3$ | 117 | | | | | | | | | | | | | | | | | |
| ⑦ 5 pairs | $SiN_x$ | 0 | | | | | | | | | | | | | | | $TiO_2$ | 1460 | Total |
| | $TiO_2$ | | 164 | 709 | 250 | 730 | 234 | 643 | 253 | 962 | 409 | 1107 | 459 | 259 | 470 | 1047 | $Al_2O_3$ | 3668 | 5128 |
| | $Al_2O_3$ | 117 | | | | | | | | | | | | | | | | | |
| ⑧ 7 pairs | $SiN_x$ | 0 | | | | | | | | | | | | | | | $TiO_2$ | 1947 | Total |
| | $TiO_2$ | | 35 | 1040 | 206 | 545 | 371 | 531 | 253 | 962 | 153 | 667 | 459 | 259 | 470 | 1047 | $Al_2O_3$ | 5168 | 7115 |
| | $Al_2O_3$ | 117 | | | | | | | | | | | | | | | | | |

DISPLAY DEVICE HAVING ENHANCED UV LIGHT BLOCKING

This application is a continuation of U.S. patent application Ser. No. 16/173,554, filed on Oct. 29, 2018, which claims priority to Korean Patent Applications No. 10-2017-0142792, filed on Oct. 30, 2017, and No. 10-2018-0011478, filed on Jan. 30, 2018, and all the benefits accruing therefrom under 35 U.S.C. § 119, the contents of which in their entireties are herein incorporated by reference.

1. FIELD

Exemplary embodiments of the invention relate to a display device improved in terms of a coupling force between a sealing unit and a substrate and an ultraviolet ("UV") light blocking ability, and to a method of fabricating the display device.

2. DISCUSSION OF RELATED ART

Display devices that have advantages of reduced weight and volume, compared to cathode ray tubes ("CRT") which have disadvantages of large weight and volume, may include liquid crystal display ("LCD") devices, field emission display ("FED") devices, plasma display panel ("PDP") devices and organic light emitting diode ("OLED") display devices, for example.

Among such display devices, OLED display devices display images using an OLED which generates light by recombination of electrons and holes.

SUMMARY

Ultraviolet ("UV") light that is contained in sunlight is applied to a light blocking layer of the organic light emitting diode ("OLED") display device, and an out-gas may be generated from the light blocking layer including an organic material. This out-gas damages OLEDs, which may cause defects such as pixel shrinkage.

Exemplary embodiments of the invention may be directed to a display device capable of enhancing a coupling force between substrates and having an excellent UV light blocking ability, and to a method of fabricating the display device.

According to an exemplary embodiment of the invention, a display device includes a substrate, a pixel circuit unit disposed on the substrate and in which a first hole is defined, a light blocking layer disposed on the pixel circuit unit and in which a second hole is defined, the second hole located corresponding to the first hole, a light emitting layer disposed on the pixel circuit unit to correspond to a light emission area defined by the light blocking layer, and a sealing unit on the light blocking layer. The substrate includes a first layer having a depression located corresponding to the first hole, and a second layer disposed between the first layer and the pixel circuit unit and in which a third hole is defined between the depression and the second hole. The sealing unit includes a cover portion disposed on the light blocking layer, and an extension portion extending from the cover portion to be inserted into the first hole, the second hole, the third hole and the depression. The depression has a width larger than a width of the third hole.

In an exemplary embodiment, the depression may have a width gradually increasing along a direction from the first layer toward the second layer.

In an exemplary embodiment, at least one of mutually facing inner walls of the depression may be inclined at a predetermined angle with respect to an interface between the first layer and the second layer.

In an exemplary embodiment, an angle defined between the at least one of mutually facing inner walls of the depression and the interface may be an obtuse angle.

In an exemplary embodiment, the third hole may be surrounded by the depression in plan view.

In an exemplary embodiment, the third hole may overlap the depression.

In an exemplary embodiment, the first hole, the second hole, the third hole, and the depression may be located in at least one of a display area and a non-display area of the substrate.

In an exemplary embodiment, the first hole, the second hole, the third hole, and the depression may be located between a high potential line and a data line that are disposed in the display area and are adjacent to each other.

In an exemplary embodiment, the display device may further include a driving circuit unit located in the non-display area and connected to a scan line or an emission control line of the pixel circuit unit.

In an exemplary embodiment, the display device may further include a plurality of clock lines disposed in the non-display area and connected to the driving circuit unit. The first hole, the second hole, the third hole, and the depression may be located between adjacent clock lines of the plurality of clock lines.

In an exemplary embodiment, one of the mutually facing inner walls of the depression and one of mutually facing inner walls of the first hole may be located on a straight line.

In an exemplary embodiment, one of the first layer and the second layer may include an organic material, and the other of the first layer and the second layer may include an inorganic material.

According to an exemplary embodiment of the invention, a display device includes a substrate, a pixel circuit unit on the substrate, a light blocking layer disposed on the pixel circuit unit and in which a first hole is defined, a light emitting layer disposed on the pixel circuit unit to correspond to a light emission area defined by the light blocking layer, and a sealing unit disposed on the light blocking layer. The pixel circuit unit includes a first layer having a depression located corresponding to the first hole, a second layer disposed on the first layer and in which a second hole is defined between the depression and the first hole, and a third layer disposed on the second layer and in which a third hole is defined between the second hole and the first hole. The sealing unit includes a cover portion disposed on the light blocking layer, and an extension portion extending from the cover portion to be inserted into the first hole, the second hole, the third hole and the depression. The depression has a width larger than a width of the second hole.

In an exemplary embodiment, the depression may have a width gradually increasing along a direction from the first layer toward the second layer.

In an exemplary embodiment, at least one of mutually facing inner walls of the depression may be inclined at a predetermined angle with respect to an interface between the first layer and the second layer.

In an exemplary embodiment, an angle defined between the at least one of mutually facing inner walls of the depression and the interface may be an obtuse angle.

In an exemplary embodiment, the first hole, the second hole, the third hole, and the depression may be located in at least one of a display area and a non-display area of the substrate.

According to an exemplary embodiment of the invention, a method of manufacturing a display device includes preparing a carrier substrate, sequentially forming a first layer and a second layer on the carrier substrate, forming a pixel circuit unit on the second layer, forming a light blocking layer on the pixel circuit unit, the light blocking layer defining a light emission area, defining a first hole through the light blocking layer, defining a second hole through an insulating layer of the pixel circuit unit corresponding to the first hole, defining a third hole through the second layer corresponding to the second hole, defining a depression in the first layer to correspond to the third hole, the depression having a width larger than a width of the third hole, and forming a sealing unit which includes a cover portion on the light blocking layer, and an extension portion extending from the cover portion to be buried in the first hole, the second hole, the third hole, and the depression.

In an exemplary embodiment, the depression may be defined by oxygen dry etching or laser beams.

In an exemplary embodiment, the first layer may include an organic material, and the second layer may include an inorganic material.

In an exemplary embodiment, when defining the third hole by selectively removing the second layer, an insulating layer of a bending portion of the display device may be removed together.

According to an exemplary embodiment of the invention, a display device includes a substrate, a switching element on the substrate, a pixel electrode located on the switching element and connected to the switching element, a light emitting layer on the pixel electrode, a common electrode on the light emitting layer, and a sealing unit disposed on the common electrode. The sealing unit includes an organic layer, and at least one first composite inorganic layer disposed between the organic layer and the common electrode. The at least one first composite inorganic layer includes a first inorganic layer between the common electrode and the organic layer, and a second inorganic layer between the first inorganic layer and the organic layer. The first inorganic layer and the second inorganic layer have refractive indices different from each other and contact each other.

In an exemplary embodiment, the refractive index of the first inorganic layer may be higher than the refractive index of the second inorganic layer.

In an exemplary embodiment, a difference between the refractive index of the first ainorganic layer and the refractive index of the second inorganic layer is substantially equal to or more than about 0.4.

In an exemplary embodiment, the second inorganic layer included in one of adjacent ones of the at least one first composite inorganic layers and the first inorganic layer included in another of the adjacent ones of the at least one first composite inorganic layers may face each other. The second inorganic layer included in the one of the adjacent ones of the at least one first composite inorganic layers and the first inorganic layer included in the another of the adjacent ones of the at least one first composite inorganic layers may have refractive indices different from each other.

In an exemplary embodiment, the second inorganic layer included in the one of the adjacent ones of the at least one first composite inorganic layers and the first inorganic layer included in the another of the adjacent ones of the at least one first composite inorganic layers may contact each other.

In an exemplary embodiment, the second inorganic layer included in the one of the adjacent ones of the at least one first composite inorganic layers and the second inorganic layer included in the another of the adjacent ones of the at least one first composite inorganic layers may have a substantially equal refractive index.

In an exemplary embodiment, the first inorganic layer and the second inorganic layer may include at least one of $TiO_2$, $SiN_x$, $AlO_x$, $Al_2O_3$ and $SiO_x$.

In an exemplary embodiment, one of the first inorganic layer and the second inorganic layer may include $TiO_2$, and the other thereof may include $Al_2O_3$.

In an exemplary embodiment, the at least one first composite inorganic layer may include at least five first composite inorganic layers.

In an exemplary embodiment, a total thickness of the at least five first composite inorganic layers may be greater than about 0.5 micrometer (μm) and less than about 1 μm.

In an exemplary embodiment, the display device may further include a first auxiliary inorganic layer between the at least one first composite inorganic layer and the organic layer.

In an exemplary embodiment, a refractive index of the first auxiliary inorganic layer may be substantially equal to the refractive index of the first inorganic layer.

In an exemplary embodiment, the display device may further include at least one second composite inorganic layer located to oppose the at least one first composite inorganic layer with the organic layer interposed therebetween.

In an exemplary embodiment, the at least one second composite inorganic layer may include a first inorganic layer on the organic layer, and a second inorganic layer on the first inorganic layer of the at least one second composite inorganic layer.

In an exemplary embodiment, the first inorganic layer of the at least one second composite inorganic layer and the second inorganic layer of the at least one second composite inorganic layer may have refractive indices different from each other.

In an exemplary embodiment, the first inorganic layer of the at least one second composite inorganic layer and the first inorganic layer of the at least one first composite inorganic layer may have a substantially equal refractive index, and the second inorganic layer of the at least one second composite inorganic layer and the second inorganic layer of the at least one first composite inorganic layer may have a substantially equal refractive index.

In an exemplary embodiment, the first inorganic layer of the at least one second composite inorganic layer and the second inorganic layer of the at least one second composite inorganic layer may contact each other.

In an exemplary embodiment, a difference between the refractive index of the first inorganic layer included in the at least one second composite inorganic layer and the refractive index of the second inorganic layer included in the at least one second composite inorganic layer may be substantially equal to or more than about 0.4.

In an exemplary embodiment, the display device may further include a second auxiliary inorganic layer between the at least one second composite inorganic layer and the organic layer.

In an exemplary embodiment, a refractive index of the second auxiliary inorganic layer may be substantially equal to the refractive index of the second inorganic layer included in the at least one second composite inorganic layer.

In an exemplary embodiment, the sealing unit may include at least one of a lower inorganic layer between the organic layer and the at least one first composite inorganic layer, and an upper inorganic layer on the organic layer.

In an exemplary embodiment, the display device may further include a protective layer between the common electrode and the at least one first composite inorganic layer.

In an exemplary embodiment, the protective layer may include a capping layer on the common electrode, and a metal layer on the capping layer.

In an exemplary embodiment, the capping layer may include an organic material, and the metal layer may include LiF.

In an exemplary embodiment, an interface between the first inorganic layer and the second inorganic layer may have a first concavo-convex pattern.

In an exemplary embodiment, a surface of the second inorganic layer facing the interface may have a second concavo-convex pattern.

In an exemplary embodiment, an arrangement direction of convex portions included in the first concave-convex pattern may cross an arrangement direction of convex portions included in the second concave-convex pattern.

According to an exemplary embodiment of the invention, a display device includes a substrate, a switching element on the substrate, a pixel electrode disposed on the switching element and connected to the switching element, a light emitting layer on the pixel electrode, a common electrode on the light emitting layer, and a sealing unit on the common electrode. The sealing unit includes an organic layer, and a first composite inorganic layer between the common electrode and the organic layer. The first composite inorganic layer includes a plurality of first inorganic layers and a plurality of second inorganic layers that are arranged alternately along a direction from the common electrode toward the organic layer. The first inorganic layer and the second inorganic layer have refractive indices different from each other, and the first inorganic layer and the second inorganic layer that are adjacent to each other contact each other.

According to an exemplary embodiment of the invention, a method of manufacturing a display device includes forming a switching element on the substrate, forming a pixel electrode on the switching element, the pixel electrode connected to the switching element, forming a light emitting layer on the pixel electrode, forming a common electrode on the light emitting layer, and forming a sealing unit on the common electrode. The sealing unit includes an organic layer, and at least one first composite inorganic layer between the common electrode and the organic layer. The at least one first composite inorganic layer includes a first inorganic layer between the common electrode and the organic layer, and a second inorganic layer between the first inorganic layer and the organic layer. The first inorganic layer and the second inorganic layer have refractive indices different from each other and contact each other.

BRIEF DESCRIPTION OF THE DRAWINGS

A more complete appreciation according to an exemplary embodiment of the invention will become more apparent by describing in detail embodiments thereof with reference to the accompanying drawings, in which:

FIG. 35 is a view illustrating various embodiments of sealing units according to the invention and thicknesses of related layers;

DETAILED DESCRIPTION

Figure 1:
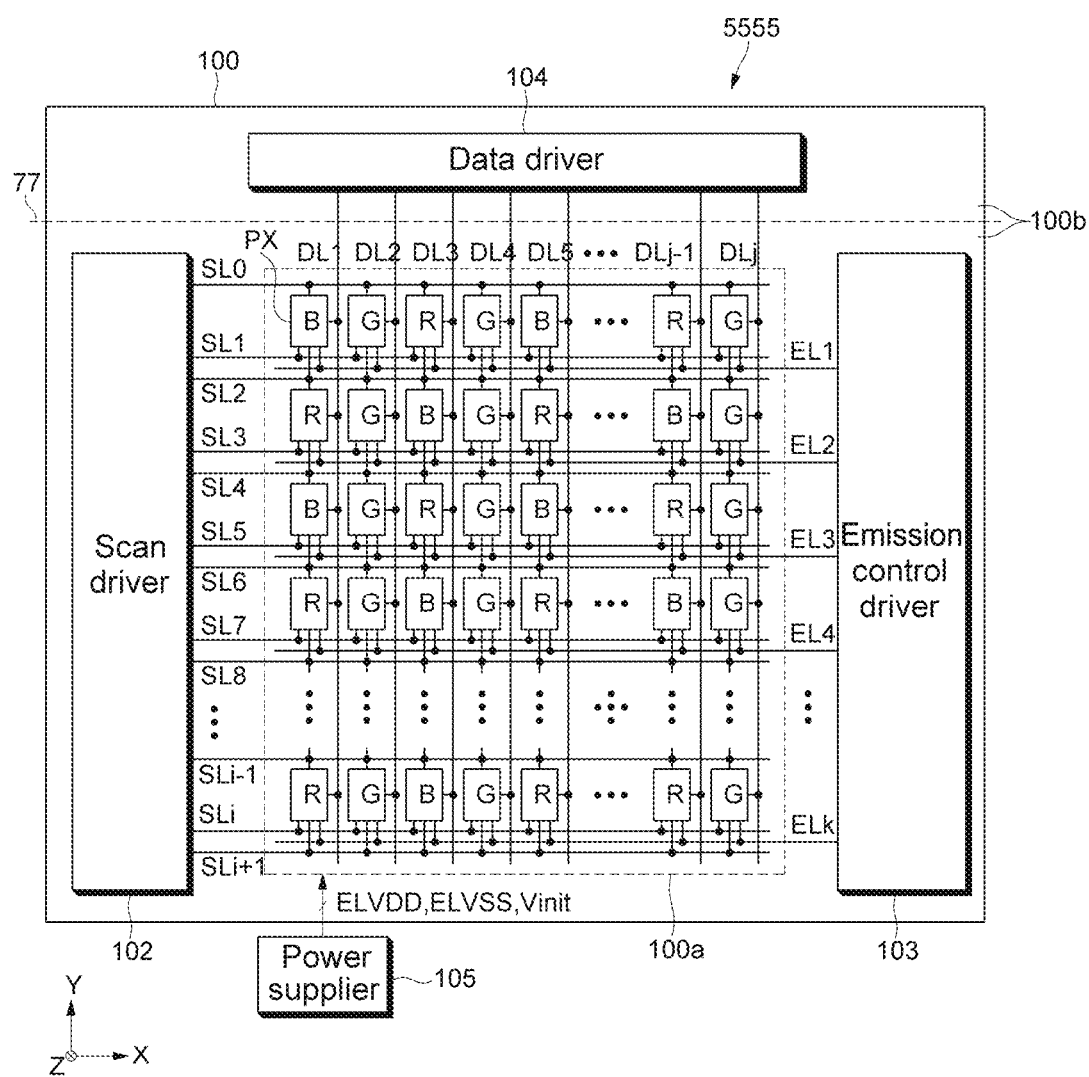
FIG. 1 is a block diagram illustrating an exemplary embodiment of a display device according to the invention.

Exemplary embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device located "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein. For example, a claim (e.g., claim 1) may recite a first hole 22, a second hole 23, a first layer 113, a depression 20, a second layer 114, a third hole 21, or a claim (e.g., claim 13) may recite a first hole 43, a first layer 150, a depression 40, a second layer 160, a second hole 41, a third layer 180, a third hole 42, which may be different from those of the detailed description.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the specification.

Some of the parts which are not associated with the description may not be provided in order to specifically describe exemplary embodiments of the present invention and like reference numerals refer to like elements throughout the specification.

Hereinafter, a display device and a method of manufacturing the display device according to an exemplary embodiment of the invention will be described in detail with reference to FIGS. 1 to 42.

FIG. 1 is a block diagram illustrating a display device according to an exemplary embodiment of the invention.

A display device 5555 according to an exemplary embodiment of the invention includes a substrate 100, a scan driver 102, an emission control driver 103, a data driver 104 and a power supplier 105, as illustrated in FIG. 1.

On the substrate 100, "i+2" number of scan lines SL0 to SLi+1, "k" number of emission control lines EL1 to ELk, "j" number of data lines DL1 to DLj and "k×j (k multiplied by j)" number of pixels PX, the scan driver 102, the emission control driver 103 and the data driver 104 are disposed, where each of i, j and k is a natural number greater than 1.

The plurality of pixels PX is located in a display area 100a of the substrate 100.

The "i+2" number of scan lines SL0 to SLi+1, the "k" number of emission control lines EL1 to ELk, and the "j" number of data lines DL1 to DLj are located in the display area 100a of the substrate 100. In such an exemplary embodiment, the "i+2" number of scan lines SL0 to SLi+1 extend to a non-display area 100b to be connected to the scan driver 102, the "k" number of emission control lines EL1 to Elk extend to the non-display area 100b to be connected to the emission control driver 103, and the "j" number of data lines DL1 to DLj extend to the non-display area 100b to be connected to the data driver 104.

The scan driver 102 and the emission control driver 103 may be manufactured on the substrate 100 through a process substantially the same as a process in which the pixel PX is formed. In an exemplary embodiment, switching elements of the scan driver 102, switching elements of the emission control driver 103 and switching elements of the pixel PX may be formed on the substrate 100 through a photolithography process, for example.

In another exemplary embodiment, the emission control driver 103 may be embedded in the scan driver 102. In an exemplary embodiment, the scan driver 102 may further perform the function of the emission control driver 103, for example. In such an exemplary embodiment, the scan lines SL0 to SLi+1 and the emission control lines EL1 to ELk are driven together by the scan driver 102.

The data driver 104 may be manufactured in the form of a chip. The data driver 104 may be attached on the substrate 100 in a chip bonding manner. In an exemplary embodiment, the data driver 104 may be disposed on a separate printed circuit board ("PCB") (not illustrated) instead of the substrate 100, in which case the data lines DL1 to DLj are connected to the data driver 104 through the PCB.

In an exemplary embodiment, each of the scan driver 102 and the emission control driver 103 may be manufactured in the form of a chip. The chip-type scan driver 102 may be located in the non-display area 100b of the substrate 100 or at another separate PCB (not illustrated). The chip-type emission control driver 103 may be located in the non-display area 100b of the substrate 100 or at another separate PCB (not illustrated).

The scan lines SL0 to SLi+1 are arranged along a Y-axis direction, and each of the scan lines SL0 to SLi+1 extends along an X-axis direction. The emission control lines EL1 to ELk are arranged along the Y-axis direction, and each of the emission control lines EL1 to ELk extends along the X-axis direction. The data lines DL1 to DLj are arranged along the X-axis direction, and each of the data lines DL1 to DLj extends along the Y-axis direction.

A scan line SL0 of the aforementioned scan lines SL0 to SLi+1 that is closest to the data driver 104 is defined as a first dummy scan line SL0, a scan line SLi+1 of the aforementioned scan lines SL0 to SLi+1 that is farthest from the data driver 104 is defined as a second dummy scan line SLi+1. In addition, the scan lines SL1 to SLi between the first dummy scan line SL0 and the second dummy scan line SLi+1 are respectively defined as first to i-th scan lines SL1 to SLi sequentially from a scan line that is close to the data driver 104.

The scan driver 102 generates scan signals according to a scan control signal provided from a timing controller (not illustrated), and sequentially applies the scan signals to the plurality of scan lines SL0 to SLi+1. The scan driver 102 outputs first to i-th scan signals, a first dummy scan signal, and a second dummy scan signal. The first to i-th scan signals output from the scan driver 102 are applied to the first to i-th scan lines SL1 to SLi, respectively. In an exemplary embodiment, an n-th scan signal is applied to an n-th scan line SLn, where n is a natural number greater than or equal to 1 and less than or equal to i, for example. In addition, the first dummy scan signal output from the scan driver 102 is applied to the first dummy scan line SL0, and the second dummy scan signal output from the scan driver 102 is applied to the second dummy scan line SLi+1.

During one frame period, the scan driver 102 outputs the first to i-th scan signals sequentially from the first scan signal. In such an exemplary embodiment, the scan driver 102 outputs the first dummy scan signal prior to the first scan signal, and outputs the second dummy scan signal later than the i-th scan signal. In other words, the scan driver 102 outputs the first dummy scan signal firstly during said one frame period, and outputs the second dummy scan signal lastly during the one frame period. Accordingly, during one frame period, the entire scan lines SL0 to SLi+1 including the dummy scan lines SL0 and SLi+1 are driven sequentially from the first dummy scan line SL0.

The emission control driver 103 generates emission control signals according to a control signal provided from a timing controller (not illustrated) and sequentially applies the emission control signals to the plurality of emission control lines EL1 to ELk. First to m-th emission control signals output from the emission control driver 103 are applied to first to m-th emission control lines EL1 to ELm, respectively. In an exemplary embodiment, an m-th emission control signal is applied to an m-th emission control line ELm, where m is a natural number greater than or equal to 1 and less than or equal to k, for example. During one frame period, the emission control driver 103 outputs the first to k-th emission control signals sequentially from the first emission control signal. Accordingly, during one frame period, the entire emission control lines EL1 to ELk are driven sequentially from the first emission control line EL1.

The data driver 104 applies first to j-th data voltages to the first to j-th data lines DL1 to DLj, respectively. In an exemplary embodiment, the data driver 104 receives image data signals and a data control signal from a timing controller (not illustrated), for example. In addition, the data driver 104 samples the image data signals according to the data control signal, sequentially latches the sampled image data signals corresponding to one horizontal line in each horizontal period, and applies the latched image data signals to the data lines DL1 to DLj substantially simultaneously.

The pixels PX are arranged on the substrate 100 in the display area 100a in the form of a matrix. The pixels PX emit lights having different colors from each other. In an exemplary embodiment, between pixels PX illustrated in FIG. 1, a pixel indicated by a reference character "R" is a red pixel which emits a red light, a pixel indicated by a reference character "G" is a green pixel which emits a green light and a pixel indicated by a reference character "B" is a blue pixel which emits a blue light, for example.

In an exemplary embodiment, although not illustrated, the display device according to an exemplary embodiment of the invention may further include at least one white pixel which emits a white light. The white pixel may be disposed on the substrate 100 in the display area 100a.

One pixel is connected to at least one scan line. In an exemplary, as illustrated in FIG. 1, between a plurality of pixels PX connected to the first data line DL1, a blue pixel that is closest to the data driver 104 is connected to three scan lines that receives scan signals having different output timings, e.g., the first dummy scan line SL0, the first scan line SL1 and the second scan line SL2. In such an exemplary embodiment, between a plurality of pixels PX connected to the second data line DL2, a green pixel which is third farthest from the data driver 104 is connected to three scan lines that receives scan signals applied with different output timings, e.g., the fourth scan line SL4, the fifth scan line SL5 and the sixth scan line SL6.

In an exemplary embodiment, pixels that are connected in common to a same data line and located adjacent to each other are connected in common to at least one scan line. In other words, two adjacent ones of the pixels connected to a same data line that are adjacent to each other in the Y-axis direction share at least one scan line. In one exemplary embodiment, for example, a green pixel (hereinafter, "a first green pixel") which is connected to the second data line DL2 and is closest to the data driver 104 and a green pixel (hereinafter, "a second green pixel") which is connected to the second data line DL2 and is second farthest from the data driver 104 are located adjacent to each other, and the first green pixel and the second green pixel are connected in common to the second scan line SL2. In another exemplary embodiment, when defining a green pixel, that is connected to the second data line DL2 and is third farthest from the data driver 104 as a third green pixel, the third green pixel and the second green pixel are connected in common to the fourth scan line SL4.

Pixels connected in common to a same data line are independently connected to one or more different scan lines. In one exemplary embodiment, for example, the first green pixel described above is connected independently to the first scan line SL1, the second green pixel described above is connected independently to the third scan line SL3, and the third green pixel described above is connected independently to the fifth scan line SL5.

As such, each of pixels connected to a same data line is independently connected to at least one scan line. As used herein, the meaning of at least two pixels (e.g., the first pixel PX1 and the second pixel PX2) being connected to different scan lines is that at least one of scan lines connected to the first pixel PX1 is different from at least one of scan lines connected to the second pixel PX2. Accordingly, pixels connected to a same data line are connected to different scan lines, respectively.

As used herein, the meaning of at least two pixels (e.g., the first pixel PX1 and the second pixel PX2) being connected to a same scan line is that scan lines connected to the first pixel PX1 are completely the same as scan lines connected to the second pixel PX2. Accordingly, each of pixels connected to a same emission control line is connected to same scan lines. In one exemplary embodiment, pixels connected in common to the second emission control line EL2 are connected in common to the second scan line SL2, the third scan line SL3 and the fourth scan line SL4, for example.

The red pixel and the blue pixel are connected to a (2p−1)-th data line and the green pixel is connected to a 2p-th data line, where p is a natural number. In one exemplary embodiment, for example, the red pixel and the blue pixel are connected to the first data line DL1, and the green pixel is connected to the second data line DL2.

One pixel (hereinafter, "a first predetermined pixel") connected to a (2p−1)-th data line (e.g., the first data line DL1) and one pixel (hereinafter, "a second predetermined pixel") connected to another (2p−1)-th data line (e.g., the third data line DL3) may be connected to a same scan line, and in such an exemplary embodiment, the first predetermined pixel emits a light having a color different from a color of a light emitted from the second predetermined pixel. In one exemplary embodiment, for example, the first predetermined pixel may be a blue pixel connected to the first dummy scan line SL0, the first scan line SL1, the second scan line SL2, and the first data line DL1, and the second predetermined pixel may be a red pixel connected to the first dummy scan line SL0, the first scan line SL1, the second scan line SL2, and the third data line DL3.

Two adjacent pixels that are connected to a same data line (e.g., the (2p−1)-th data line) and emit lights having different colors from each other, and at least one green pixel adjacent to one of the two adjacent pixels are included in a unit pixel for displaying a unit image. In one exemplary embodiment, for example, a red pixel connected to the third data line DL3 and the first scan line SL1, a blue pixel connected to the third data line DL3 and the third scan line SL3, a green pixel connected to the second data line DL2 and the first scan line SL1, and a green pixel connected to the fourth data line DL4 and the first sc pan line SL1 may collectively define a unit pixel.

Each pixel PX commonly receives a high potential driving voltage ELVDD, a low potential driving voltage ELVSS and an initializing voltage Vinit from the power supplier 105. In such an exemplary embodiment, each pixel PX receives all of the high potential driving voltage ELVDD, the low potential driving voltage ELVSS and the initializing voltage Vinit.

Figure 2:
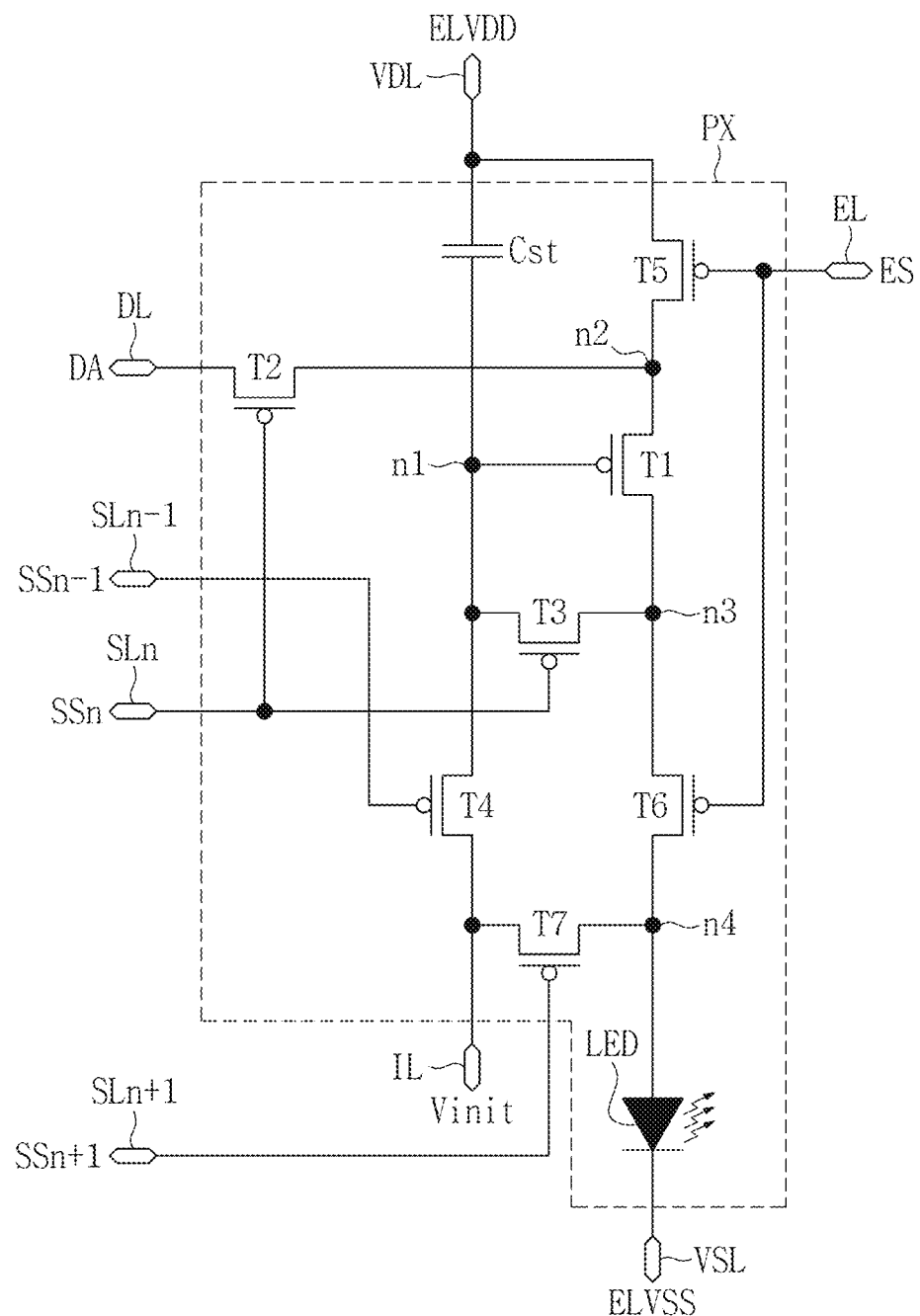
FIG. 2 is a an equivalent circuit diagram illustrating one of pixels illustrated in FIG. 1.

FIG. 2 is an equivalent circuit diagram illustrating one of pixels illustrated in FIG. 1.

In an exemplary embodiment, a pixel may include a first switching element T1, a second switching element T2, a third switching element T3, a fourth switching element T4, a fifth switching element T5, a sixth switching element T6, a seventh switching element T7, a storage capacitor Cst and a light emitting element (hereinafter, referred to as a light emitting diode ("LED")).

In an exemplary embodiment, each of the first, second, third, fourth, fifth, sixth and seventh switching elements T1, T2, T3, T4, T5, T6 and T7 may be a P-type transistor, for example, as illustrated in FIG. 2. However, the invention is not limited thereto, and in another exemplary embodiment, each of the first, second, third, fourth, fifth, sixth and seventh switching elements T1, T2, T3, T4, T5, T6 and T7 may be an N-type transistor, for example.

The first switching element T1 includes a gate electrode connected to a first node n1 and is connected between a second node n2 and a third node n3. One of a source electrode and a drain electrode of the first switching element T1 is connected to the second node n2, and the other of the source electrode and the drain electrode of the first switching element T1 is connected to the third node n3.

The second switching element T2 includes a gate electrode connected to the n-th scan line SLn and is connected between the data line DL and the second node n2. One of a source electrode and a drain electrode of the second switching element T2 is connected to the data line DL, and the other of the source electrode and the drain electrode of the second switching element T2 is connected to the second node n2. An n-th scan signal SSn is applied to the n-th scan line SLn.

The third switching element T3 includes a gate electrode connected to the n-th scan line SLn and is connected between the first node n1 and the third node n3. One of a source electrode and a drain electrode of the third switching element T3 is connected to the first node n1, and the other of the source electrode and the drain electrode of the third switching element T3 is connected to the third node n3.

The fourth switching element T4 includes a gate electrode connected to an (n−1)-th scan line SLn−1 and is connected between the first node n1 and an initialization line IL. One of a source electrode and a drain electrode of the fourth switching element T4 is connected to the first node n1, and the other of the source electrode and the drain electrode of the fourth switching element T4 is connected to the initialization line IL. The initializing voltage Vinit is applied to the initialization line IL, and an (n−1)-th scan signal SSn−1 is applied to the (n−1)-th scan line SLn−1.

The fifth switching element T5 includes a gate electrode connected to the emission control line EL, and is connected between the second node n2 and a high potential line VDL which is one of power supply lines. One of a source electrode and a drain electrode of the fifth switching element T5 is connected to the high potential line VDL, and the other of the source electrode and the drain electrode of the fifth switching element T5 is connected to the second node n2. The high potential driving voltage ELVDD is applied to the high potential line VDL.

The sixth switching element T6 includes a gate electrode connected to the emission control line EL and is connected between the third node n3 and a fourth node n4. One of a source electrode and a drain electrode of the sixth switching element T6 is connected to the third node n3 and the other of the source electrode and the drain electrode of the sixth switching element T6 is connected to the fourth node n4. An emission control signal ES is applied to the emission control line EL.

The seventh switching element T7 includes a gate electrode connected to an (n+1)-th scan line SLn+1 and is connected between the initialization line IL and the fourth node n4. One of a source electrode and a drain electrode of the seventh switching element T7 is connected to the initialization line IL, and the other of the source electrode and the drain electrode of the seventh switching element T7 is connected to the fourth node n4. An (n+1)-th scan signal SSn+1 is applied to the (n+1)-th scan line SLn+1.

The storage capacitor Cst is connected between the high potential line VDL and the first node n1. The storage capacitor Cst stores a signal applied to the gate electrode of the first switching element T1 for one frame period.

The LED emits light corresponding to a driving current applied through the first switching element T1. The LED emits light with brightness depending on the magnitude of the driving current. An anode electrode of the LED is connected to the fourth node n4, and a cathode electrode of the LED is connected to a low potential line VSL which is another of the power supply lines. The low potential driving voltage ELVSS is applied to this low potential line VSL. In an exemplary embodiment, the LED may be an organic light emitting diode ("OLED"), for example. The anode electrode of the LED corresponds to a pixel electrode to be described below, and the cathode electrode of the LED corresponds to a common electrode to be described below.

The fourth switching element T4 is turned on when the (n−1)-th scan signal SSn−1 is applied to the (n−1)-th scan line SLn−1. The initializing voltage Vinit is applied to the first node n1 (i.e., the gate electrode of the first switching element T1) through the turned-on fourth switching element T4. Accordingly, the voltage of the gate electrode of the first switching element T1 is initialized.

The second switching element T2 and the third switching element T3 are turned on when the n-th scan signal SSn is applied to the n-th scan line SLn. A data voltage DA is applied to the first node n1 (i.e., the gate electrode of the first switching element T1) through the turned-on second switching element T2, and accordingly, the first switching element T1 is turned on. Accordingly, a threshold voltage of the first switching element T1 is detected, and the threshold voltage is stored in the storage capacitor Cst.

The fifth switching element T5 and the sixth switching element T6 are turned on when the emission control signal ES is applied to the emission control line EL. A driving current is applied to the LED through the turned-on fifth switching element T5, the turned-on first switching element T1, and the turned-on sixth switching element T6, such that the LED emits light.

The seventh switching element T7 is turned on when the (n+1)-th scan signal SSn+1 is applied to the (n+1)-th scan line SLn+1. The initializing voltage Vinit is applied to the fourth node n4 (i.e., the anode electrode of the LED) through the turned-on seventh switching element T7. Accordingly, the LED is biased in a reverse direction such that the LED is turned off.

Figure 3:
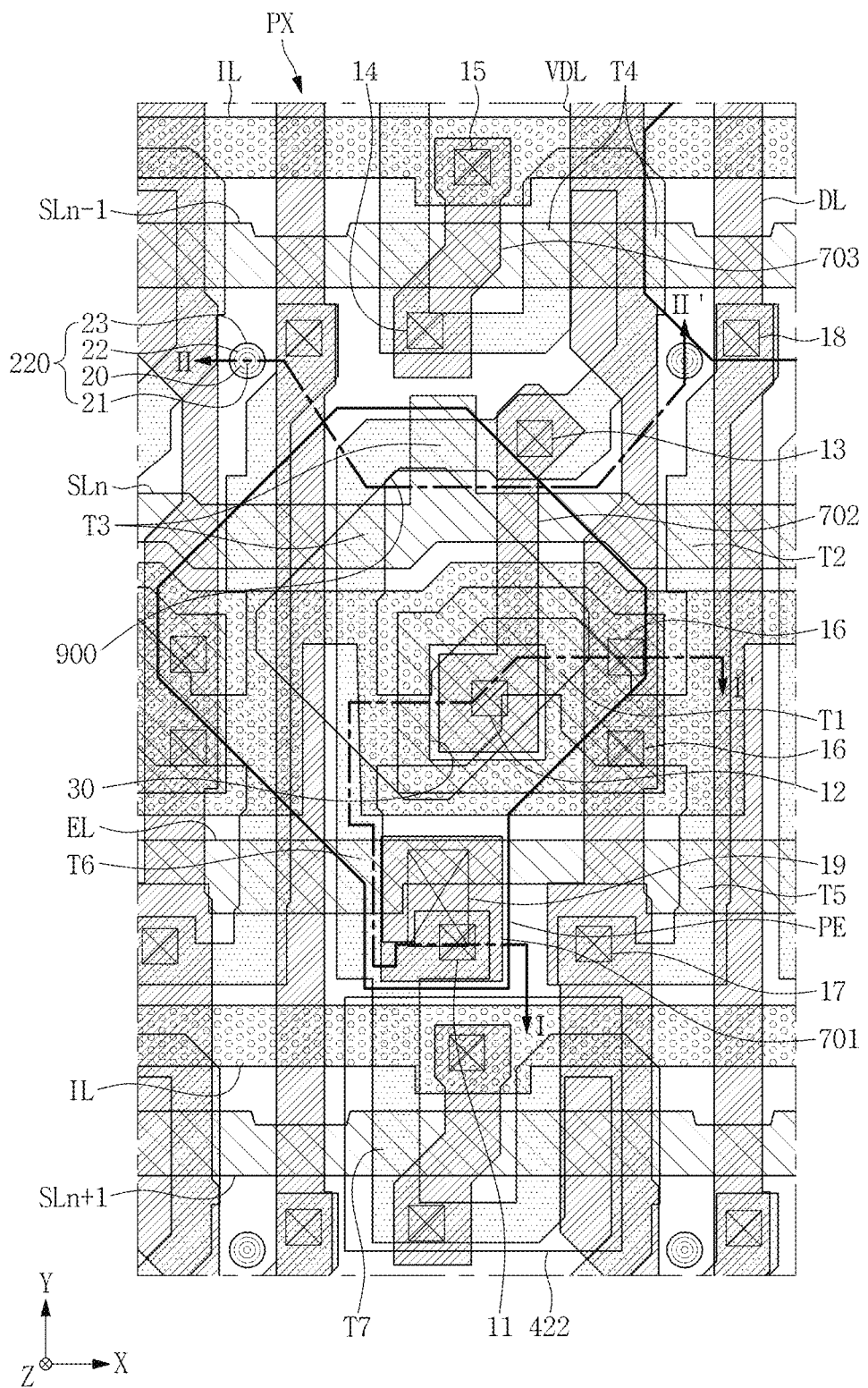
FIG. 3 is a detailed plan view illustrating a display device including one of the pixels illustrated in FIG. 1 and lines connected thereto.
Figure 4A:
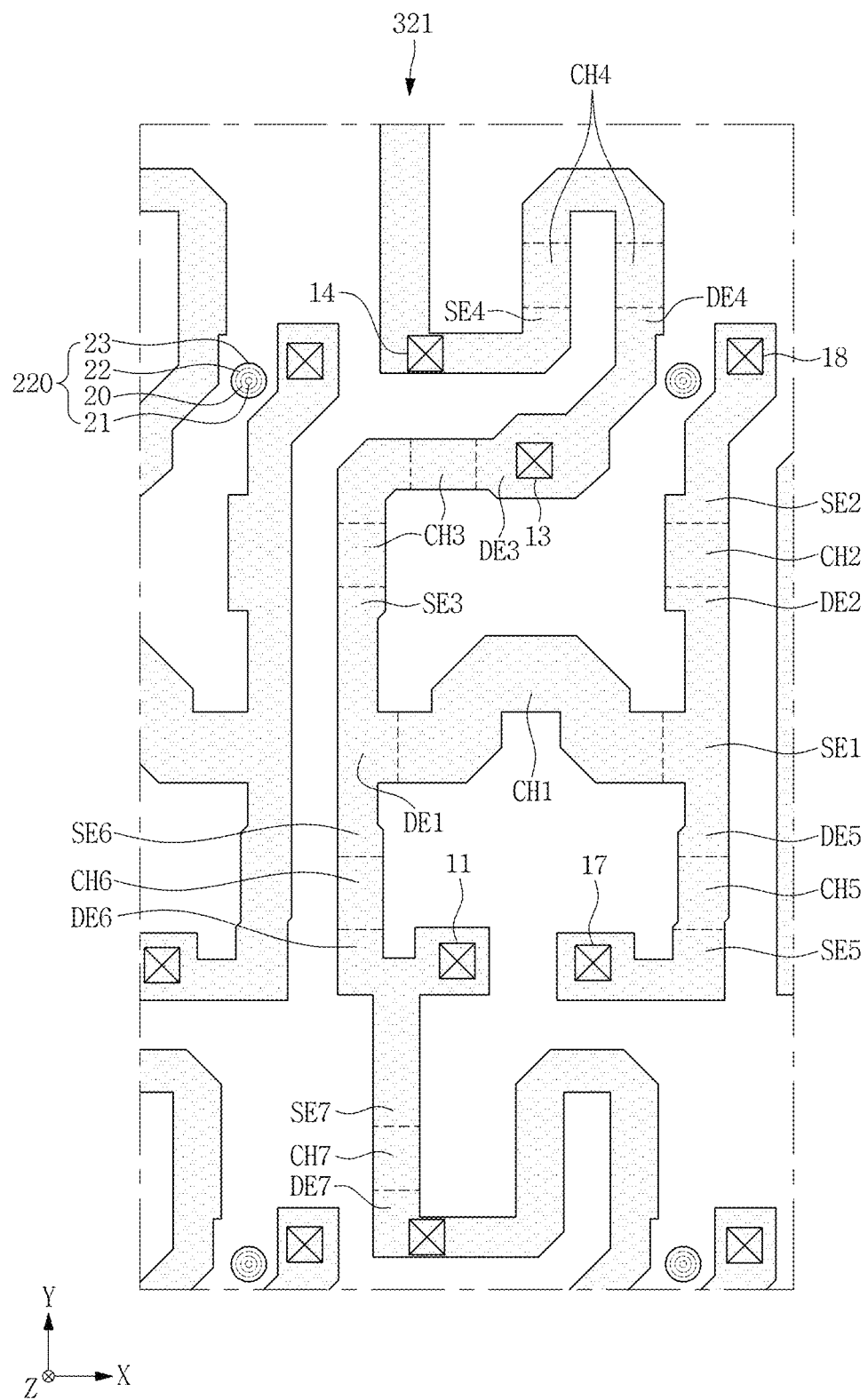
FIGS. 4A to 4G are views illustrating only a part of the elements of FIG. 3.
Figure 4B:
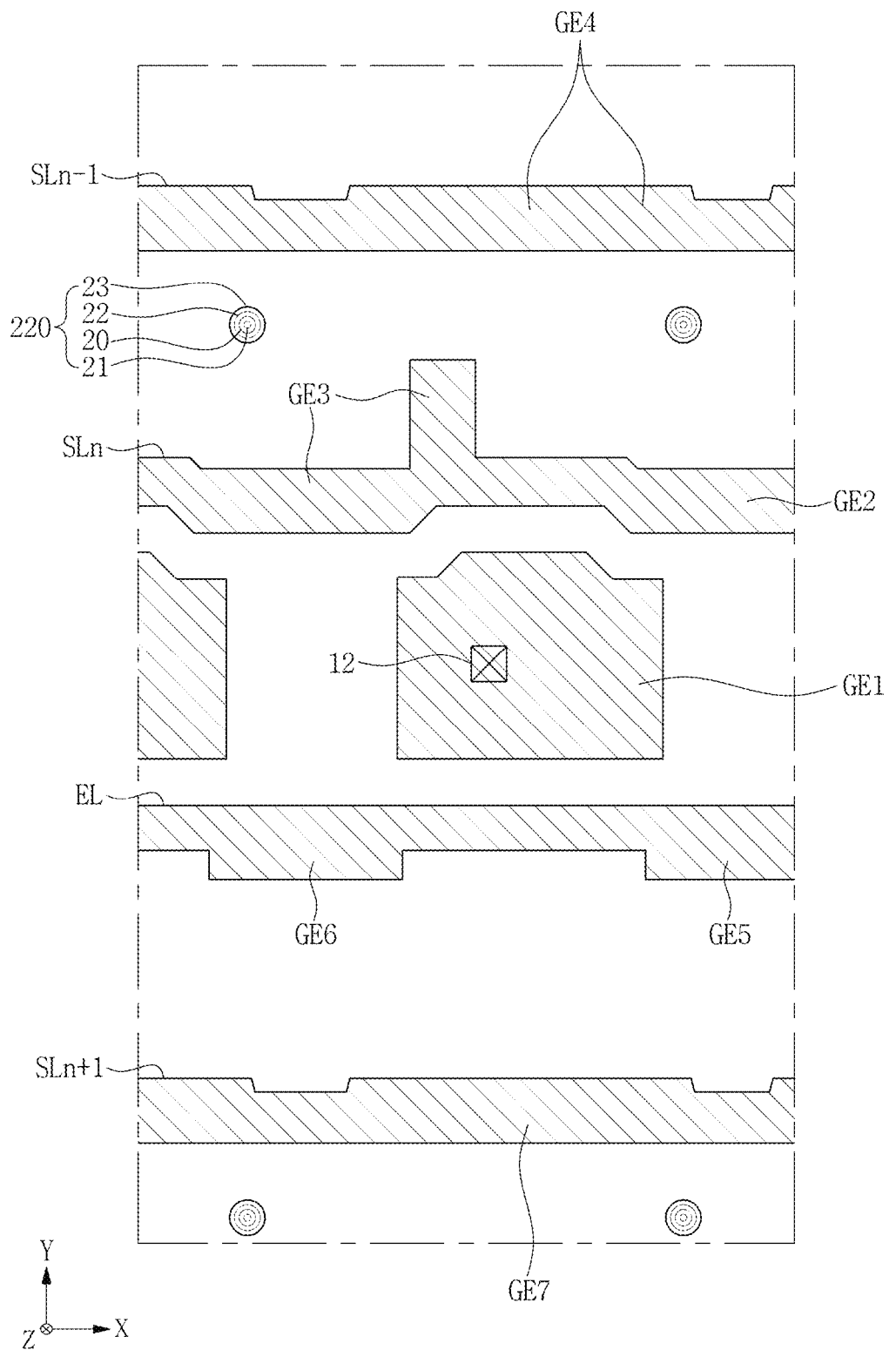
Figure 4C:
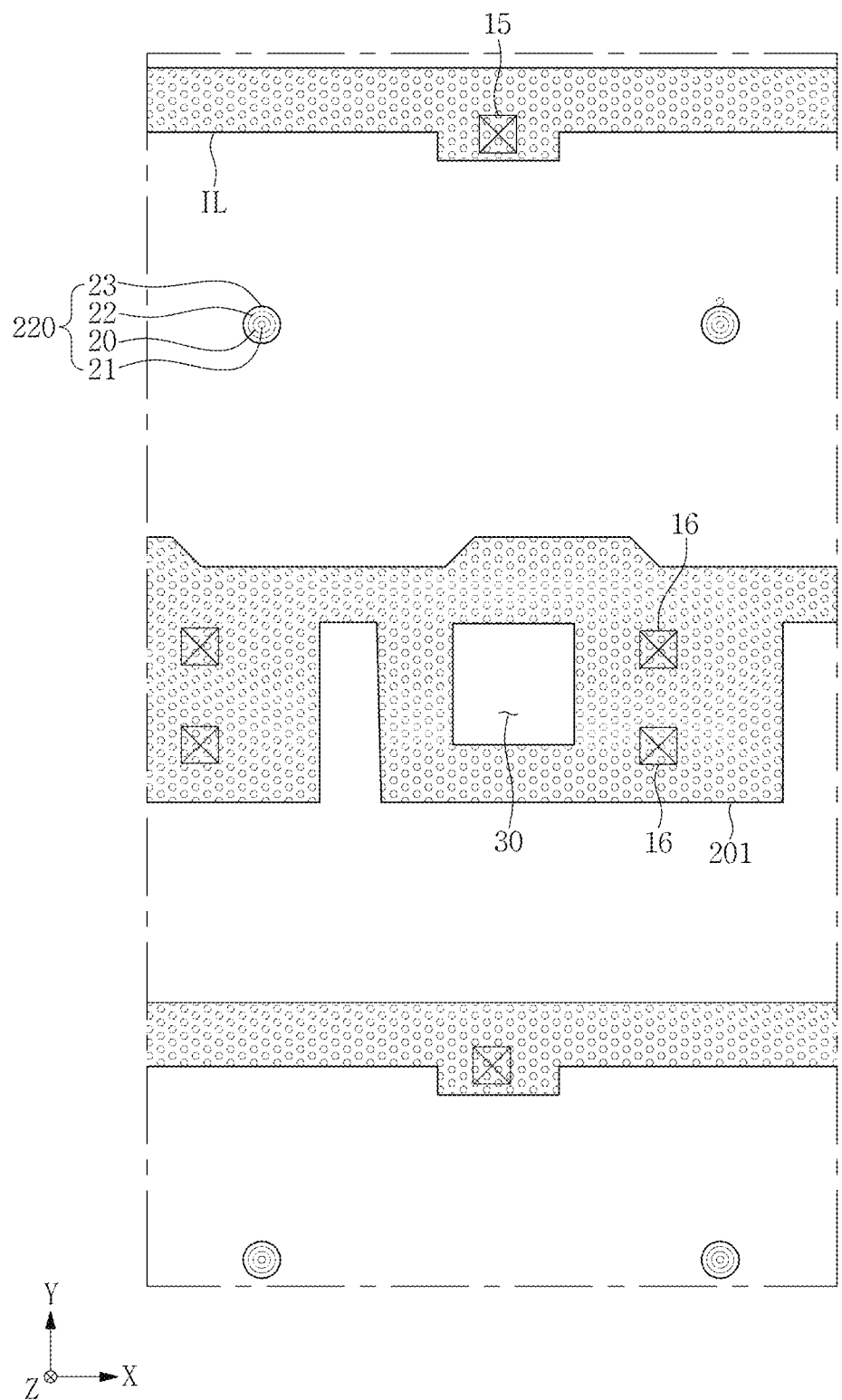
Figure 4D:
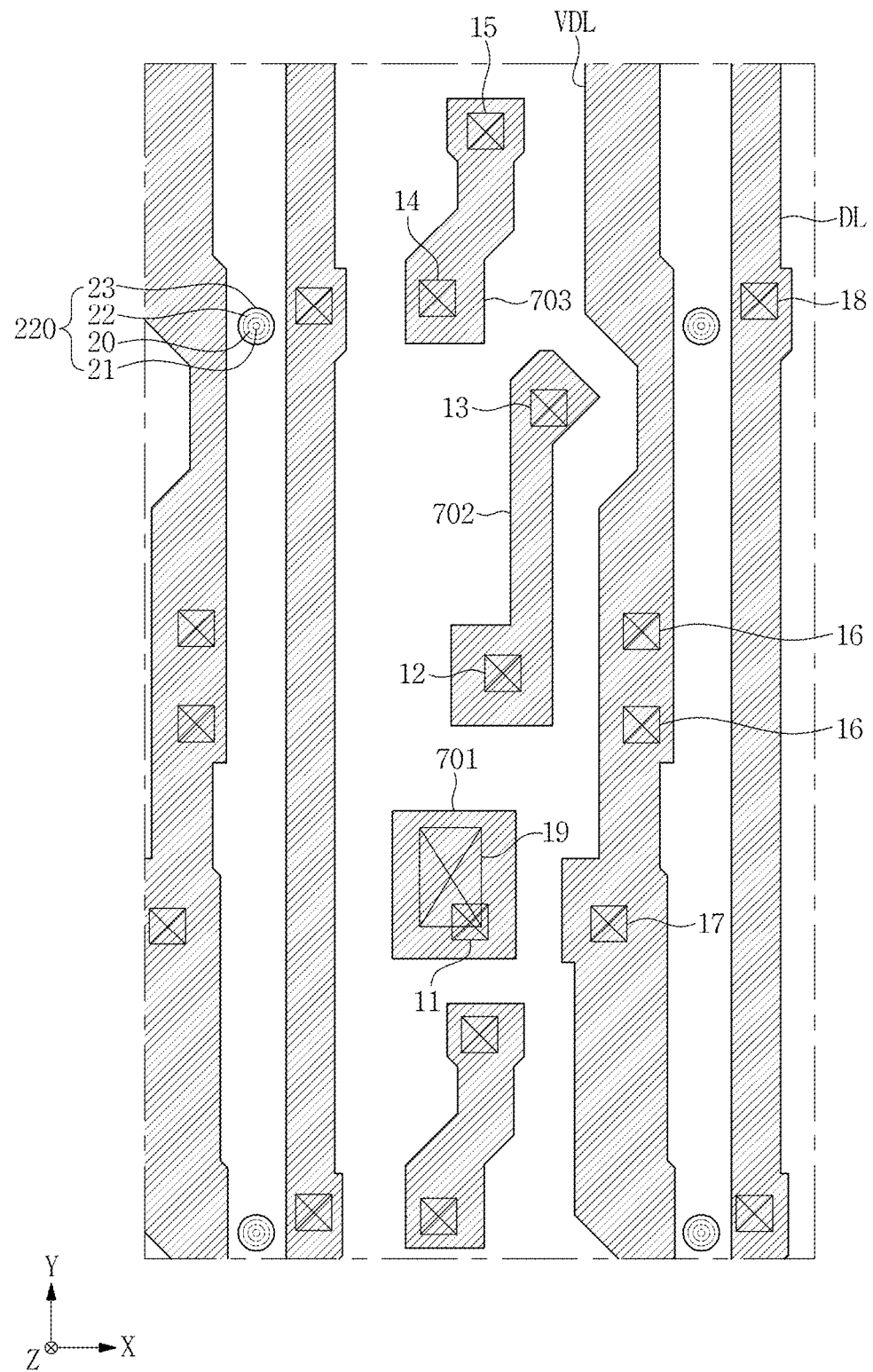
Figure 4E:
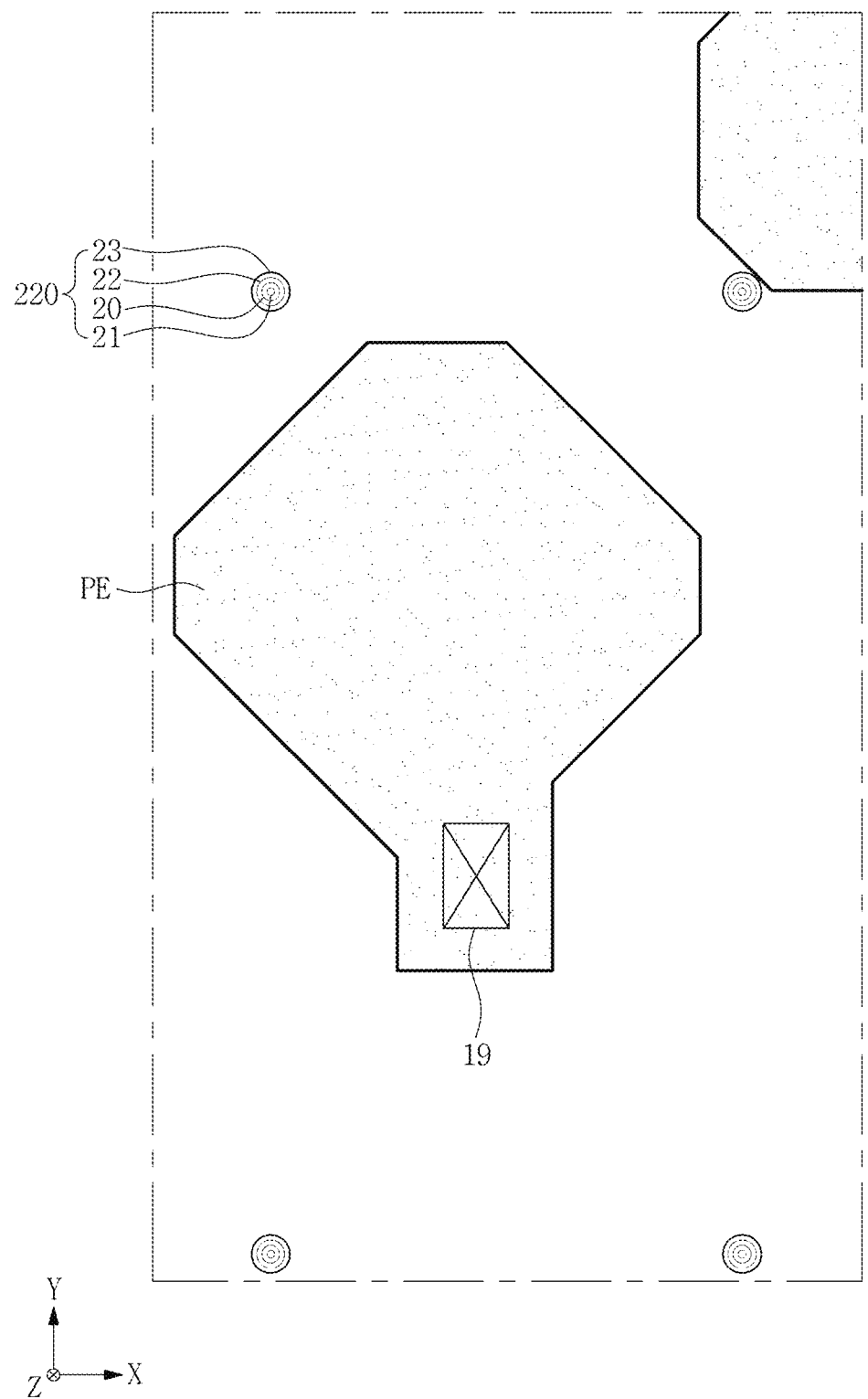
Figure 4F:
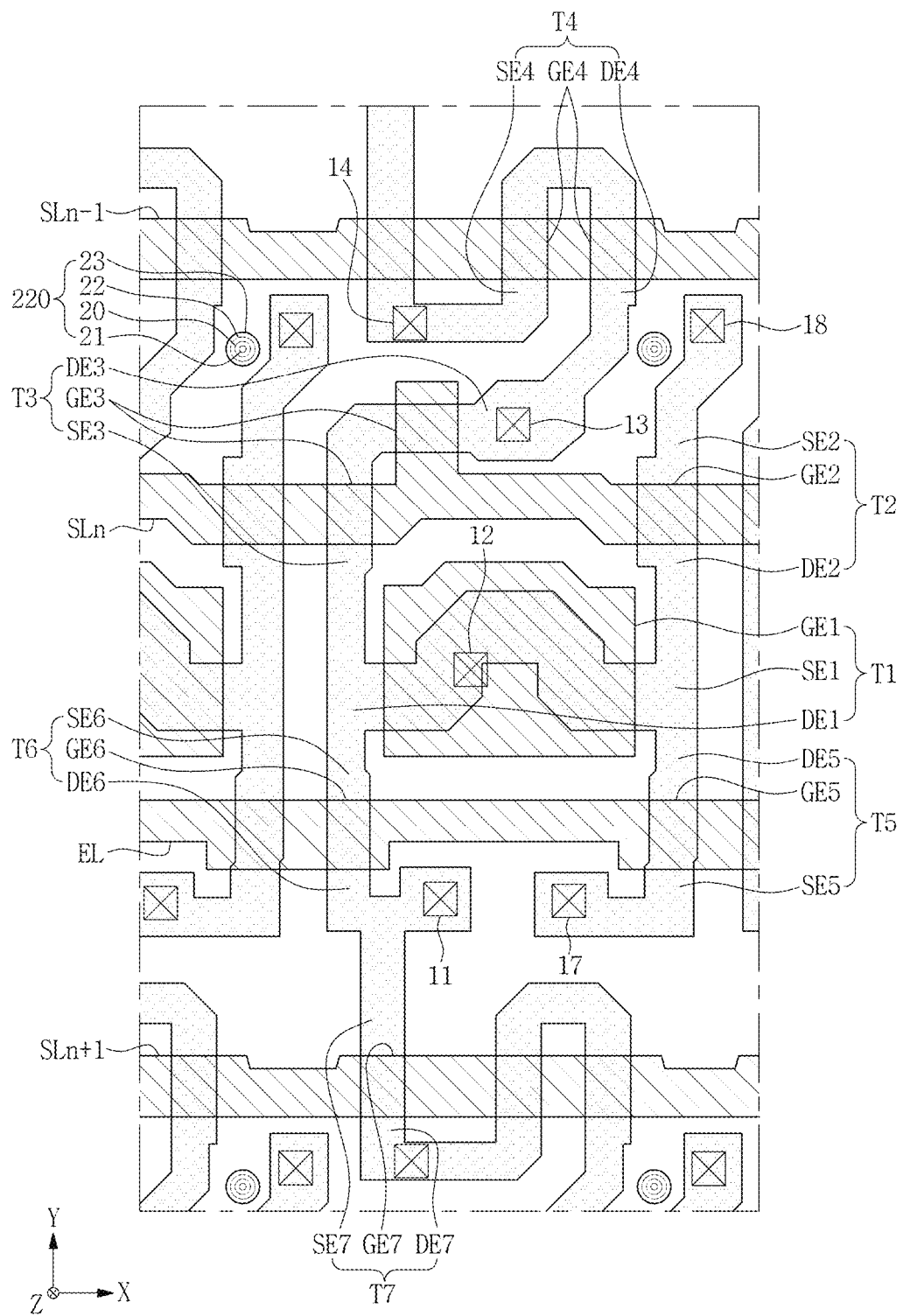
Figure 4G:
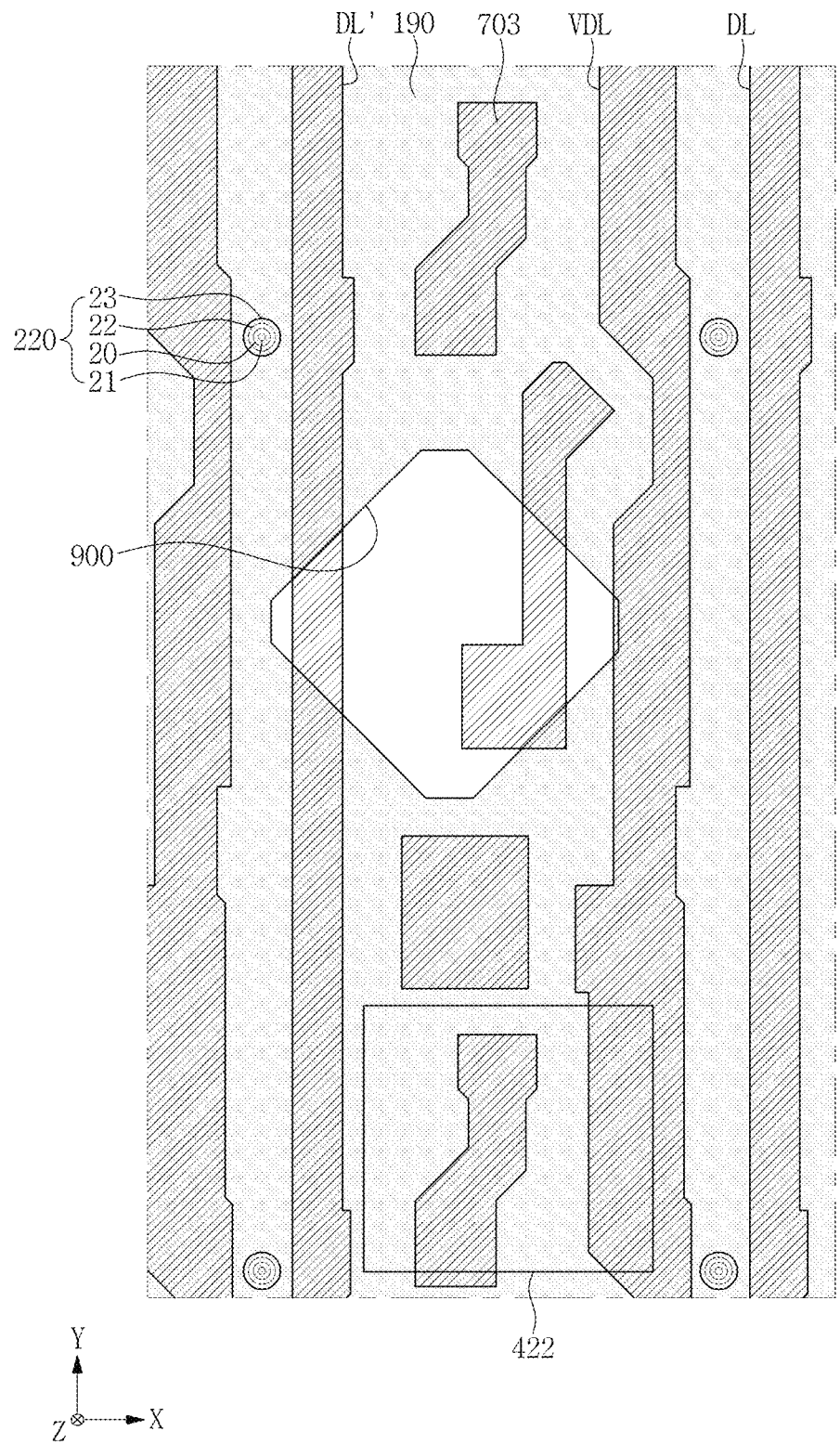
Figure 5:
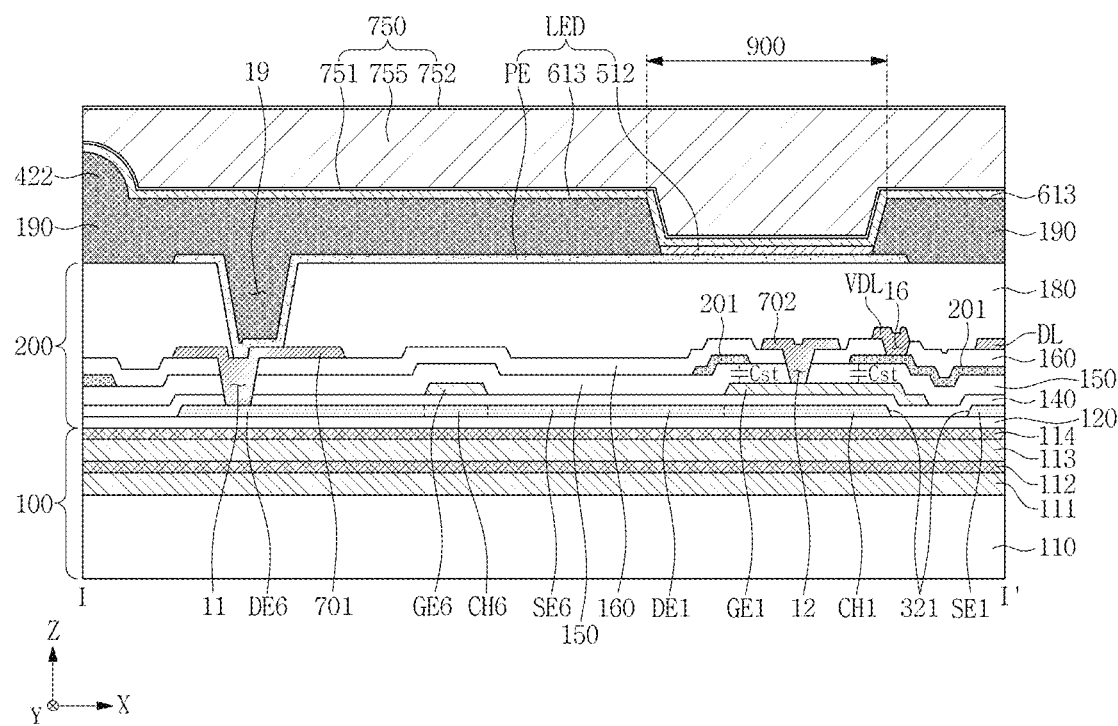
FIG. 5 is a cross-sectional view taken along line I-I' of FIG. 3.

FIG. 3 is a detailed plan view illustrating a display device including one of the pixels illustrated in FIG. 1 and lines connected thereto, FIGS. 4A to 4G are views illustrating only a part of the elements of FIG. 3 and FIG. 5 is a cross-sectional view taken along line I-I' of FIG. 3.

Specifically, FIG. 4A is a view illustrating a semiconductor layer 321 of FIG. 3, FIG. 4B is a view illustrating the (n−1)-th scan line SLn−1, the n-th scan line SLn, the (n+1)-th scan line SLn+1, and the emission control line EL of FIG. 3, FIG. 4C is a view illustrating the initialization line IL and a capacitor electrode 201 of FIG. 3, FIG. 4D shows the data line DL and the high potential line VDL of FIG. 3, FIG. 4E is a view illustrating the pixel electrode PE of FIG. 3, FIG. 4F is a view illustrating the semiconductor layer 321, the (n−1)-th scan line SLn−1, the n-th scan line SLn, the (n+1)-th scan line SLn+1, and the emission control line EL of FIG. 3, and FIG. 4G is a view illustrating a first connection electrode 701, a second connection electrode 702, a third connection electrode 703, the data line DL, the high potential line VDL, and a light blocking layer 190 of FIG. 3.

A display device according to an exemplary embodiment of the invention may include a substrate 100, a pixel circuit unit 200, a light blocking layer 190, a spacer 422, an LED, and a sealing unit 750, as illustrated in FIGS. 3 to 5.

As illustrated in FIGS. 3 and 4F, the first switching element T1 of the pixel circuit unit 200 includes a first gate electrode GE1, a first source electrode SE1 and a first drain electrode DE1.

As illustrated in FIGS. 3 and 4F, the second switching element T2 of the pixel circuit unit 200 includes a second gate electrode GE2, a second source electrode SE2 and a second drain electrode DE2.

As illustrated in FIGS. 3 and 4F, the third switching element T3 of the pixel circuit unit 200 includes a third gate electrode GE3, a third source electrode SE3 and a third drain electrode DE3.

As illustrated in FIGS. 3 and 4F, the fourth switching element T4 of the pixel circuit unit 200 includes a fourth gate electrode GE4, a fourth source electrode SE4 and a fourth drain electrode DE4.

As illustrated in FIGS. 3 and 4F, the fifth switching element T5 of the pixel circuit unit 200 includes a fifth gate electrode GE5, a fifth source electrode SE5 and a fifth drain electrode DE5.

As illustrated in FIGS. 3 and 4F, the sixth switching element T6 of the pixel circuit unit 200 includes a sixth gate electrode GE6, a sixth source electrode SE6 and a sixth drain electrode DE6.

As illustrated in FIGS. 3 and 4F, the seventh switching element T7 of the pixel circuit unit 200 includes a seventh gate electrode GE7, a seventh source electrode SE7 and a seventh drain electrode DE7.

The substrate 100 illustrated in FIG. 5 may include at least two layers. In an exemplary embodiment, the substrate 100 may include a base layer 110, a first layer 111, a second layer 112, a third layer 113, and a fourth layer 114 arranged along a Z-axis direction, for example. The first layer 111 is located between the base layer 110 and the second layer 112, the second layer 112 is located between the first layer 111 and the third layer 113, the third layer 113 is located between the second layer 112 and the fourth layer 114, and the fourth layer 114 is located between the third layer 113 and a buffer layer 120 of the pixel circuit unit 200.

The first layer 111 may have a thickness larger than a thickness of the second layer 112. As used herein, the thickness means a size measured in the Z-axis direction.

The third layer 113 may have a thickness larger than a thickness of the fourth layer 114. As used herein, the thickness means a size measured in the Z-axis direction.

The first layer 111 and the third layer 113 may have a substantially equal thickness. As used herein, the thickness means a size measured in the Z-axis direction.

The second layer 112 and the fourth layer 114 may have a substantially equal thickness. As used herein, the thickness means a size measured in the Z-axis direction.

The base layer 110 may be a glass substrate or a film.

In an exemplary embodiment, the first layer 111 may include or consist of glass or transparent plastic, for example. In addition, the first layer 111 may include an organic material. In an exemplary embodiment, the first layer 111 may include one of kapton, polyethersulphone ("PES"), polycarbonate ("PC"), polyimide ("PI"), polyethyleneterephthalate ("PET"), polyethylene naphthalate ("PEN"), polyacrylate ("PAR"), fiber reinforced plastic ("FRP") and the like, for example.

The second layer 112 may include an inorganic material. In an exemplary embodiment, the second layer 112 may include or consist of one of a silicon nitride ($SiN_x$) layer, a silicon oxide ($SiO_2$) layer and an oxynitride ($SiO_xN_y$) layer, for example.

The third layer 113 may include or consist of a material substantially the same as a material included in the first layer 111 described above.

The fourth layer 114 may include or consist of a material substantially the same as a material included in the second layer 112 described above.

As illustrated in FIG. 5, the pixel circuit unit 200 is disposed on the substrate 100. In an exemplary embodiment, the pixel circuit unit 200 is disposed on the fourth layer 114 of the substrate 100, for example.

The pixel circuit unit 200 may include the buffer layer 120, the semiconductor layer 321, a gate insulating layer 140, the first gate electrode GE1, the second gate electrode GE2, the third gate electrode GE3, the fourth gate electrode GE4, the fifth gate electrode GE5, the sixth gate electrode GE6, the seventh gate electrode GE7, the (n−1)-th scan line SLn−1, the n-th scan line SLn, the (n+1)-th scan line SLn+1, the emission control line EL, a first insulating interlayer 150, the initialization line IL, a capacitor electrode 201, a second insulating interlayer 160, the first connection electrode 701, the second connection electrode 702, the third connection electrode 703, the data line DL, the high potential line VDL, and a planarization layer 180, for example.

The buffer layer 120 is disposed on the fourth layer 114 of the substrate 100. The buffer layer 120 may be disposed over an entire surface of the fourth layer 114. In an exemplary embodiment, the buffer layer 120 may overlap the entire surface of the fourth layer 114, for example.

The buffer layer 120 serves to prevent permeation of undesirable elements and to planarize a surface therebelow and may include suitable materials for planarizing and/or preventing permeation. In an exemplary embodiment, the buffer layer 120 may include one of the followings a silicon nitride ($SiN_x$) layer, a silicon oxide ($SiO_2$) layer and a silicon oxynitride ($SiO_xN_y$) layer, for example. However, the buffer layer 120 is not invariably necessary and may be omitted based on the kinds of the substrate 100 and process conditions thereof.

As illustrated in FIG. 5, the semiconductor layer 321 is disposed on the buffer layer 120.

As illustrated in FIG. 4A, the semiconductor layer 321 provides respective channel areas CH1, CH2, CH3, CH4, CH5, CH6 and CH7 of the first, second, third, fourth, fifth, sixth and seventh switching elements T1, T2, T3, T4, T5, T6 and T7. In addition, the semiconductor layer 321 provides the respective source electrodes SE1, SE2, SE3, SE4, SE5, SE6 and SE7 and the respective drain electrodes DE1, DE2, DE3, DE4, DE5, DE6 and DE7 of the first, second, third, fourth, fifth, sixth and seventh switching elements T1, T2, T3, T4, T5, T6 and T7.

To this end, the semiconductor layer 321 may include the first channel area CH1, the second channel area CH2, the third channel area CH3, the fourth channel area CH4, the fifth channel area CH5, the sixth channel area CH6, the seventh channel area CH7, the first source electrode SE1, the second source electrode SE2, the third source electrode SE3, the fourth source electrode SE4, the fifth source electrode SE5, the sixth source electrode SE6, the seventh source electrode SE7, the first drain electrode DE1, the second drain electrode DE2, the third drain electrode DE3, the fourth drain electrode DE4, the fifth drain electrode DE5, the sixth drain electrode DE6, and the seventh drain electrode DE7.

The first source electrode SE1, the second drain electrode DE2 and the fifth drain electrode DE5 are connected to each other. In an exemplary embodiment, the first source electrode SE1, the second drain electrode DE2 and the fifth drain electrode DE5 may be integrally provided as a single unitary and indivisible unit provided unitarily, for example.

The first drain electrode DE1, the third source electrode SE3 and the sixth source electrode SE6 are connected to each other. In an exemplary embodiment, the first drain electrode DE1, the third source electrode SE3 and the sixth source electrode SE6 may be integrally provided as a single unitary and indivisible unit provided unitarily, for example.

The third drain electrode DE3 and the fourth drain electrode DE4 are connected to each other. In an exemplary embodiment, the third drain electrode DE3 and the fourth drain electrode DE4 may be integrally provided as a single unitary and indivisible unit provided unitarily, for example.

The sixth drain electrode DE6 and the seventh source electrode SE7 are connected to each other. In an exemplary embodiment, the sixth drain electrode DE6 and the seventh source electrode SE7 may be integrally provided as a single unitary and indivisible unit provided unitarily, for example.

In an exemplary embodiment, the semiconductor layer 321 may include a polycrystalline silicon layer, an amorphous silicon layer and an oxide semiconductor such as indium gallium zinc oxide ("IGZO") or indium zinc tin oxide ("IZTO"). In an exemplary embodiment, in the case where the semiconductor layer 321 includes a polycrystalline silicon layer, the semiconductor layer 321 may include a channel area which is not doped with an impurity and a source electrode and a drain electrode, on the opposite sides of the channel area, which are doped with impurities, for example.

As illustrated in FIG. 5, the gate insulating layer 140 is disposed on the semiconductor layer 321 and the buffer layer 120. In an exemplary embodiment, the gate insulating layer 140 may include at least one of tetraethylorthosilicate ("TEOS"), silicon nitride ($SiN_x$) and silicon oxide ($SiO_2$), for example. In an exemplary embodiment, the gate insulating layer 140 may have a double-layer structure where a $SiN_x$ layer having a thickness of about 40 nanometers (nm) and a TEOS layer having a thickness of about 80 nm are sequentially stacked, for example.

As illustrated in FIG. 5, the first gate electrode GE1 is disposed on the gate insulating layer 140. In an exemplary embodiment, the first gate electrode GE1 is located between the gate insulating layer 140 and the first insulating interlayer 150, for example.

Although not illustrated in FIG. 5, the second gate electrode GE2, the third gate electrode GE3, the fourth gate electrode GE4, the fifth gate electrode GE5, the sixth gate electrode GE6, and the seventh gate electrode GE 7 are also disposed on the gate insulating layer 140. In an exemplary embodiment, the second, third, fourth, fifth, sixth and seventh gate electrodes GE2, GE3, GE4, GE5, GE6 and GE7 are located between the gate insulating layer 140 and the first insulating interlayer 150, for example.

Although not illustrated in FIG. 5, the scan lines and the emission control lines are also disposed on the gate insulating layer 140. In an exemplary embodiment, the (n−1)-th scan line SLn−1, the n-th scan line SLn, the (n+1)-th scan line SLn+1 and the emission control line EL are located between the gate insulating layer 140 and the first insulating interlayer 150, for example.

As illustrated in FIGS. 3 and 4F, the first gate electrode GE1 overlaps the first channel area CH1 of the semiconductor layer 321, the second gate electrode GE2 overlaps the second channel area CH2 of the semiconductor layer 321, the third gate electrode GE3 overlaps the third channel area CH3 of the semiconductor layer 321, the fourth gate electrode GE4 overlaps the fourth channel area CH4 of the semiconductor layer 321, the fifth gate electrode GE5 overlaps the fifth channel area CH5 of the semiconductor layer 321, the sixth gate electrode GE6 overlaps the sixth channel area CH6 of the semiconductor layer 321, and the seventh gate electrode GE7 overlaps the seventh channel area CH7 of the semiconductor layer 321.

As illustrated in FIGS. 4B and 4F, the fourth gate electrode GE4 is connected to the (n−1)-th scan line SLn−1, and in such an exemplary embodiment, the fourth gate electrode GE4 may be defined by a portion of the (n−1)-th scan line SLn−1. In an exemplary embodiment, a portion of the (n−1)-th scan line SLn−1 that overlaps the semiconductor layer 321 may correspond to the fourth gate electrode GE4, for example.

As illustrated in FIGS. 4B and 4F, the third gate electrode GE3 is connected to the n-th scan line SLn, and in such an exemplary embodiment, the third gate electrode GE3 may be defined by a portion of the n-th scan line SLn. In an exemplary embodiment, a portion of the n-th scan line SLn that overlaps the semiconductor layer 321 may correspond to the third gate electrode GE3, for example.

As illustrated in FIGS. 4B and 4F, the seventh gate electrode GE7 is connected to the (n+1)-th scan line SLn+1, and in such an exemplary embodiment, the seventh gate electrode GE7 may be defined by a portion of the (n+1)-th scan line SLn+1. In an exemplary embodiment, a portion of the (n+1)-th scan line SLn+1 that overlaps the semiconductor layer 321 may correspond to the seventh gate electrode GE7, for example.

As illustrated in FIGS. 4B and 4F, the fifth gate electrode GE5 and the sixth gate electrode GE6 are connected in common to one emission control line EL, and in such an exemplary embodiment, the fifth gate electrode GE5 and the sixth gate electrode GE6 may be portions of the emission control line EL. In an exemplary embodiment, two portions of the emission control line EL that overlap the semiconductor layer 321 may correspond to the fifth gate electrode GE5 and the sixth gate electrode GE6, respectively, for example.

In an exemplary embodiment, the scan line (e.g., at least one of the (n−1)-th scan line SLn−1, the n-th scan line SLn and the (n+1)-th scan line SLn+1) may include at least one of aluminum (Al) or alloys thereof, silver (Ag) or alloys thereof, copper (Cu) or alloys thereof and molybdenum (Mo) or alloys thereof, for example. In an alternative exemplary embodiment, the scan line may include chromium (Cr), tantalum (Ta), and/or titanium (Ti), for example. In an exemplary embodiment, the scan line may have a multilayer structure including at least two conductive layers that have different physical properties from each other.

The first, second, third, fourth, fifth, sixth and seventh gate electrodes GE1, GE2, GE3, GE4, GE5, GE6 and GE7 may include a substantially same material and have a substantially same structure (e.g., a multilayer structure) as those of the scan line described above. Each of the gate electrodes GE1, GE2, GE3, GE4, GE5, GE6 and GE7 and the scan line may be substantially simultaneously formed in a substantially same process.

In addition, the emission control line EL may include a substantially same material and have a substantially same structure (e.g., a multilayer structure) as those of the above-described scan line (e.g., SLn). The emission control line EL and the scan line may be substantially simultaneously provided in a substantially same process.

As illustrated in FIG. 5, the first insulating interlayer 150 is disposed on the first gate electrode GE1 and the gate insulating layer 140. The first insulating interlayer 150 may have a thickness larger than a thickness of the gate insulating layer 140. The first insulating interlayer 150 may include a material substantially the same as a material included in the gate insulating layer 140 described above.

Although not illustrated in FIG. 5, the first insulating interlayer 150 is also disposed on the second, third, fourth, fifth, sixth and seventh gate electrodes GE2, GE3, GE4, GE5, GE6 and GE7, each scan line (e.g., scan lines SLn−1, SLn, SLn+1) and the emission control line EL.

As illustrated in FIG. 5, the capacitor electrode 201 is disposed on the first insulating interlayer 150. In an exemplary embodiment, the capacitor electrode 201 is located between the first insulating interlayer 150 and the second insulating interlayer 160, for example. The capacitor electrode 201 defines a storage capacitor Cst together with the first gate electrode GE1 described above. In an exemplary embodiment, the first gate electrode GE1 corresponds to a first electrode of the storage capacitor Cst, and the capacitor electrode 201 corresponds to a second electrode of the storage capacitor Cst, for example. In an exemplary embodiment, a portion of the first gate electrode GE1 that overlaps the capacitor electrode 201 corresponds to the first electrode of the storage capacitor Cst, and a portion of the capacitor electrode 201 that overlaps the first gate electrode GE1 corresponds to the second electrode of the storage capacitor Cst, for example.

Although not illustrated in FIG. 5, the initialization line IL (refer to FIGS. 3 and 4C) is also disposed on the first insulating interlayer 150. In an exemplary embodiment, the initialization line IL is located between the first insulating interlayer 150 and the second insulating interlayer 160, for example.

As illustrated in FIGS. 3 and 4C, the capacitor electrode 201 has a hole 30. In an exemplary embodiment, the hole 30 may have a quadrangular shape, for example. However, the shape of the hole is not limited to the quadrangle. In other exemplary embodiments, the holes 30 may have at least one of various shapes such as a circular or triangular shape, for example.

As illustrated in FIGS. 3 and 4C, capacitor electrodes 201 of pixels adjacent to each other may be connected to each other. In other words, the capacitor electrodes 201 of the pixels adjacent to each other in the X-axis direction may be integrally provided as a single unitary and indivisible unit provided unitarily.

As illustrated in FIG. 5, the second insulating interlayer 160 is disposed on the capacitor electrode 201, the initialization line IL, and the first insulating interlayer 150. The second insulating interlayer 160 may have a thickness larger than a thickness of the gate insulating layer 140. The second insulating interlayer 160 may include a material substantially the same as a material included in the gate insulating layer 140 described above.

As illustrated in FIG. 5, the first connection electrode 701, the second connection electrode 702, the high potential line VDL and the data line DL are disposed on the second insulating interlayer 160. In an exemplary embodiment, the first connection electrode 701, the second connection electrode 702, the high potential line VDL and the data line DL are located between the second insulating interlayer 160 and the planarization layer 180, for example.

Although not illustrated in FIG. 5, the third connection electrode 703 (refer to FIGS. 3 and 4D) is also disposed on the second insulating interlayer 160. In an exemplary embodiment, the third connection electrode 703 is located between the second insulating interlayer 160 and the planarization layer 180, for example.

As illustrated in FIG. 5, the first connection electrode 701 is connected to the sixth drain electrode DE6 through a first contact hole 11 which is defined through the second insulating interlayer 160, the first insulating interlayer 150 and the gate insulating layer 140.

As illustrated in FIG. 5, the second connection electrode 702 is connected to the first gate electrode GE1 through a second contact hole 12 which is defined through the second insulating interlayer 160 and the first insulating interlayer 150. In addition, as illustrated in FIGS. 3, 4A and 4D, the second connection electrode 702 is connected to the third drain electrode DE3 through a third contact hole 13. The third contact hole 13 is defined through the second insulating interlayer 160, the first insulating interlayer 150, and the gate insulating layer 140 to expose the third drain electrode DE3.

As illustrated in FIGS. 3, 4A and 4D, the third connection electrode 703 is connected to the fourth source electrode SE4 through a fourth contact hole 14. The fourth contact hole 14 is defined through the second insulating interlayer 160, the first insulating interlayer 150, and the gate insulating layer 140 to expose the fourth source electrode SE4. In addition, as illustrated in FIGS. 3, 4C and 4D, the third connection electrode 703 is connected to the initialization line IL through a fifth contact hole 15. The fifth contact hole 15 is defined through the second insulating interlayer 160 to expose the initialization line IL.

As illustrated in FIG. 5, the high potential line VDL is connected to the capacitor electrode 201 through a sixth contact hole 16 which is defined through the second insulating interlayer 160. In addition, as illustrated in FIGS. 3, 4A and 4D, the high potential line VDL is connected to the fifth source electrode SE5 through a seventh contact hole 17. The seventh contact hole 17 is defined through the second insulating interlayer 160, the first insulating interlayer 150 and the gate insulating layer 140 to expose the fifth source electrode SE5.

As illustrated in FIGS. 3, 4A and 4D, the data line DL is connected to the second source electrode SE2 through an eighth contact hole 18. The eighth contact hole 18 is defined through the second insulating interlayer 160, the first insulating interlayer 150 and the gate insulating layer 140 to expose the second source electrode SE2.

In an exemplary embodiment, the data line DL may include a refractory metal, such as molybdenum, chromium, tantalum and titanium, or an alloy thereof, for example. The data line DL may have a multilayer structure including a refractory metal layer and a low-resistance conductive layer. Examples of the multilayer structure may include a double-layer structure including a chromium or molybdenum (alloy) lower layer and an aluminum (alloy) upper layer, or a triple-layer structure including a molybdenum (alloy) lower layer, an aluminum (alloy) intermediate layer and a molybdenum (alloy) upper layer. In an exemplary embodiment, the data line DL may include any suitable metals or conductors other than the aforementioned materials.

The first connection electrode 701, the second connection electrode 702, the third connection electrode 703, and the high potential line VDL may include a substantially same material and have a substantially same structure (e.g., a multilayer structure) as those of the data line DL. Each of the first connection electrode 701, the second connection electrode 702, the third connection electrode 703, the high potential line VDL, and the data line DL may be substantially simultaneously provided in a substantially same process.

As illustrated in FIG. 5, the planarization layer 180 is disposed on the first connection electrode 701, the second connection electrode 702, the third connection electrode 703, the high potential line VDL and the data line DL.

The planarization layer 180 serves to eliminate a height difference therebelow to increase luminous efficiency of the LED to be disposed thereon. In an exemplary embodiment, the planarization layer 180 may include at least one of a polyacrylate resin, an epoxy resin, a phenolic resin, a polyamide resin, a polyimide resin, an unsaturated polyester resin, a polyphenylene ether resin, a polyphenylene sulfide resin and benzocyclobutene ("BCB"), for example.

The LED may be an OLED. The LED includes a light emitting layer 512, an anode electrode PE (hereinafter, "a pixel electrode") and a cathode electrode 613 (hereinafter, "a common electrode"), as illustrated in FIG. 5.

The light emitting layer 512 may include a low molecular weight organic material or a high molecular weight organic material. Although not illustrated, at least one of a hole injection layer ("HIL") and a hole transport layer ("HTL") may further be disposed between the pixel electrode PE and the light emitting layer 512, and at least one of an electron transport layer ("ETL") and an electron injection layer ("EIL") may further be disposed between the light emitting layer 512 and the common electrode 613.

As illustrated in FIG. 5, the pixel electrode PE is disposed on the planarization layer 180. A portion of or all of the pixel electrode PE is located in a light emission area 900. That is, the pixel electrode PE is located corresponding to the light emission area 900 that is defined by the light blocking layer 190 to be described below. The pixel electrode PE is connected to the first connection electrode 701 through a ninth contact hole 19 which is defined through the planarization layer 180.

As illustrated in FIGS. 3 and 4E, the pixel electrode PE may have a rhombic shape, for example. In an alternative exemplary embodiment, the pixel electrode PE may have one of various shapes, e.g., a quadrangular shape, other than the rhombic shape.

As illustrated in FIG. 5, the light blocking layer 190 is disposed on the pixel electrode PE and the planarization layer 180. An opening 900 is defined through the light blocking layer 190, and the opening 900 corresponds to the light emission area 900. As illustrated in FIGS. 3 and 4G, the light emission area 900 may have a rhombic shape, for example. In an alternative exemplary embodiment, the light emission area 900 may have one of various shapes, e.g., a quadrangular shape, rather than the rhombic shape. The size of the light emission area 900 may be less than the size of the pixel electrode PE described above. At least a portion of the pixel electrode PE is located at the light emission area 900. In such an exemplary embodiment, the entirety of the light emission area 900 overlaps the pixel electrode PE.

In an exemplary embodiment, the light blocking layer 190 may include a resin, such as a polyacrylate resin and a polyimide resin.

The spacer 422 is disposed on the light blocking layer 190. The spacer 422 may include or consist of a material substantially the same as a material included in the light blocking layer 190. The spacer 422 serves to substantially minimize a height difference between a layer located in the display area 100a of the substrate 100 and a layer located in the non-display area 100b of the substrate 100.

The light emitting layer 512 is disposed on the pixel electrode PE in the light emission area 900, and the common electrode 613 is disposed on the light blocking layer 190 and the light emitting layer 512.

The pixel electrode PE and the common electrode 613 may be provided as one of a transmissive electrode, a transflective electrode and a reflective electrode.

In one exemplary embodiment, the transmissive electrode may include transparent conductive oxide ("TCO"). Such TCO may include at least one of indium tin oxide ("ITO"), indium zinc oxide ("IZO"), antimony tin oxide ("ATO"), aluminum zinc oxide ("AZO"), zinc oxide ("ZnO"), and combinations thereof, for example.

In one exemplary embodiment, the transflective electrode and the reflective electrode may include a metal, e.g., magnesium (Mg), silver (Ag), gold (Au), calcium (Ca), lithium (Li), chromium (Cr), aluminum (Al) and copper (Cu), or an alloy thereof. In such an exemplary embodiment, whether an electrode is a transflective type or a reflective type depends on the thickness of the electrode. Typically, the transflective electrode has a thickness of about 200 nm or less, and the reflective electrode has a thickness of about 300 nm or more, for example. As the thickness of the transflective electrode decreases, light transmittance and resistance increase. As the thickness of the transflective electrode increases, light transmittance decreases.

In such an exemplary embodiment, the transflective electrode and the reflective electrode may have a multilayer structure which includes a metal layer including a metal or a metal alloy and a TCO layer stacked on the metal layer.

The sealing unit 750 is disposed on the common electrode 613. The sealing unit 750 may include a transparent insulating substrate including glass, transparent plastic, or the like. In addition, the sealing unit 750 may be provided to have a thin film encapsulation structure in which one or more inorganic layers and one or more organic layers are alternately laminated along the Z-axis direction. In an exemplary embodiment, the sealing unit 750 may include a lower inorganic layer 751, an organic layer 755, and an upper inorganic layer 752, as illustrated in FIG. 5, for example. The organic layer 755 is located between the lower inorganic layer 751 and the upper inorganic layer 752. Among the lower inorganic layer 751, the organic layer 755 and the upper inorganic layer 752, the organic layer 755 has the largest thickness. The lower inorganic layer 751 and the upper inorganic layer 752 may have a substantially equal thickness.

The lower inorganic layer 751 and the upper inorganic layer 752 may include or consist of a material substantially the same as a material included in the second layer 112 described above.

The organic layer 755 may include or consist of a material substantially the same as a material included in the first layer 111. In addition, the organic layer 755 may include a monomer.

Figure 6:
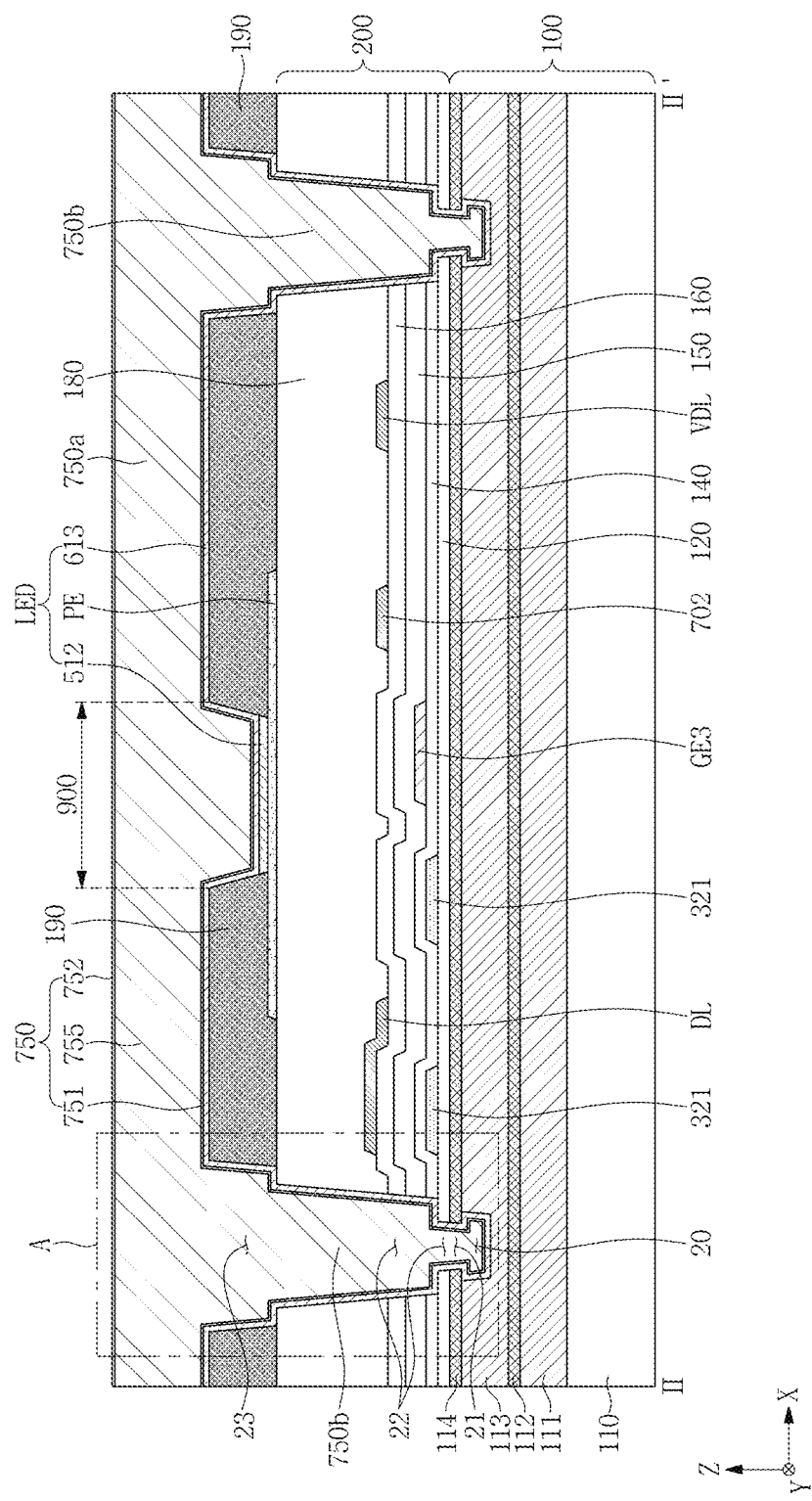
FIG. 6 is a cross-sectional view taken along line II-II' of FIG. 3.
Figure 7:
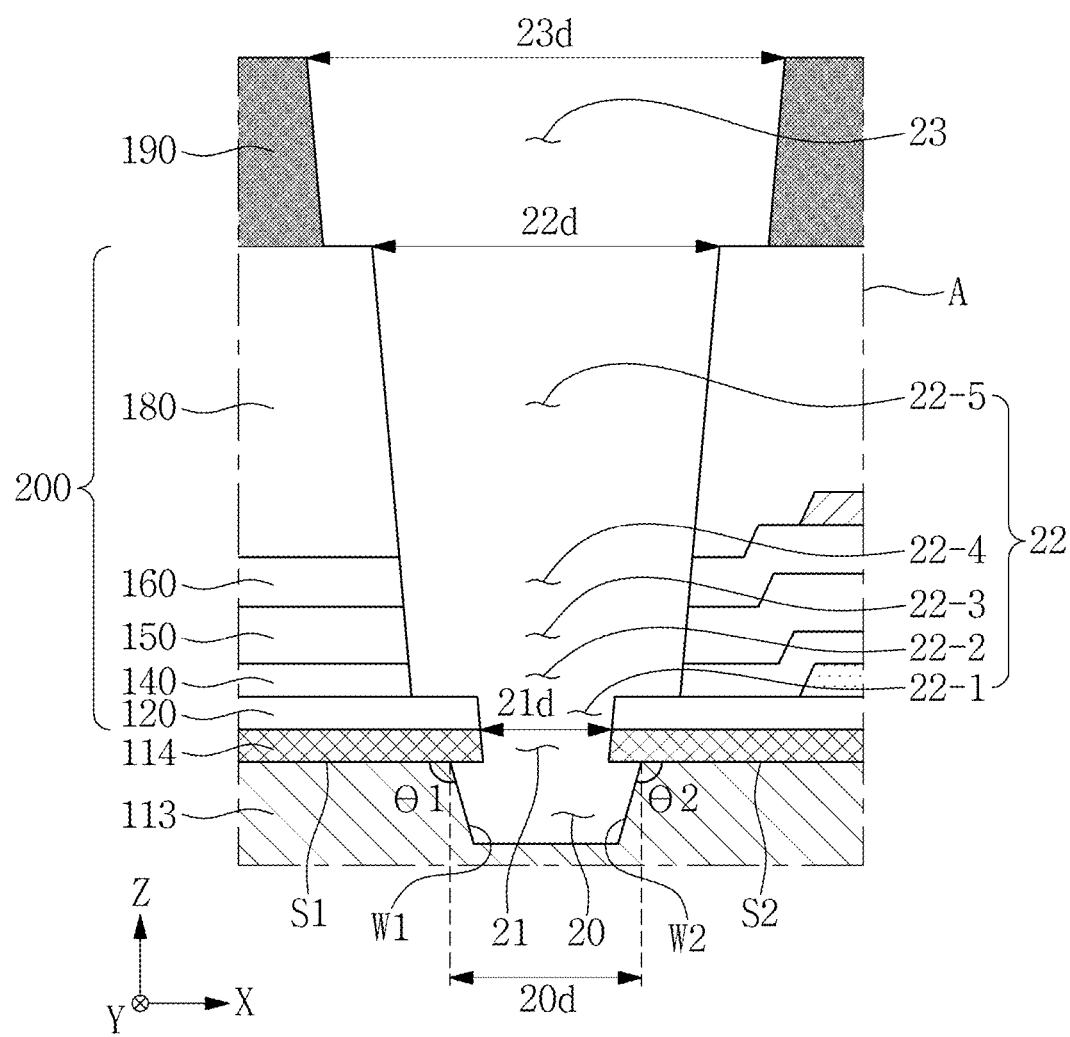
FIG. 7 is a view enlarging a portion A of FIG. 6.

FIG. 6 is a cross-sectional view taken along line of FIG. 3 and FIG. 7 is a view enlarging a portion A of FIG. 6. However, the sealing unit 750 and the common electrode 613 are omitted in FIG. 7.

A portion of the sealing unit 750 is inserted into the substrate 100, as illustrated in FIG. 6. In an exemplary embodiment, the sealing unit 750 includes a cover portion 750a and an extension portion 750b extending from the cover portion 750a toward the substrate 100, for example. The extension portion 750b is inserted into the substrate 100.

To this end, a hole or a depression is defined in the substrate 100, the pixel circuit unit 200, and the light blocking layer 190 at portions corresponding to the extension portion 750b of the sealing unit 750. In an exemplary embodiment, as illustrated in FIGS. 6 and 7, a first hole 21 and a depression 20 located corresponding to the extension portion 750b are defined in the substrate 100, a second hole 22 located corresponding to the extension portion 750b is defined in the pixel circuit unit 200, and a third hole 23 located corresponding to the extension portion 750b is defined in the light blocking layer 190, for example.

The depression 20 of the substrate 100 may be located, for example, in the third layer 113 of the substrate 100. The depression 20 is located in a layer below a switching element (e.g., at least one of the switching elements T1, T2, T3, T4, T5, T6 and T7) of the pixel circuit unit 200. In an exemplary embodiment, the depression 20 is located closer to the base layer 110 than the switching element is thereto, for example. As a more specific example, the distance between the depression 20 and the base layer 110 measured in the Z-axis direction is less than the distance between the semiconductor layer 321 of the switching element and the base layer 110 measured in the Z-axis direction.

The first hole 21 of the substrate 100 may be located in the fourth layer 114 of the substrate 100, for example.

The first hole 21, the second hole 22, the third hole 23 and the depression 20 are located corresponding to each other. In addition, adjacent ones of the first hole 21, the second hole 22, the third hole 23 and the depression 20 are connected to each other.

The first hole 21 may be located between the depression 20 and the second hole 22.

The depression 20 has a width (or diameter) which gradually increases along a direction (e.g., the Z-axis direction) from the third layer 113 toward the fourth layer 114. As illustrated in FIG. 7, a width 20d (or diameter) of the depression 20 is a value measured in the X-axis direction (or Y-axis direction). As used herein, the width 20d (or diameter) of the depression 20 means a maximum width (or maximum diameter) or an average width (or average diameter) of the depression 20.

At least one of mutually facing inner walls W1 and W2 of the depression 20 is inclined at a predetermined angle with respect to interfaces S1 and S2 between the third layer 113 and the fourth layer 114. In an exemplary embodiment, angles θ1 and θ2 defined between at least one of the mutually facing inner walls W1 and W2 of the depression 20 and the interfaces S1 and S2 are an obtuse angle, for example. As a more specific example, the angle θ1 defined between the inner wall W1 and the interface S1 adjacent to the inner wall W1 is an obtuse angle.

The first hole 21 has a width (or diameter) which gradually increases along the Z-axis direction. A width 21d (or diameter) of the first hole 21 is a value measured in the X-axis direction (or Y-axis direction). In such an exemplary embodiment, the width 21d (or diameter) of the first hole 21 means a maximum width (or maximum diameter) or an average width (or average diameter) of the first hole 21.

The second hole 22 has a width (or diameter) which gradually increases along the Z-axis direction. A width 22d (or diameter) of the second hole 22 is a value measured in the X-axis direction (or Y-axis direction). In such an exemplary embodiment, the width 22d (or diameter) of the second hole 22 means a maximum width (or maximum diameter) or an average width (or average diameter) of the second hole 22.

The second hole 22 refers to a hole that continuously passes through insulating layers included in the pixel circuit unit 200. In an exemplary embodiment, the second hole 22 means a hole that continuously passes through the buffer layer 120, the gate insulating layer 140, the first insulating interlayer 150, the second insulating interlayer 160, and the planarization layer 180, for example. In an exemplary embodiment, the second hole 22 may include a hole 22-1 (hereinafter, "a buffer hole") which is defined through the buffer layer 120, a hole 22-2 (hereinafter, "a gate hole") which is defined through the gate insulating layer 140, a hole 22-3 (hereinafter, "a first interlayer hole") which is defined through the first insulating interlayer 150, a hole 22-4 (hereinafter, "a second interlayer hole") which is defined through the second insulating interlayer 160, and a hole 22-5 (hereinafter, "a planarization hole") which is defined through the planarization layer 180, for example.

The buffer hole 22-1, the gate hole 22-2, the first interlayer hole 22-3, the second interlayer hole 22-4, and the planarization hole 22-5 may have widths (or diameters) different from each other. In an exemplary embodiment, the holes 22-1, 22-2, 22-3, 22-4, and 22-5 included in the second hole 22 may have widths (or diameters) which increase as further away from the substrate 100 in the Z-axis direction, for example. As a specific example, between the buffer hole 22-1, the gate hole 22-2, the first interlayer hole 22-3, the second interlayer hole 22-4, and the planarization hole 22-5, the planarization hole 22-5 may have the largest width (or largest diameter). The width (or diameter) of each hole included in the second hole 22 is a value measured in the X-axis direction (or Y-axis direction). In such an exemplary embodiment, the width (or diameter) of each of the holes 22-1, 22-2, 22-3, 22-4, and 22-5 included in the second hole 22 corresponds to a maximum width (or maximum diameter) or an average width (or maximum diameter).

Each of the holes 22-1, 22-2, 22-3, 22-4, and 22-5 included in the second hole 22 itself may have a width (or diameter) which gradually increases along the Z-axis direction. In an exemplary embodiment, the buffer hole 22-1 has a width (or diameter) which gradually increases along the Z-axis direction, the gate hole 22-2 has a width (or diameter) which gradually increases along the Z-axis direction, the first interlayer hole 22-3 has a width (or diameter) which gradually increases along the Z-axis direction, the second interlayer hole 22-4 has a width (or diameter) which gradually increases along the Z-axis direction, and the planarization hole 22-5 has a width (or diameter) which gradually increases along the Z-axis direction, for example.

The third hole 23 may have a width (or diameter) which gradually increases along the Z-axis direction. The width 23d (or diameter) of the third hole 23 is a value measured in the X-axis direction (or Y-axis direction). In such an exemplary embodiment, the width 23d (or diameter) of the third hole 23 means a maximum width or an average width of the third hole 23.

The width 20d (or diameter) of the depression 20 is larger than the width 21d (or diameter) of the first hole 21. As illustrated in FIG. 7, a cross-section of the depression 20 and the first hole 21 may have the shape of an anchor, for example. In such an exemplary embodiment, the cross-section of the depression 20 and the extension portion 750b inserted into the first hole 21 may also have the shape of an anchor, for example.

From a planar point of view of FIG. 7, the first hole 21 is surrounded by the depression 20. In addition, from a planar point of view of FIG. 7, the first hole 21 and the depression 20 overlap each other.

From a planar point of view of FIG. 7, the first hole 21, the second hole 22, and the depression 20 are surrounded by the third hole 23.

The width 22d (or diameter) of the second hole 22 is larger than the width 21d (or diameter) of the first hole 21.

The width 23d (or diameter) of the third hole 23 is larger than the width 22d (or diameter) of the second hole 22.

The extension portion 750b of the sealing unit 750 described above is inserted (or buried) in the depression 20, the first hole 21, the second hole 22, and the third hole 23 having such a structure. In an exemplary embodiment, the extension portion 750b sequentially passes through the third hole 23, the second hole 22 and the first hole 21 to be inserted into the depression 20, for example. In such an exemplary embodiment, since the width 20d (or diameter) of the depression 20 is larger than the width 21d (or diameter) of the first hole 21, the extension portion 750b inserted into the depression 20, the first hole 21, the second hole 22, and the third hole 23 is not well separated in the Z-axis direction. Accordingly, a coupling force between the sealing unit 750 and the substrate 100 and a coupling force between the sealing unit 750 and a structure therebelow may be improved.

In an exemplary embodiment, an edge of the sealing unit 750 is located at an edge of the substrate 100, and the sealing unit 750 includes the lower inorganic layer 751 and the upper inorganic layer 752 which contact each other at the edge of the substrate 100. That is, the sealing unit 750 located at the edge of the substrate 100 does not include an organic layer. In addition, the planarization layer 180 is not located at the edge of the substrate 100. The edge of the sealing unit 750 contacts the edge of the substrate 100 in order to improve the coupling force between the sealing unit 750 and the substrate 100. In an exemplary embodiment, the lower inorganic layer 751 and the upper inorganic layer 752 of the sealing unit 750 may contact the second insulating interlayer 160 located at the edge of the substrate 100, for example. In an exemplary embodiment, when the edge of the sealing unit 750 increases, the coupling force between the sealing unit 750 and the substrate 100 is improved, while a dead space of the display device 5555 is increased. According to an exemplary embodiment of the invention, as the coupling force between the sealing unit 750 and the substrate 100 may be improved through the extension portion 750b of the sealing unit 750, a length of the edge of the sealing unit 750 may be reduced. Accordingly, the dead space of the display device 5555 may be substantially minimized.

The depression 20, the first hole 21, the second hole 22, and the third hole 23 described above may be located in the display area 100a of the substrate 100. In an exemplary embodiment, when an entire hole including the depression 20, the first hole 21, the second hole 22, and the third hole 23 is defined as one coupling depression 220, the coupling depression 220 and the extension portion 750b may be located in the display area 100a of the substrate 100, for example.

The coupling depression 220 and the extension portion 750b of the display area 100a may be located between the high potential line VDL and the data line DL that are adjacent to each other, as illustrated in FIG. 3.

Figure 8:
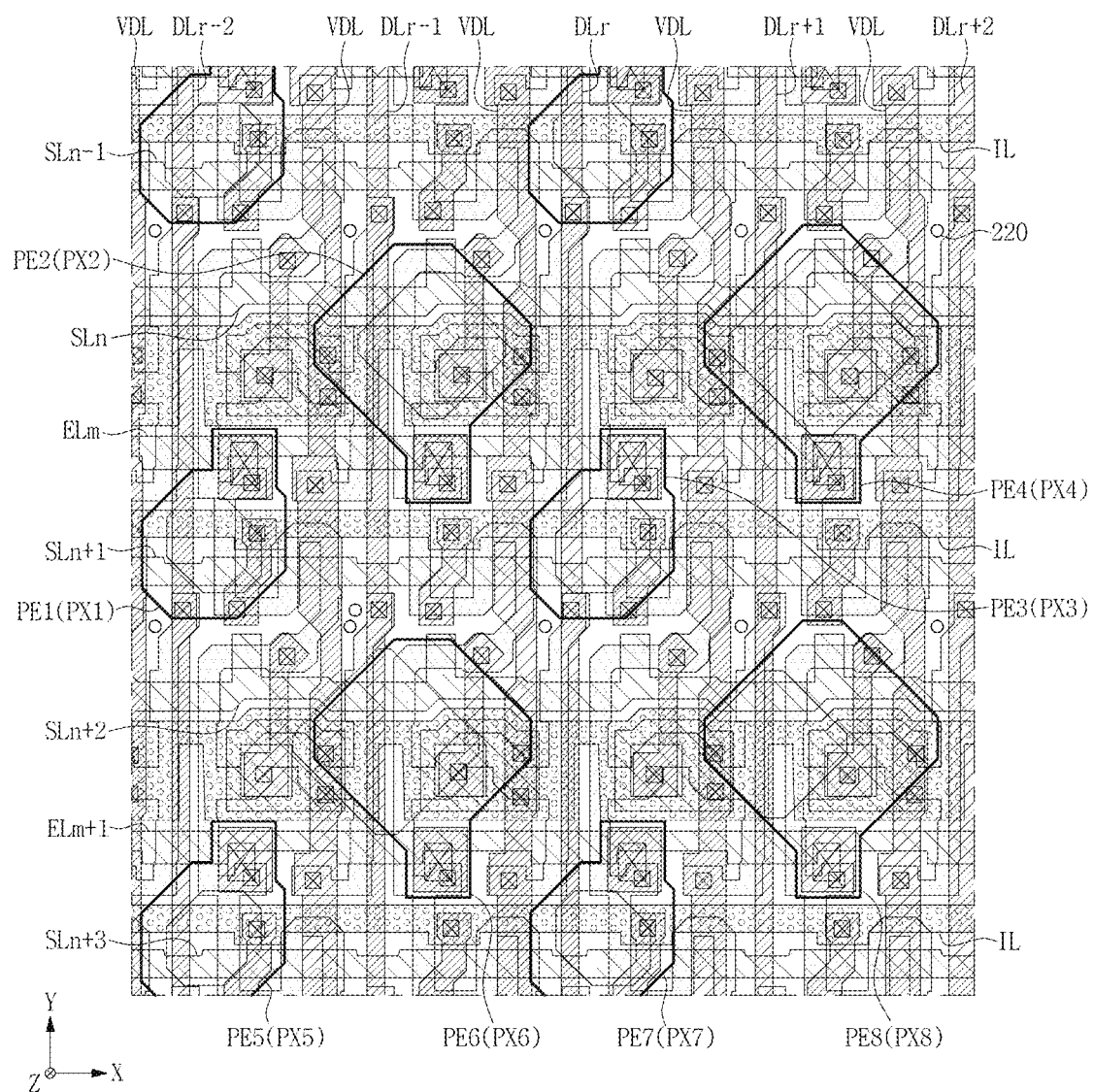
FIG. 8 is a detailed plan view illustrating a display device including a plurality of pixels illustrated in FIG. 1 and lines connected thereto.

FIG. 8 is a detailed plan view illustrating a display device including a plurality of pixels illustrated in FIG. 1 and lines connected thereto.

A plurality of pixels is illustrated in FIG. 8, and four pixels connected in common to the m-th emission control line ELm are referred to as a first pixel PX1, a second pixel PX2, a third pixel PX3, and a fourth pixel PX4, respectively. In such an exemplary embodiment, four pixels connected in common to an (m+1)-th emission control line ELm+1 are referred to as a fifth pixel PX5, a sixth pixel PX6, a seventh pixel PX7, and an eighth pixel PX8, respectively.

The second pixel PX2 of FIG. 8 is substantially the same as the pixel PX of FIG. 3 described above. The first pixel PX1, the third pixel PX3, the fourth pixel PX4, the fifth pixel PX5, the sixth pixel PX6, the seventh pixel PX7, and the eighth pixel PX8 may have a substantially same configuration as that of the pixel PX of FIG. 3.

The first pixel PX1, the third pixel PX3, the fifth pixel PX5, and the seventh pixel PX7 may emit lights having a substantially same color as each other. In one exemplary embodiment, for example, each of the first pixel PX1, the third pixel PX3, the fifth pixel PX5, and the seventh pixel PX7 may be a green pixel which emits a green light, for example.

The second pixel PX2 and the eighth pixel PX8 may emit lights having a substantially same color as each other. In one exemplary embodiment, for example, each of the second pixel PX2 and the eighth pixel PX8 may be a red pixel which emits a red light, for example.

The fourth pixel PX4 and the sixth pixel PX6 may emit lights having a substantially same color as each other. In one exemplary embodiment, for example, each of the fourth pixel PX4 and the sixth pixel PX6 may be a blue pixel which emits a blue light, for example.

Four adjacent pixels may define one unit pixel. In one exemplar embodiment, for example, the first pixel PX1, the second pixel PX2, the third pixel PX3, and the sixth pixel PX6 which are arranged adjacent to each other collectively define a unit pixel (hereinafter, "a first unit pixel"). In such an exemplary embodiment, the third pixel PX3, the fourth pixel PX4, the eighth pixel PX8 and another green pixel not illustrated, which are arranged adjacent to each other, collectively define another unit pixel (hereinafter, "a second unit pixel"). In such an exemplary embodiment, the another green pixel which is not illustrated is connected to the m-th emission control line ELm and is disposed adjacent to the fourth pixel PX4 and the eighth pixel PX8. The first unit pixel and the second unit pixel that are adjacent to each other in such a manner share a green pixel (e.g., the third pixel PX3) disposed therebetween. In such an exemplary embodiment, the second pixel PX2 of the first unit pixel defines another unit pixel together with another three pixels adjacent to an upper side thereof, and the sixth pixel PX6 of the first unit pixel defines still another unit pixel together with still another three pixels adjacent to a lower side thereof. In such an exemplary embodiment, the display device includes pixels of a pentile structure.

In an exemplary embodiment, each of the pixels PX1 to PX8 includes a pixel electrode. In one exemplary embodiment, for example, the first pixel PX1 includes a first pixel electrode PE1, the second pixel PX2 includes a second pixel electrode PE2, the third pixel PX3 includes a third pixel electrode PE3, the fourth pixel PX4 includes a fourth pixel electrode PE4, the fifth pixel PX5 includes a fifth pixel electrode PE5, the sixth pixel PX6 includes a sixth pixel electrode PE6, the seventh pixel PX7 includes a seventh pixel electrode PE7, and the eighth pixel PX8 includes an eighth pixel electrode PE8.

The pixel electrodes that are included in pixels that emit lights having a substantially same color may have a substantially equal size (e.g., area) as each other. In one exemplary embodiment, for example, the first pixel electrode PE1, the third pixel electrode PE3, the fifth pixel electrode PE5, and the seventh pixel electrode PE7 of the green pixels may have a substantially equal size as each other. In such an exemplary embodiment, the second pixel electrode PE2 and the eighth pixel electrode PE8 of the red pixels may have a substantially equal size as each other. In such an exemplary embodiment, the fourth pixel electrode PE4 and the sixth pixel electrode PE6 of the blue pixels may have a substantially equal size as each other.

Between the pixel electrodes, the pixel electrode of the green pixel may have the smallest size. In one exemplary embodiment, for example, among the first, second, third, fourth, fifth, sixth, and seventh pixel electrodes PE1, PE2, PE3, PE4, PE5, PE6, and PE7, the first pixel electrode PE1, the third pixel electrode PE3, the fifth pixel electrode PE5, and the seventh pixel electrode PE7 may have the smallest size.

In such an exemplary embodiment, the pixel electrode of the blue pixel may have a size larger than a size of the pixel electrode of the red pixel. In one exemplary embodiment, for example, the fourth pixel electrode PE4 may have a size larger than a size of the second pixel electrode PE2. In such an exemplary embodiment, the fourth pixel electrode PE4 may have a size larger than a size of the eighth pixel electrode PE8. In such an exemplary embodiment, the sixth pixel electrode PE6 may have a size larger than a size of the second pixel electrode PE2. In such an exemplary embodiment, the sixth pixel electrode PE6 may have a size larger than a size of the eighth pixel electrode PE8.

In an exemplary embodiment, although not illustrated, each of the pixels PX1, PX2, PX3, PX4, PX5, PX6, PX7, and PX8 further includes the first, second, third, fourth, fifth, sixth and seventh switching elements T1, T2, T3, T4, T5, T6 and T7 and the storage capacitor Cst. Detailed descriptions of the first, second, third, fourth, fifth, sixth and seventh switching elements T1, T2, T3, T4, T5, T6 and T7 and the storage capacitor Cst will refer to FIG. 3 and the related descriptions.

In one exemplary embodiment, as illustrated in FIG. 8, the first pixel PX1, the second pixel PX2, the third pixel PX3, and the fourth pixel PX4 are connected to a same scan line and a same emission control line. In one exemplary embodiment, for example, the first pixel PX1, the second pixel PX2, the third pixel PX3, and the fourth pixel PX4 are connected in common to the (n−1)-th scan line SLn−1, the n-th scan line SLn, the (n+1)-th scan line SLn+1, and the m-th emission control line ELm.

In such an exemplary embodiment, the fifth pixel PX5, the sixth pixel PX6, the seventh pixel PX7, and the eighth pixel PX8 are connected to a same scan line and a same emission control line. In one exemplary embodiment, for example, the fifth pixel PX5, the sixth pixel PX6, the seventh pixel PX7, and the eighth pixel PX8 are connected in common to the (n+1)-th scan line SLn+1, the (n+2)-th scan line SLn+2, an (n+3)-th scan line SLn+3, and the (m+1)-th emission control line ELm+1.

The first pixel PX1 and the fifth pixel PX5 are connected in common to a same data line. In one exemplary embodiment, for example, the first pixel PX1 and the fifth pixel PX5 are connected in common to an (r−1)-th data line DLr−1.

The second pixel PX2 and the sixth pixel PX6 are connected in common to a same data line. In one exemplary embodiment, for example, the second pixel PX2 and the sixth pixel PX6 are connected in common to an r-th data line DLr.

The third pixel PX3 and the seventh pixel PX7 are connected in common to a same data line. In one exemplary embodiment, for example, the third pixel PX3 and the seventh pixel PX7 are connected in common to an (r+1)-th data line DLr+1.

The fourth pixel PX4 and the eighth pixel PX8 are connected in common to a same data line. In one exemplary embodiment, for example, the fourth pixel PX4 and the eighth pixel PX8 are connected in common to an (r+2)-th data line DLr+2.

Hereinafter, the first, second, third and fourth pixels PX1, PX2, PX3 and PX4 connected in common to the (n−1)-th scan line SLn−1, the n-th scan line SLn, the (n+1)-th scan line SLn+1, and the m-th emission control line ELm are defined as a first pixel group, and the fifth, sixth, seventh and eighth pixels PX5, PX6, PX7, and PX8 connected in common to the (n+1)-th scan line SLn+1, the (n+2)-th scan line SLn+2, the (n+3)-th scan line SLn+3, and the (m+1)-th emission control line Elm+1 are defined as a second pixel group.

In an exemplary embodiment, the first pixel group and the second pixel group are connected to different emission control lines. In such an exemplary embodiment, the different emission control lines are disposed adjacent to each other. In one exemplary embodiment, for example, the first pixel group is connected to the m-th emission control line ELm, and the second pixel group is connected to the (m+1)-th emission control line ELm+1.

As illustrated in FIG. 8, the coupling depression 220 described above may be located evenly in the display area 100a of the substrate 100.

The coupling depression 220 of the display area 100a, as illustrated in FIG. 8, may be located between the high potential line VDL and the (r−1)-th data line DLr−1 which are adjacent to each other, the high potential line VDL and the r-th data line DLr which are adjacent to each other, and between the high potential line VDL and the (r+1)-th data line DLr+1 which are adjacent to each other, and between the high potential line VDL and the (r+2)-th data line DLr+2 which are adjacent to each other.

Similarly, the extension portion 750b (refer to FIG. 6) described above may be disposed evenly in the display area 100a of the substrate 100.

The extension portion 750b of the display area 100a may be located between the high potential line VDL and the (r−1)-th data line DLr−1 which are adjacent to each other, the high potential line VDL and the r-th data line DLr which are adjacent to each other, and between the high potential line VDL and the (r+1)-th data line DLr+1 which are adjacent to each other, and between the high potential line VDL and the (r+2)-th data line DLr+2 which are adjacent to each other.

Figure 9:
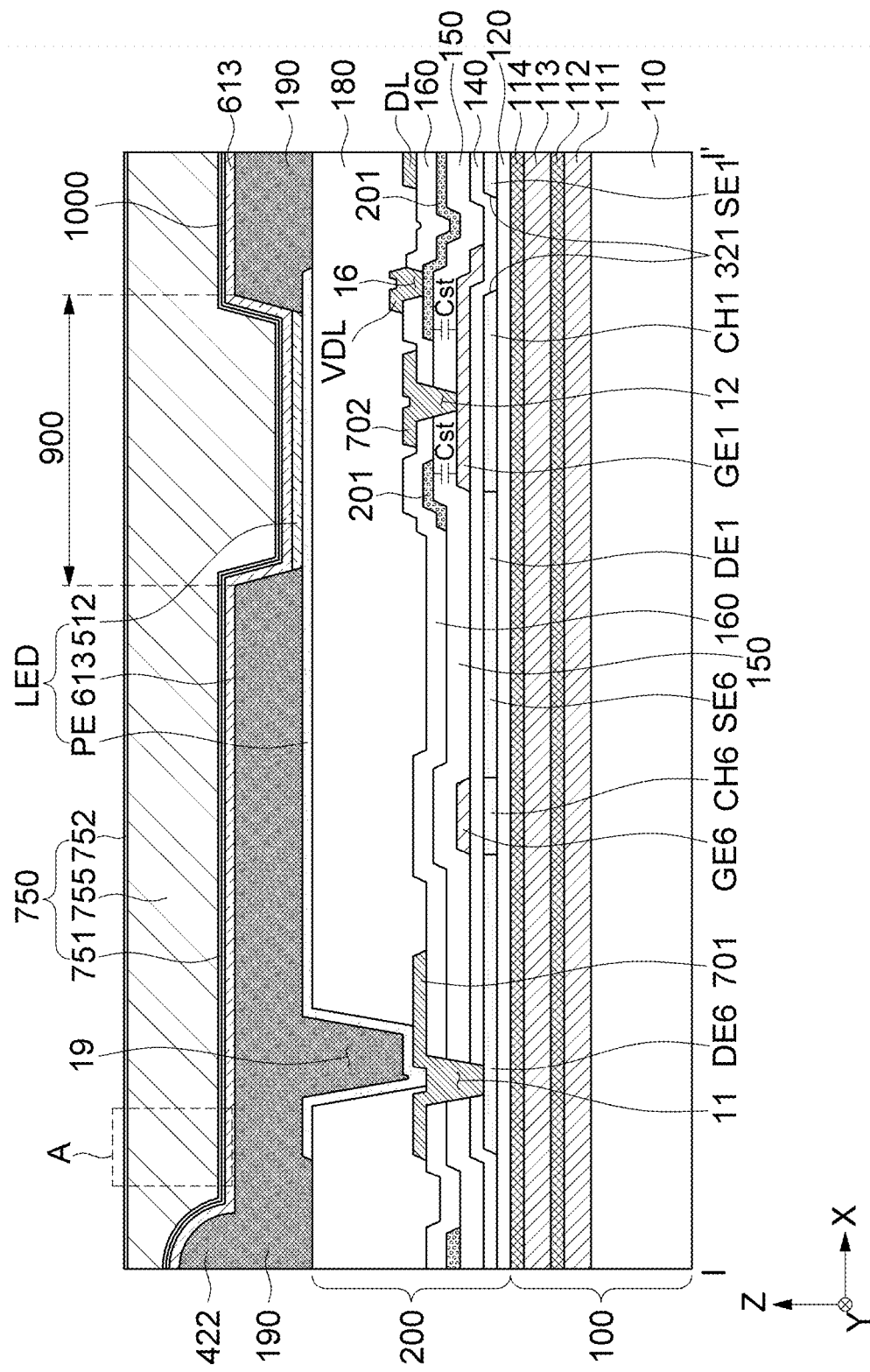
FIG. 9 is a cross-sectional view taken along line I-I' of another exemplary embodiment of FIG. 3.
Figure 10:
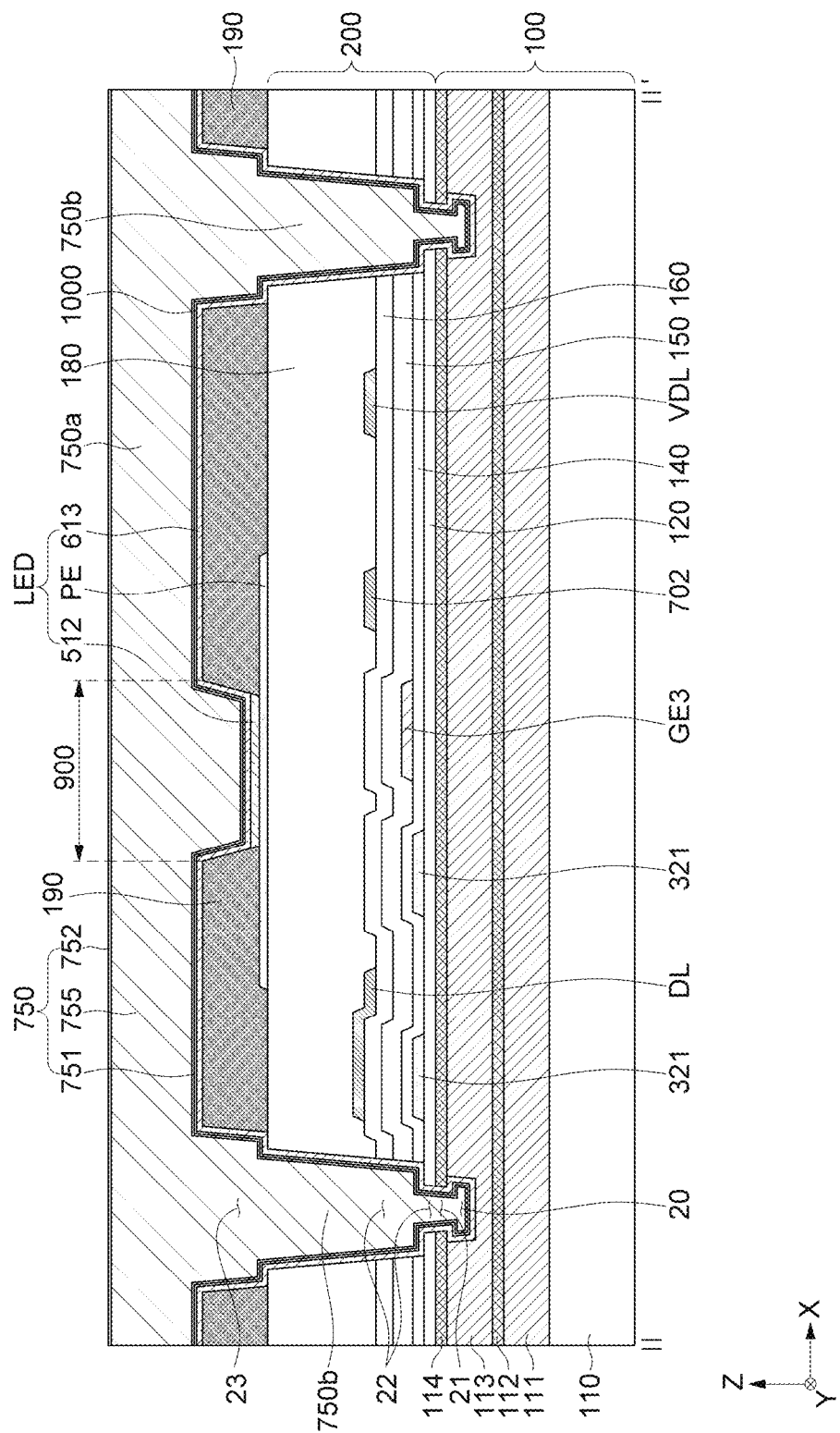
FIG. 10 is a cross-sectional view taken along line of another exemplary embodiment of FIG. 3.

FIG. 9 is a cross-sectional view taken along line I-I' of FIG. 3 according to another exemplary embodiment, and FIG. 10 is a cross-sectional view taken along line of FIG. 3 according to another exemplary embodiment.

As illustrated in FIGS. 9 and 10, the sealing unit 750 may further include a composite inorganic layer.

The composite inorganic layer is located on the common electrode 613 so as to overlap an entire surface of the substrate. As a specific example, the composite inorganic layer may be located between the common electrode 613 and a first inorganic layer 1-01 (refer to FIG. 11).

The composite inorganic layer may include the first inorganic layer 1-01 and a second inorganic layer 1-02 (refer to FIG. 11) having different refractive indices from each other.

Hereinafter, the composite inorganic layer according to an exemplary embodiment of the invention will be described in detail with reference to FIGS. 11 to 25.

Figure 11:
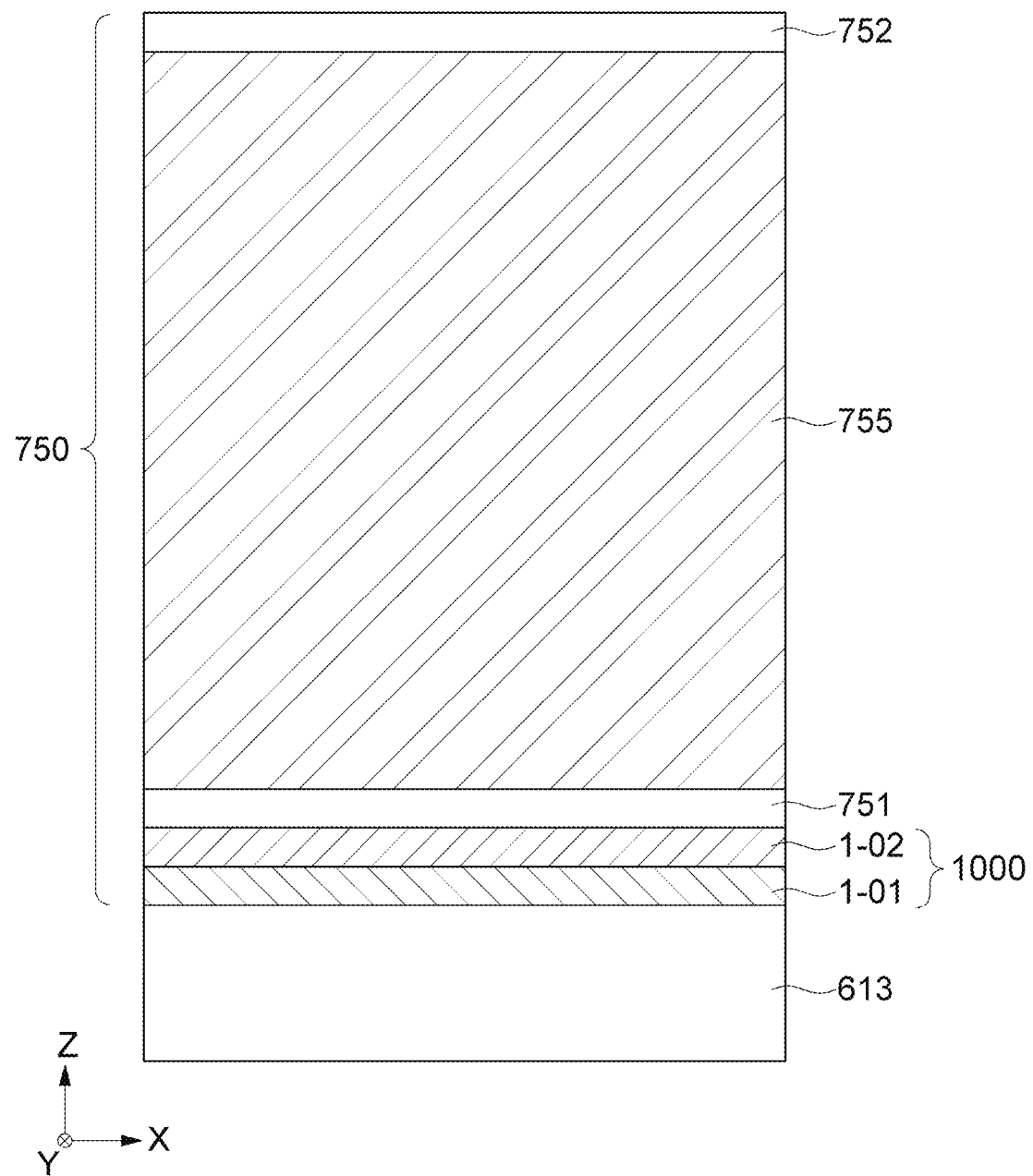
FIG. 11 is a view enlarging a portion A of FIG. 9.

FIG. 11 is a view enlarging a portion A of FIG. 9.

The sealing unit 750 may include the lower inorganic layer 751, the organic layer 755, the upper inorganic layer 752 and a composite inorganic layer 1000, as illustrated in FIG. 11.

The composite inorganic layer 1000 may include the first inorganic layer 1-01 and the second inorganic layer 1-02 located on the first inorganic layer 1-01. The first and second inorganic layers 1-01 and 1-02 are arranged along the Z-axis direction.

The first inorganic layer 1-01 may be located between the common electrode 613 and the second inorganic layer 1-02, and the second inorganic layer 1-02 may be located between the first inorganic layer 1-01 and the lower inorganic layer 751.

The first inorganic layer 1-01 and the second inorganic layer 1-02 may contact each other.

The first inorganic layer 1-01 has a refractive index different from a refractive index of the second inorganic layer 1-02. In an exemplary embodiment, the refractive index of the first inorganic layer 1-01 may be higher than that of the second inorganic layer 1-02, for example. The first inorganic layer 1-01 may include a material having a relatively high refractive index, and the second inorganic layer 1-02 may include a material having a relatively low refractive index.

In one exemplary embodiment, for example, the first inorganic layer 1-01 and the second inorganic layer 1-02 may include any one of inorganic materials such as $TiO_2$, $SiN_x$, $AlO_x$, and $SiO_x$. As a specific example, the first inorganic layer 1-01 may include $TiO_2$, and the second inorganic layer 1-02 may include any one of $SiN_x$, $AlO_x$, and $SiO_x$ that have a refractive index lower than that of $TiO_2$, for example.

As another example, the first inorganic layer 1-01 may include $SiN_x$, and the second inorganic layer 1-02 may include $SiO_x$. In an exemplary embodiment, the refractive index of $SiN_x$ may be about 1.833, and the refractive index of $SiO_x$ may be about 1.487, for example. In an exemplary embodiment, the refractive index (1.833) of $SiN_x$ and the refractive index (1.487) of $SiO_x$ may be the refractive index at a wavelength of about 632 nm, for example.

As another example, the first inorganic layer 1-01 may include $TiO_2$, and the first inorganic layer 1-01 may include $Al_2O_3$. In an exemplary embodiment, the refractive index of $TiO_2$ may be about 2.288, and the refractive index of $Al_2O_3$ may be about 1.627, for example. In an exemplary embodiment, the refractive index (2.288) of $TiO_2$ and the refractive index (1.627) of $Al_2O_3$ may be the refractive index at a wavelength of about 632 nm, for example.

A difference between the refractive index of the first inorganic layer 1-01 and the refractive index of the second inorganic layer 1-02 may be about 0.4 or more. In an exemplary embodiment, the first inorganic layer 1-01 may include $TiO_2$, and the second inorganic layer 1-02 may include $SiO_x$, for example. Since $TiO_2$ has a refractive index of about 2.288 and $SiO_x$ has a refractive index in a range from about 1.833 to about 1.882, the first inorganic layer 1-01 and the second inorganic layer 1-02 which include these materials may have a refractive index difference in a range from about 0.406 to about 0.455, for example.

In one exemplary embodiment, the refractive index of the second inorganic layer 1-02 may be higher than the refractive index of the first inorganic layer 1-01. In such an exemplary embodiment, the second inorganic layer 1-02 may include $TiO_2$, and the first inorganic layer 1-01 may include any one of $SiN_x$, $AlO_x$, and $SiO_x$ which have a refractive index lower than that of $TiO_2$.

In one exemplary embodiment, the refractive index of the second inorganic layer 1-02 may be higher than the refractive index of the first inorganic layer 1-01. In such an exemplary embodiment, the second inorganic layer 1-02 may include $TiO_2$, and the first inorganic layer 1-01 may include any one of $SiN_x$, $AlO_x$, and $SiO_x$ which have a refractive index lower than that of $TiO_2$.

Figure 12:
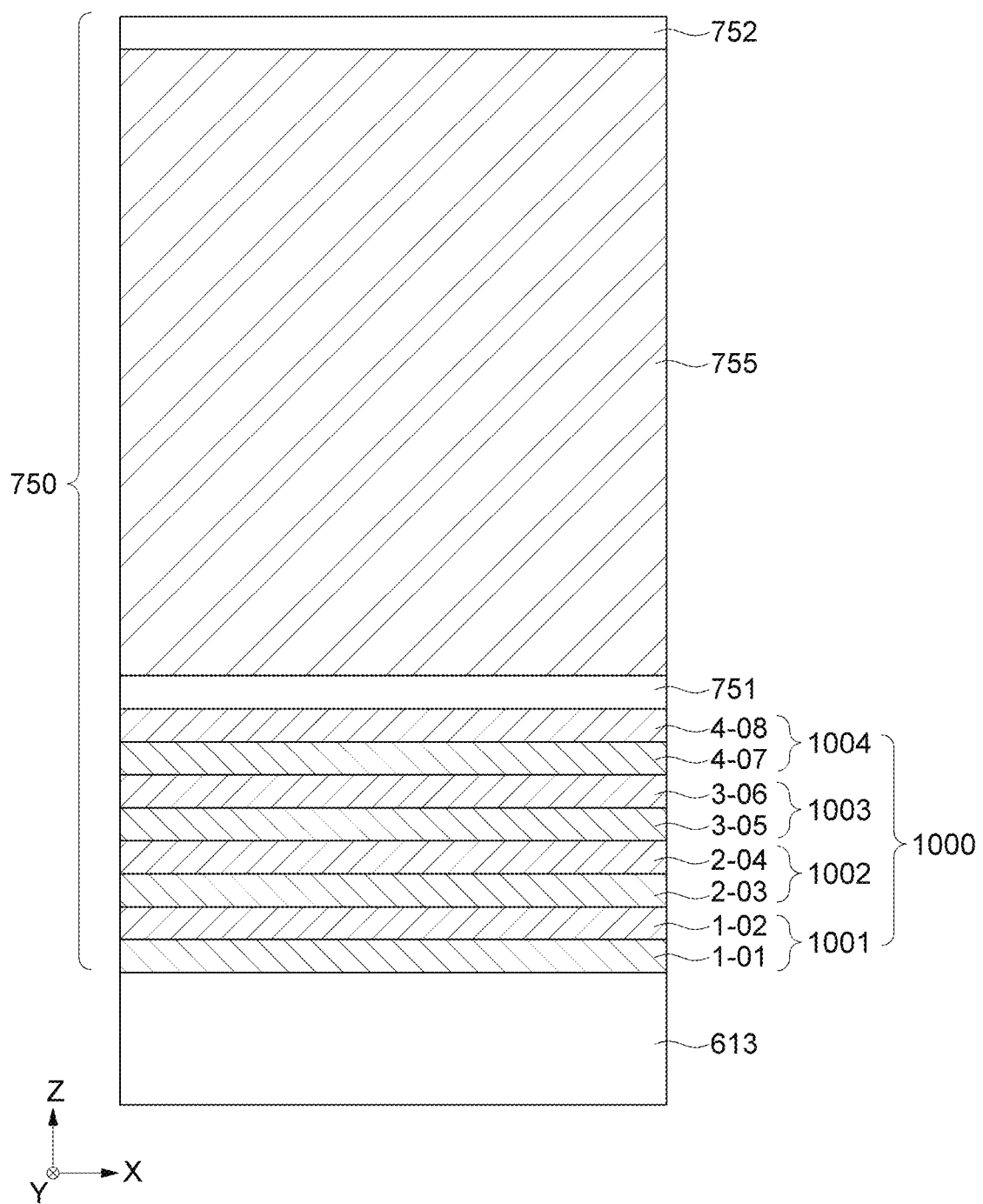
FIG. 12 is a view enlarging a portion A of another exemplary embodiment of FIG. 9.

FIG. 12 is a view enlarging a portion A of FIG. 9 according to another exemplary embodiment.

A sealing unit 750 may include a lower inorganic layer 751, an organic layer 755, an upper inorganic layer 752, and a plurality of composite inorganic layers 1000, as illustrated in FIG. 12. In an exemplary embodiment, the composite inorganic layers 1000 may include a first composite inorganic layer 1001, a second composite inorganic layer 1002, a third composite inorganic layer 1003, and a fourth composite inorganic layer 1004, for example.

The first composite inorganic layer 1001 may be located on a common electrode 613. In an exemplary embodiment, the first composite inorganic layer 1001 may be located between the common electrode 613 and the second composite inorganic layer 1002, for example.

The second composite inorganic layer 1002 may be located on the first composite inorganic layer 1001. In an exemplary embodiment, the second composite inorganic layer 1002 may be located between the first composite inorganic layer 1001 and the third composite inorganic layer 1003, for example.

The third composite inorganic layer 1003 may be located on the second composite inorganic layer 1002. In an exemplary embodiment, the third composite inorganic layer 1003 may be located between the second composite inorganic layer 1002 and the fourth composite inorganic layer 1004, for example.

The fourth composite inorganic layer 1004 may be located on the third composite inorganic layer 1003. In an exemplary embodiment, the fourth composite inorganic layer 1004 may be located between the third composite inorganic layer 1003 and the lower inorganic layer 751, for example.

The first composite inorganic layer 1001 may include a first inorganic layer 1-01 and a second inorganic layer 1-02 located on the first inorganic layer 1-01. In an exemplary embodiment, the first inorganic layer 1-01 may be located on the common electrode 613 and the second inorganic layer 1-02, and the second inorganic layer 1-02 may be located between the first inorganic layer 1-01 and the second composite inorganic layer 1002, for example. The first inorganic layer 1-01 and the second inorganic layer 1-02 may contact each other.

The second composite inorganic layer 1002 may include a third inorganic layer 2-03 and a fourth inorganic layer 2-04 located on the third inorganic layer 2-03. In an exemplary embodiment, the third inorganic layer 2-03 may be located between the second inorganic layer 1-02 and the fourth inorganic layer 2-04, and the fourth inorganic layer 2-04 may be located between the third inorganic layer 2-03 and the third composite inorganic layer 1003, for example. The third inorganic layer 2-03 and the fourth inorganic layer 2-04 may contact each other.

The third composite inorganic layer 1003 may include a fifth inorganic layer 3-05 and a sixth inorganic layer 3-06 located on the fifth inorganic layer 3-05. In an exemplary embodiment, the fifth inorganic layer 3-05 may be located between the fourth inorganic layer 2-04 and the sixth inorganic layer 3-06, and the sixth inorganic layer 3-06 may be located between the fifth inorganic layer 3-05 and the fourth composite inorganic layer 1004, for example. The fifth inorganic layer 3-05 and the sixth inorganic layer 3-06 may contact each other.

The fourth composite inorganic layer 1004 may include a seventh inorganic layer 4-07 and an eighth inorganic layer 4-08 located on the seventh inorganic layer 4-07. In an exemplary embodiment, the seventh inorganic layer 4-07 may be located between the sixth inorganic layer 3-06 and the eighth inorganic layer 4-08, and the eighth inorganic layer 4-08 may be located between the seventh inorganic layer 4-07 and the lower inorganic layer 751, for example. The seventh inorganic layer 4-07 and the eighth inorganic layer 4-08 may contact each other.

The first inorganic layer 1-01 has a refractive index different from a refractive index of the second inorganic layer 1-02. In an exemplary embodiment, the refractive index of the first inorganic layer 1-01 may be higher than the refractive index of the second inorganic layer 1-02, for example. The first inorganic layer 1-01 may include a material having a relatively high refractive index, and the second inorganic layer 1-02 may include a material having a relatively low refractive index.

In an exemplary embodiment, for example, the first inorganic layer 1-01 and the second inorganic layer 1-02 may include one of inorganic materials such as $TiO_2$, $SiN_x$, $AlO_x$, and $SiO_x$. As a more specific example, the first inorganic layer 1-01 may include $TiO_2$, and the second inorganic layer 1-02 may include any one of $SiN_x$, $AlO_x$, and $SiO_x$ which have a refractive index lower than that of $TiO_2$.

A difference between the refractive index of the first inorganic layer 1-01 and the refractive index of the second inorganic layer 1-02 may be about 0.4 or more. In an exemplary embodiment, the first inorganic layer 1-01 may include $TiO_2$, and the second inorganic layer 1-02 may include $SiO_x$, for example. Since $TiO_2$ has a refractive index of about 2.288 and $SiO_x$ has a refractive index in a range from about 1.833 to about 1.882, the first inorganic layer 1-01 and the second inorganic layer 1-02 which include these materials may have a refractive index difference in a range from about 0.406 to about 0.455, for example.

In an exemplary embodiment, the refractive index of the second inorganic layer 1-02 may be higher than the refractive index of the first inorganic layer 1-01. In such an exemplary embodiment, the second inorganic layer 1-02 may include $TiO_2$, and the first inorganic layer 1-01 may include any one of $SiN_x$, $AlO_x$, and $SiO_x$ which have a refractive index lower than that of $TiO_2$.

The third inorganic layer 2-03 has a refractive index different from a refractive index of the fourth inorganic layer 2-04. In an exemplary embodiment, the refractive index of the third inorganic layer 2-03 may be higher than the refractive index of the fourth inorganic layer 2-04, for example. The third inorganic layer 2-03 may include a material having a relatively high refractive index, and the fourth inorganic layer 2-04 may include a material having a relatively low refractive index. In an exemplary embodiment, the refractive index of the fourth inorganic layer 2-04 may be higher than the refractive index of the third inorganic layer 2-03.

The third inorganic layer 2-03 may include a material substantially the same as a material included in the first inorganic layer 1-01 described above, and the fourth inorganic layer 2-04 may include a material substantially the same as a material included in the second inorganic layer 1-02.

The fifth inorganic layer 3-05 has a refractive index different from a refractive index of the sixth inorganic layer 3-06. In an exemplary embodiment, the refractive index of the fifth inorganic layer 3-05 may be higher than the refractive index of the sixth inorganic layer 3-06, for example. The fifth inorganic layer 3-05 may include a material having a relatively high refractive index, and the sixth inorganic layer 3-06 may include a material having a relatively low refractive index. In an exemplary embodiment, the refractive index of the sixth inorganic layer 3-06 may be higher than the refractive index of the fifth inorganic layer 3-05.

The fifth inorganic layer 3-05 may include a material substantially the same as a material included in the first inorganic layer 1-01 described above, and the sixth inorganic layer 3-06 may include a material substantially the same as a material included in the second inorganic layer 1-02 described above.

The seventh inorganic layer 4-07 has a refractive index different from a refractive index of the eighth inorganic layer 4-08. In an exemplary embodiment, the refractive index of the seventh inorganic layer 4-07 may be higher than the refractive index of the eighth inorganic layer 4-08, for example. The seventh inorganic layer 4-07 may include a material having a relatively high refractive index, and the eighth inorganic layer 4-08 may include a material having a relatively low refractive index. In an exemplary embodiment, for example, the refractive index of the eighth inorganic layer 4-08 may be higher than the refractive index of the seventh inorganic layer 4-07.

The seventh inorganic layer 4-07 may include a material substantially the same as a material included in the first inorganic layer 1-01 described above, and the eighth inorganic layer 4-08 may include a material substantially the same as a material included in the second inorganic layer 1-02 described above.

Figure 13:
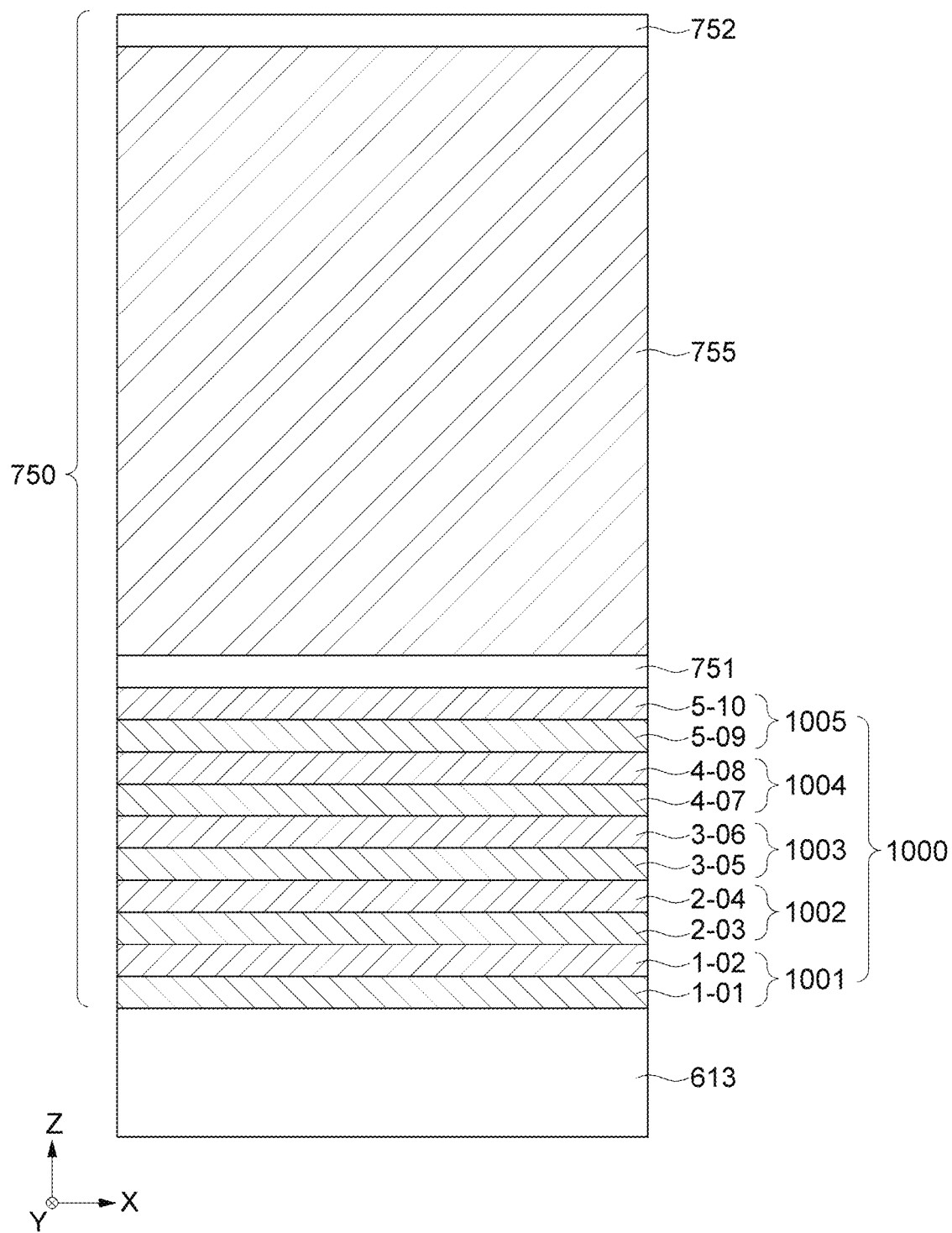
FIG. 13 is a view enlarging a portion A of another exemplary embodiment of FIG. 9.

FIG. 13 is a view enlarging a portion A of FIG. 9 according to another exemplary embodiment.

A sealing unit 750 may include a lower inorganic layer 751, an organic layer 755, an upper inorganic layer 752, and a plurality of composite inorganic layers 1000, as illustrated in FIG. 13. In an exemplary embodiment, the composite inorganic layers 1000 may include a first composite inorganic layer 1001, a second composite inorganic layer 1002, a third composite inorganic layer 1003, a fourth composite inorganic layer 1004, and a fifth composite inorganic layer 1005, for example.

The first composite inorganic layer 1001, the second composite inorganic layer 1002, the third composite inorganic layer 1003, and the fourth composite inorganic layer 1004 illustrated in FIG. 13 are substantially the same as the first composite inorganic layer 1001, the second composite inorganic layer 1002, the third composite inorganic layer 1003, and the fourth composite inorganic layer 1004 illustrated in FIG. 12, respectively. However, the fourth composite inorganic layer 1004 of FIG. 13 is located between the third composite inorganic layer 1003 and the fifth composite inorganic layer 1005.

The fifth composite inorganic layer 1005 may be located on the fourth composite inorganic layer 1004. In an exemplary embodiment, the fifth composite inorganic layer 1005 may be located between the fourth composite inorganic layer 1004 and the lower inorganic layer 751, for example.

The fifth composite inorganic layer 1005 may include a ninth inorganic layer 5-09 and a tenth inorganic layer 5-10 located on the ninth inorganic layer 5-09. In an exemplary embodiment, the ninth inorganic layer 5-09 may be located between the eighth inorganic layer 4-08 and the tenth inorganic layer 5-10, and the tenth inorganic layer 5-10 may be located between the ninth inorganic layer 5-09 and the lower inorganic layer 751, for example. The ninth inorganic layer 5-09 and the tenth inorganic layer 5-10 may contact each other.

The ninth inorganic layer 5-09 has a refractive index different from a refractive index of the tenth inorganic layer 5-10. In an exemplary embodiment, the refractive index of the ninth inorganic layer 5-09 may be higher than the refractive index of the tenth inorganic layer 5-10, for example. The ninth inorganic layer 5-09 may include a material having a relatively high refractive index, and the tenth inorganic layer 5-10 may include a material having a relatively low refractive index. In an exemplary embodiment, the refractive index of the tenth inorganic layer 5-10 may be higher than the refractive index of the ninth inorganic layer 5-09.

The ninth inorganic layer 5-09 may include a material substantially the same as a material included in the first inorganic layer 1-01 described above, and the tenth inorganic layer 5-10 may include a material substantially the same as a material included in the second inorganic layer 1-02 described above.

Figure 14:
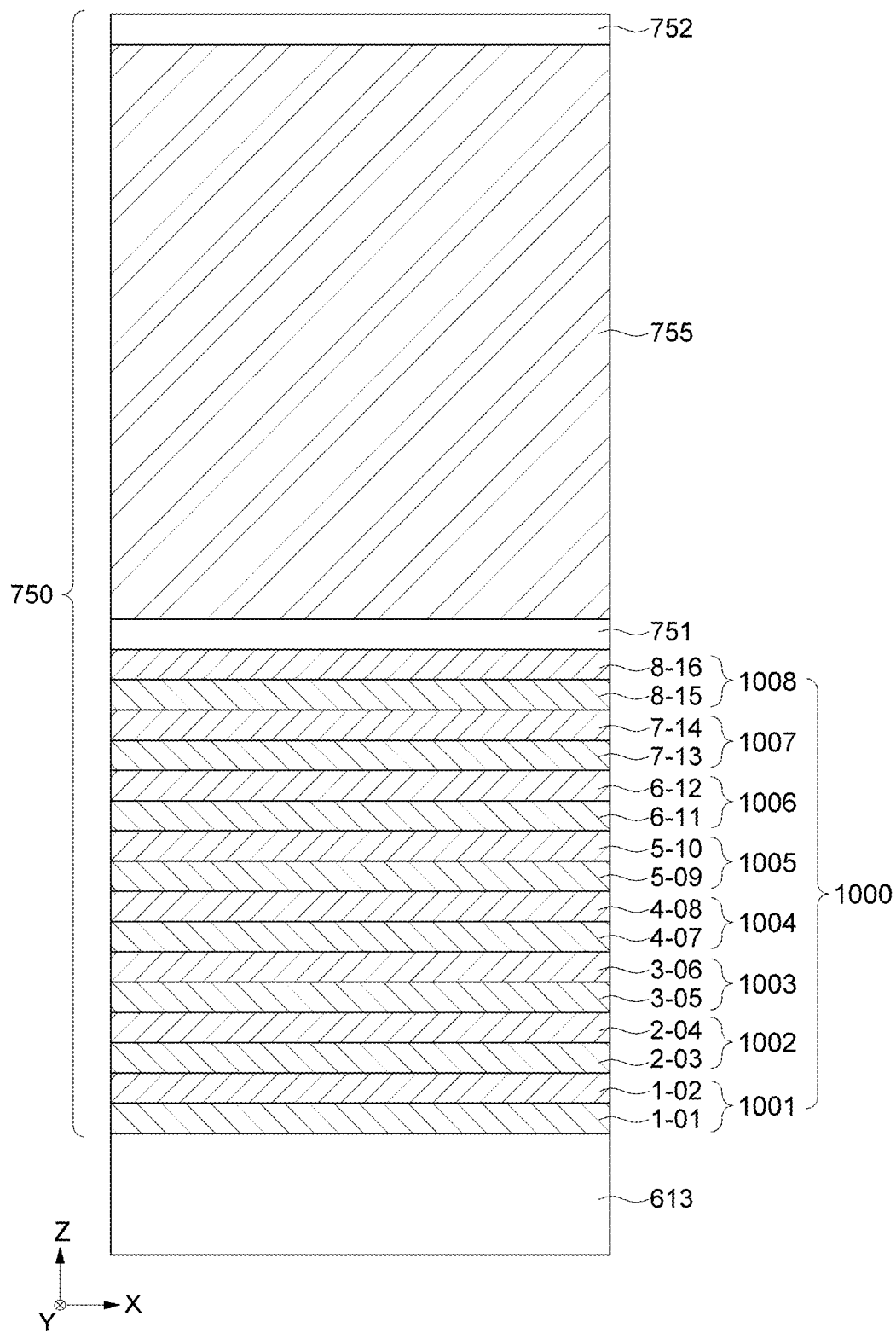
FIG. 14 is a view enlarging a portion A of another exemplary embodiment of FIG. 9.

FIG. 14 is a view enlarging a portion A of FIG. 9 according to another exemplary embodiment.

A sealing unit 750 may include a lower inorganic layer 751, an organic layer 755, an upper inorganic layer 752, and a plurality of composite inorganic layers 1000, as illustrated in FIG. 14. In an exemplary embodiment, the composite inorganic layers 1000 may include a first composite inorganic layer 1001, a second composite inorganic layer 1002, a third composite inorganic layer 1003, a fourth composite inorganic layer 1004, a fifth composite inorganic layer 1005, a sixth composite inorganic layer 1006, a seventh composite inorganic layer 1007, and an eighth composite inorganic layer 1008, for example.

The first composite inorganic layer 1001, the second composite inorganic layer 1002, the third composite inorganic layer 1003, and the fourth composite inorganic layer 1004 illustrated in FIG. 14 are substantially the same as the first composite inorganic layer 1001, the second composite inorganic layer 1002, the third composite inorganic layer 1003, and the fourth composite inorganic layer 1004 illustrated in FIG. 12, respectively. However, the fourth composite inorganic layer 1004 of FIG. 14 is located between the third composite inorganic layer 1003 and the fifth composite inorganic layer 1005.

The fifth composite inorganic layer 1005 of FIG. 14 is substantially the same as the fifth composite inorganic layer 1005 of FIG. 13 described above. However, the fifth composite inorganic layer 1005 of FIG. 14 is located between the fourth composite inorganic layer 1004 and the sixth composite inorganic layer 1006.

The sixth composite inorganic layer 1006 may be located on the fifth composite inorganic layer 1005. In an exemplary embodiment, the sixth composite inorganic layer 1006 may be located between the fifth composite inorganic layer 1005 and the seventh composite inorganic layer 1007, for example.

The seventh composite inorganic layer 1007 may be located on the sixth composite inorganic layer 1006. In an exemplary embodiment, the seventh composite inorganic layer 1007 may be located between the sixth composite inorganic layer 1006 and the eighth composite inorganic layer 1008, for example.

The eighth composite inorganic layer 1008 may be located on the seventh composite inorganic layer 1007. In an exemplary embodiment, the eighth composite inorganic layer 1008 may be located between the seventh composite inorganic layer 1007 and the lower inorganic layer 751, for example.

The sixth composite inorganic layer 1006 may include an eleventh inorganic layer 6-11 and a twelfth inorganic layer 6-12 located on the eleventh inorganic layer 6-11. In an exemplary embodiment, the eleventh inorganic layer 6-11 may be located between the tenth inorganic layer 5-10 and the twelfth inorganic layer 6-12, and the twelfth inorganic layer 6-12 may be located between the eleventh inorganic layer 6-11 and the seventh composite inorganic layer 1007, for example. The eleventh inorganic layer 6-11 and the twelfth inorganic layer 6-12 may contact each other.

The seventh composite inorganic layer 1007 may include a thirteenth inorganic layer 7-13 and a fourteenth inorganic layer 7-14 located on the thirteenth inorganic layer 7-13. In an exemplary embodiment, the thirteenth inorganic layer 7-13 may be located between the twelfth inorganic layer 6-12 and the fourteenth inorganic layer 7-14, and the fourteenth inorganic layer 7-14 may be located between the thirteenth inorganic layer 7-13 and the eighth composite inorganic layer 1008, for example. The thirteenth inorganic layer 7-13 and the fourteenth inorganic layer 7-14 may contact each other.

The eighth composite inorganic layer 1008 may include a fifteenth inorganic layer 8-15 and a sixteenth inorganic layer 8-16 located on the fifteenth inorganic layer 8-15. In an exemplary embodiment, the fifteenth inorganic layer 8-15 may be located between the fourteenth inorganic layer 7-14 and the sixteenth inorganic layer 8-16, and the sixteenth inorganic layer 8-16 may be located between the fifteenth inorganic layer 8-15 and the lower inorganic layer 751, for example. The fifteenth inorganic layer 8-15 and the sixteenth inorganic layer 8-16 may contact each other.

The eleventh inorganic layer 6-11 has a refractive index different from a refractive index of the twelfth inorganic layer 6-12. In an exemplary embodiment, the refractive index of the eleventh inorganic layer 6-11 may be higher than the refractive index of the twelfth inorganic layer 6-12, for example. The eleventh inorganic layer 6-11 may include a material having a relatively high refractive index, and the twelfth inorganic layer 6-12 may include a material having a relatively low refractive index. In an exemplary embodiment, the refractive index of the twelfth inorganic layer 6-12 may be higher than the refractive index of the eleventh inorganic layer 6-11.

The eleventh inorganic layer 6-11 may include a material substantially the same as a material included in the first inorganic layer 1-01 described above, and the twelfth inorganic layer 6-12 may include a material substantially the same as a material included in the second inorganic layer 1-02 described above.

The thirteenth inorganic layer 7-13 has a refractive index different from a refractive index of the fourteenth inorganic layer 7-14. In an exemplary embodiment, the refractive index of the thirteenth inorganic layer 7-13 may be higher than the refractive index of the fourteenth inorganic layer 7-14, for example. The thirteenth inorganic layer 7-13 may include a material having a relatively high refractive index, and the fourteenth inorganic layer 7-14 may include a material having a relatively low refractive index. In an exemplary embodiment, the refractive index of the fourteenth inorganic layer 7-14 may be higher than the refractive index of the thirteenth inorganic layer 7-13.

The thirteenth inorganic layer 7-13 may include a material substantially the same as a material included in the first inorganic layer 1-01 described above, and the fourteenth inorganic layer 7-14 may include a material substantially the same as a material included in the second inorganic layer 1-02 described above.

The fifteenth inorganic layer 8-15 has a refractive index different from a refractive index of the sixteenth inorganic layer 8-16. In an exemplary embodiment, the refractive index of the fifteenth inorganic layer 8-15 may be higher than the refractive index of the sixteenth inorganic layer 8-16, for example. The fifteenth inorganic layer 8-15 may include a material having a relatively high refractive index, and the sixteenth inorganic layer 8-16 may include a material having a relatively low refractive index. In an exemplary embodiment, the refractive index of the sixteenth inorganic layer 8-16 may be higher than the refractive index of the fifteenth inorganic layer 8-15.

The fifteenth inorganic layer 8-15 may include a material substantially the same as a material included in the first inorganic layer 1-01 described above, and the sixteenth inorganic layer 8-16 may include a material substantially the same as a material included in the second inorganic layer 1-02 described above.

Figure 15:
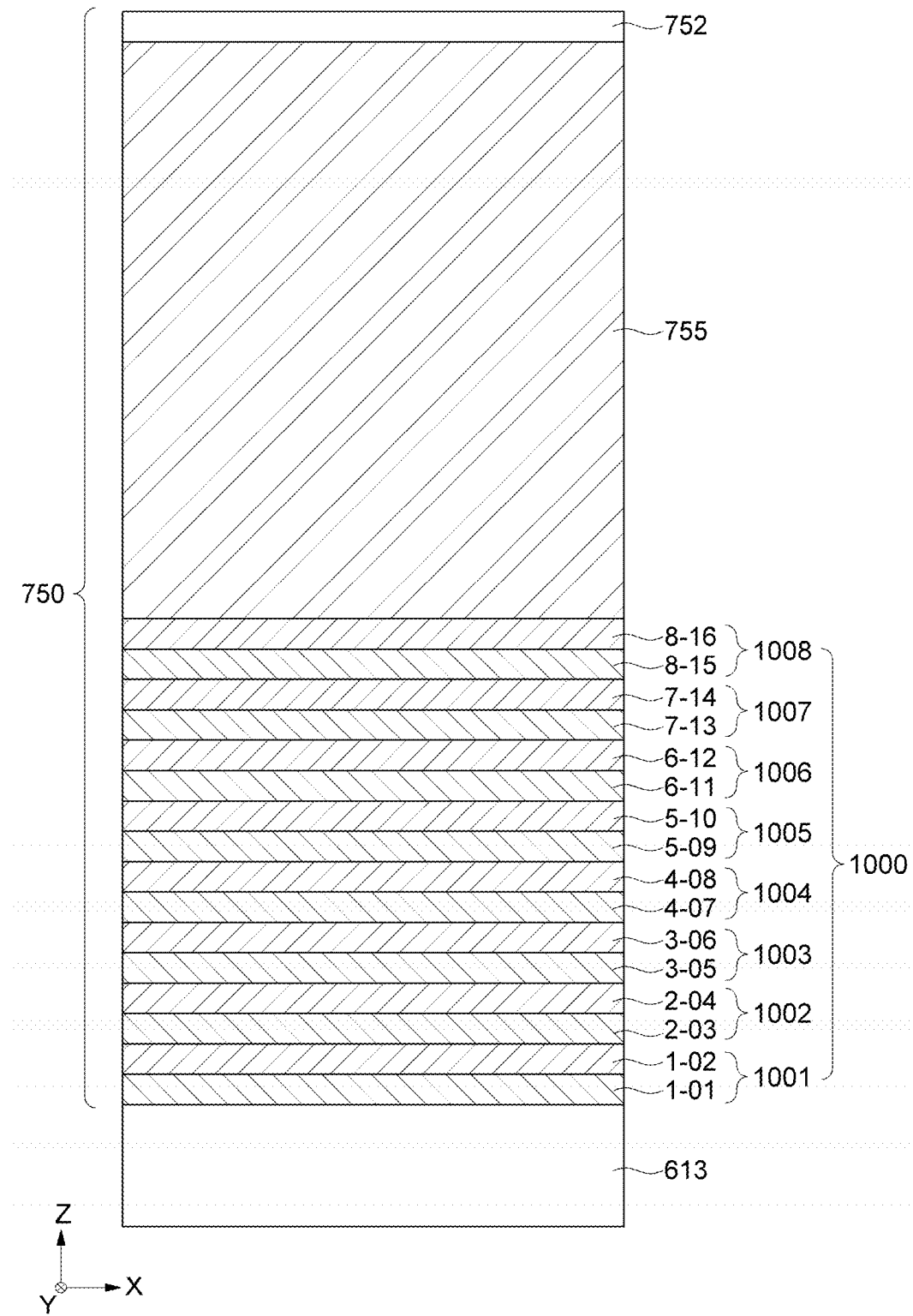
FIG. 15 is a view enlarging a portion A of another exemplary embodiment of FIG. 9.

FIG. 15 is a view enlarging a portion A of FIG. 9 according to another exemplary embodiment.

A sealing unit 750 may include an organic layer 755, an upper inorganic layer 752, and a plurality of composite inorganic layers 1000, as illustrated in FIG. 15. In an exemplary embodiment, the plurality of composite inorganic layers 1000 may include a first composite inorganic layer 1001, a second composite inorganic layer 1002, a third composite inorganic layer 1003, a fourth composite inorganic layer 1004, a fifth composite inorganic layer 1005, a sixth composite inorganic layer 1006, a seventh composite inorganic layer 1007, and an eighth composite inorganic layer 1008, for example.

The sealing unit 750 of FIG. 15 does not include a lower inorganic layer 751, dissimilar to the sealing unit 750 of FIG. 14 described above.

The organic layer 755, the upper inorganic layer 752, and the first to eighth composite inorganic layers 1001 to 1008 of FIG. 15 are substantially the same as the organic layer 755, the upper inorganic layer 752, and the first to eighth composite inorganic layers 1001 to 1008 of FIG. 14 described above, respectively. However, the eighth composite inorganic layer 1008 of FIG. 15 may be located between the seventh composite inorganic layer 1007 and the organic layer 755.

Figure 16:
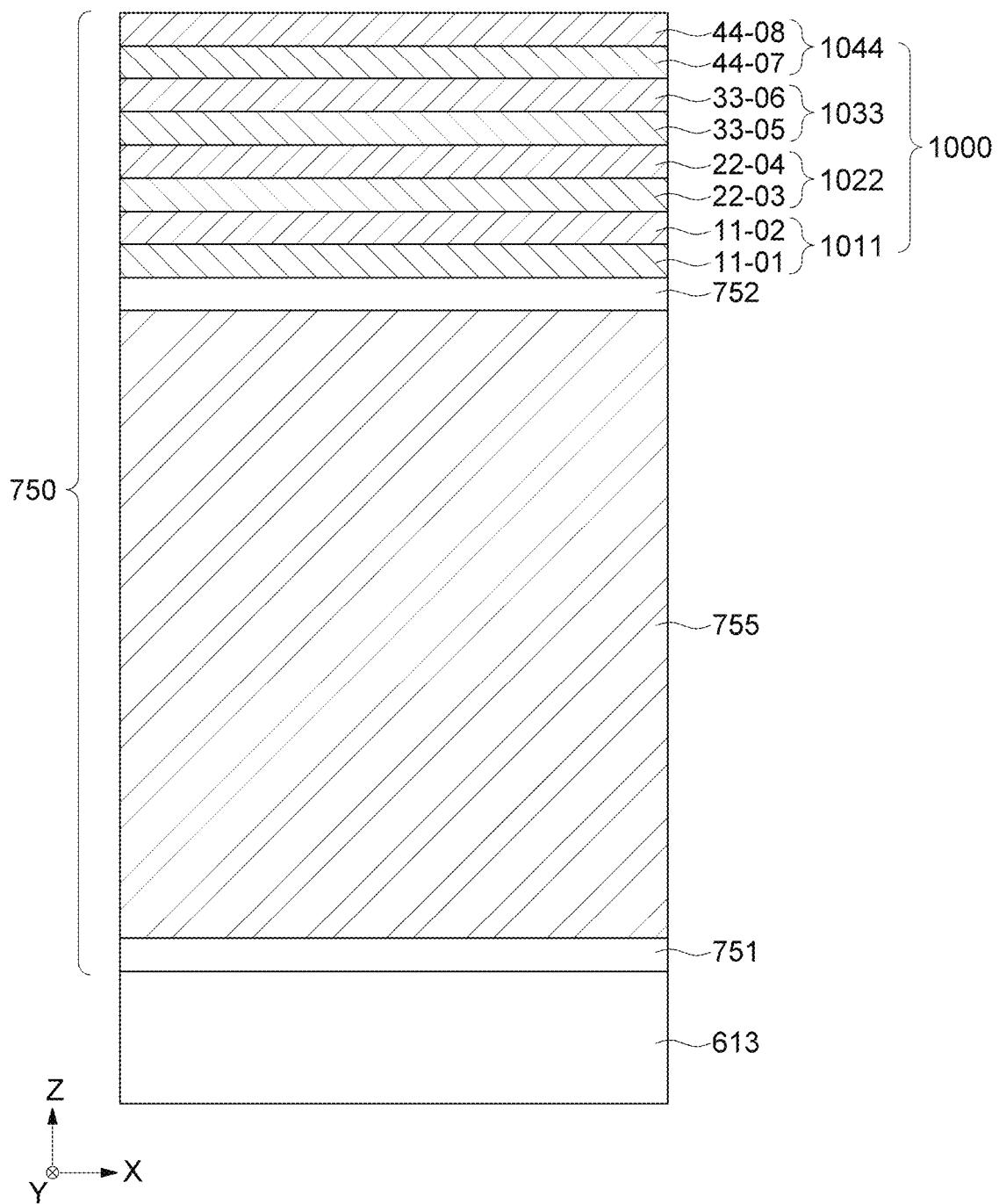
FIG. 16 is a view enlarging a portion A of another exemplary embodiment of FIG. 9.

FIG. 16 is a view enlarging a portion A of FIG. 9 according to another exemplary embodiment.

A sealing unit 750 may include a lower inorganic layer 751, an organic layer 755, an upper inorganic layer 752, and a plurality of composite inorganic layers 1000, as illustrated in FIG. 16. In an exemplary embodiment, the composite inorganic layers 1000 may include a first composite inorganic layer 1011, a second composite inorganic layer 1022, a third composite inorganic layer 1033, and a fourth composite inorganic layer 1044, for example.

The first composite inorganic layer 1011 may be located on the upper inorganic layer 752. In an exemplary embodiment, the first composite inorganic layer 1011 may be located between the upper inorganic layer 752 and the second composite inorganic layer 1022, for example.

The second composite inorganic layer 1022 may be located on the first composite inorganic layer 1011. In an exemplary embodiment, the second composite inorganic layer 1022 may be located between the first composite inorganic layer 1011 and the third composite inorganic layer 1033, for example.

The third composite inorganic layer 1033 may be located on the second composite inorganic layer 1022. In an exemplary embodiment, the third composite inorganic layer 1033 may be located between the second composite inorganic layer 1022 and the fourth composite inorganic layer 1044, for example.

The fourth composite inorganic layer 1044 may be located on the third composite inorganic layer 1033.

The first composite inorganic layer 1011 may include a first inorganic layer 11-01 and a second inorganic layer 11-02 located on the first inorganic layer 11-01. In an exemplary embodiment, the first inorganic layer 11-01 may be located between the upper inorganic layer 752 and the second inorganic layer 11-02, and the second inorganic layer 11-02 may be located between the first inorganic layer 11-01 and the second composite inorganic layer 1022, for example. The first inorganic layer 11-01 and the second inorganic layer 11-02 may contact each other.

The second composite inorganic layer 1022 may include a third inorganic layer 22-03 and a fourth inorganic layer 22-04 located on the third inorganic layer 22-03. In an exemplary embodiment, the third inorganic layer 22-03 may be located between the second inorganic layer 11-02 and the fourth inorganic layer 22-04, and the fourth inorganic layer 22-04 may be located between the third inorganic layer 22-03 and the third composite inorganic layer 1033, for example. The third inorganic layer 22-03 and the fourth inorganic layer 22-04 may contact each other.

The third composite inorganic layer 1033 may include a fifth inorganic layer 33-05 and a sixth inorganic layer 33-06 located on the fifth inorganic layer 33-05. In an exemplary embodiment, the fifth inorganic layer 33-05 may be located between the fourth inorganic layer 22-04 and the sixth inorganic layer 33-06, and the sixth inorganic layer 33-06 may be located between the fifth inorganic layer 33-05 and the fourth composite inorganic layer 1044, for example. The fifth inorganic layer 33-05 and the sixth inorganic layer 33-06 may contact each other.

The fourth composite inorganic layer 1044 may include a seventh inorganic layer 44-07 and an eighth inorganic layer 44-08 located on the seventh inorganic layer 44-07. In an exemplary embodiment, the seventh inorganic layer 44-07 may be located between the sixth inorganic layer 33-06 and the eighth inorganic layer 44-08, and the eighth inorganic layer 44-08 may be located on the seventh inorganic layer 44-07, for example. The seventh inorganic layer 44-07 and the eighth inorganic layer 44-08 may contact each other.

The first inorganic layer 11-01 has a refractive index different from a refractive index of the second inorganic layer 11-02. In an exemplary embodiment, the refractive index of the first inorganic layer 11-01 may be higher than the refractive index of the second inorganic layer 11-02, for example. The first inorganic layer 11-01 may include a material having a relatively high refractive index, and the second inorganic layer 11-02 may include a material having a relatively low refractive index.

In an exemplary embodiment, for example, the first inorganic layer 11-01 and the second inorganic layer 11-02 may include one of inorganic materials such as $TiO_2$, $SiN_x$, $AlO_x$, and $SiO_x$. As a more specific example, the first inorganic layer 11-01 may include $TiO_2$, and the second inorganic layer 11-02 may include any one of $SiN_x$, $AlO_x$, and $SiO_x$ which have a refractive index lower than that of $TiO_2$.

A difference between the refractive index of the first inorganic layer 11-01 and the refractive index of the second inorganic layer 11-02 may be about 0.4 or more, for example. In an exemplary embodiment, the first inorganic layer 11-01 may include $TiO_2$, and the second inorganic layer 11-02 may include $SiO_x$, for example. Since $TiO_2$ has a refractive index of about 2.288, and $SiO_x$ has a refractive index in a range from about 1.833 to about 1.882, the first inorganic layer 11-01 and the second inorganic layer 11-02 which include these materials may have a refractive index difference in a range from about 0.406 to about 0.455, for example.

In an exemplary embodiment, the refractive index of the second inorganic layer 11-02 may be higher than the refractive index of the first inorganic layer 11-01. In such an exemplary embodiment, the second inorganic layer 11-02 may include $TiO_2$, and the first inorganic layer 11-01 may include any one of $SiN_x$, $AlO_x$, and $SiO_x$ which have a refractive index lower than that of $TiO_2$.

The third inorganic layer 22-03 has a refractive index different from a refractive index of the fourth inorganic layer 22-04. In an exemplary embodiment, the refractive index of the third inorganic layer 22-03 may be higher than the refractive index of the fourth inorganic layer 22-04, for example. The third inorganic layer 22-03 may include a material having a relatively high refractive index, and the fourth inorganic layer 22-04 may include a material having a relatively low refractive index. In an exemplary embodiment, the refractive index of the fourth inorganic layer 22-04 may be higher than the refractive index of the third inorganic layer 22-03.

The third inorganic layer 22-03 may include a material substantially the same as a material included in the first inorganic layer 11-01 described above, and the fourth inorganic layer 22-04 may include a material substantially the same as a material included in the second inorganic layer 11-02.

The fifth inorganic layer 33-05 has a refractive index different from a refractive index of the sixth inorganic layer 33-06. In an exemplary embodiment, the refractive index of the fifth inorganic layer 33-05 may be higher than the refractive index of the sixth inorganic layer 33-06, for example. The fifth inorganic layer 33-05 may include a material having a relatively high refractive index, and the sixth inorganic layer 33-06 may include a material having a relatively low refractive index. In an exemplary embodiment, the refractive index of the sixth inorganic layer 33-06 may be higher than the refractive index of the fifth inorganic layer 33-05.

The fifth inorganic layer 33-05 may include a material substantially the same as a material included in the first inorganic layer 11-01 described above, and the sixth inorganic layer 33-06 may include a material substantially the same as a material included in the second inorganic layer 11-02 described above.

The seventh inorganic layer 44-07 has a refractive index different from a refractive index of the eighth inorganic layer 44-08. In an exemplary embodiment, the refractive index of the seventh inorganic layer 44-07 may be higher than the refractive index of the eighth inorganic layer 44-08, for example. The seventh inorganic layer 44-07 may include a material having a relatively high refractive index, and the eighth inorganic layer 44-08 may include a material having a relatively low refractive index. In an exemplary embodiment, the refractive index of the eighth inorganic layer 44-08 may be higher than the refractive index of the seventh inorganic layer 44-07.

The seventh inorganic layer 44-07 may include a material substantially the same as a material included in the first inorganic layer 11-01 described above, and the eighth inorganic layer 44-08 may include a material substantially the same as a material included in the second inorganic layer 11-02 described above.

In another exemplary embodiments, the second to fourth composite inorganic layers 1022 to 1044 may be omitted in FIG. 16.

Figure 17:
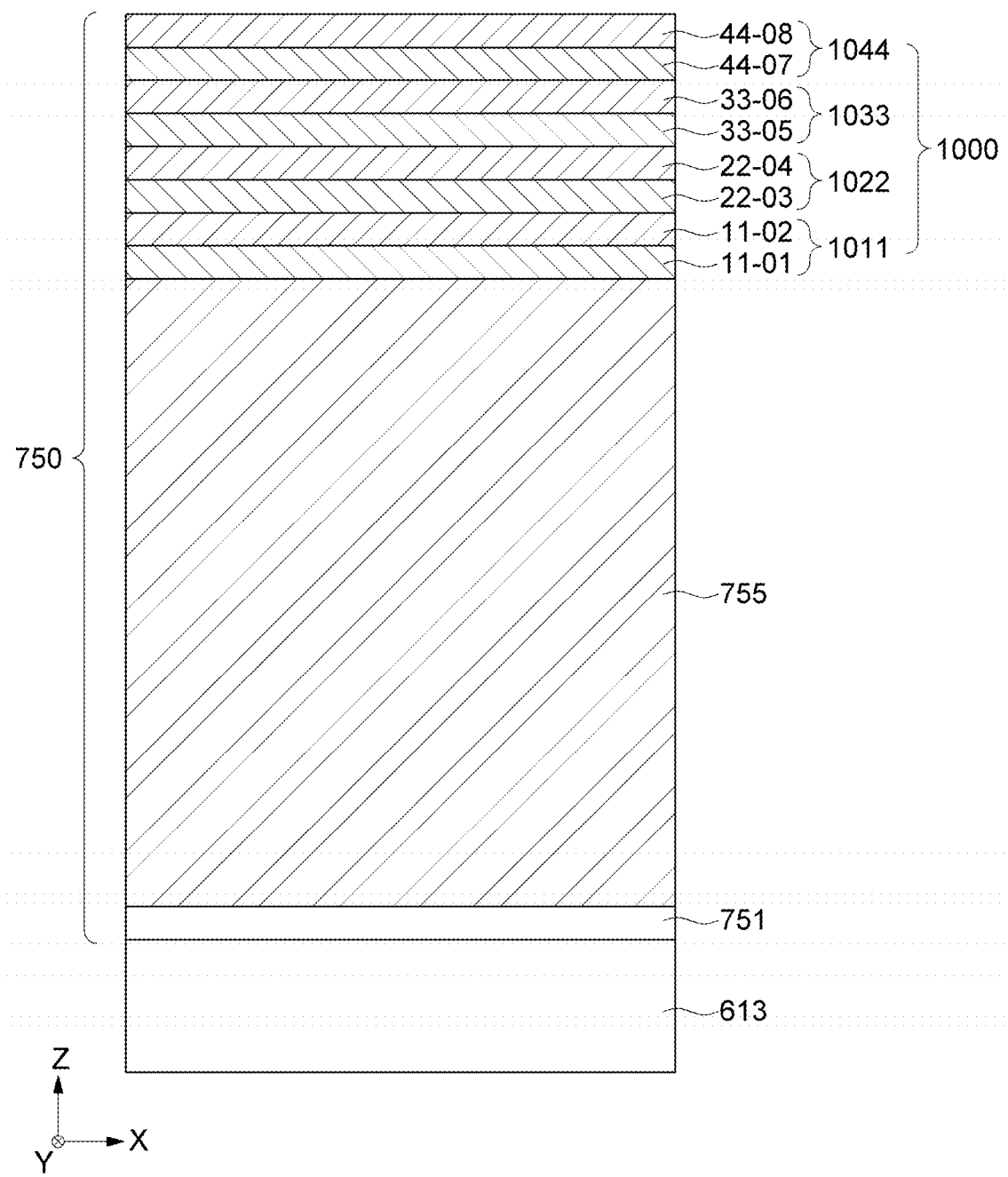
FIG. 17 is a view enlarging a portion A of another exemplary embodiment of FIG. 9.

FIG. 17 is a view enlarging a portion A of FIG. 9 according to another exemplary embodiment.

A sealing unit 750 may include a lower inorganic layer 751, an organic layer 755, and a plurality of composite inorganic layers 1000, as illustrated in FIG. 17. In an exemplary embodiment, the composite inorganic layers 1000 may include a first composite inorganic layer 1011, a second composite inorganic layer 1022, a third composite inorganic layer 1033, and a fourth composite inorganic layer 1044, for example.

The sealing unit 750 of FIG. 17, dissimilar to the sealing unit 750 of FIG. 16, does not include the upper inorganic layer 752.

The organic layer 755, the lower inorganic layer 751, and the first to fourth composite inorganic layers 1011 to 1044 in FIG. 17 are substantially the same as those in FIG. 16 described above. However, the first composite inorganic layer 1011 of FIG. 17 may be located between the organic layer 755 and the second composite inorganic layer 1022.

Figure 18:
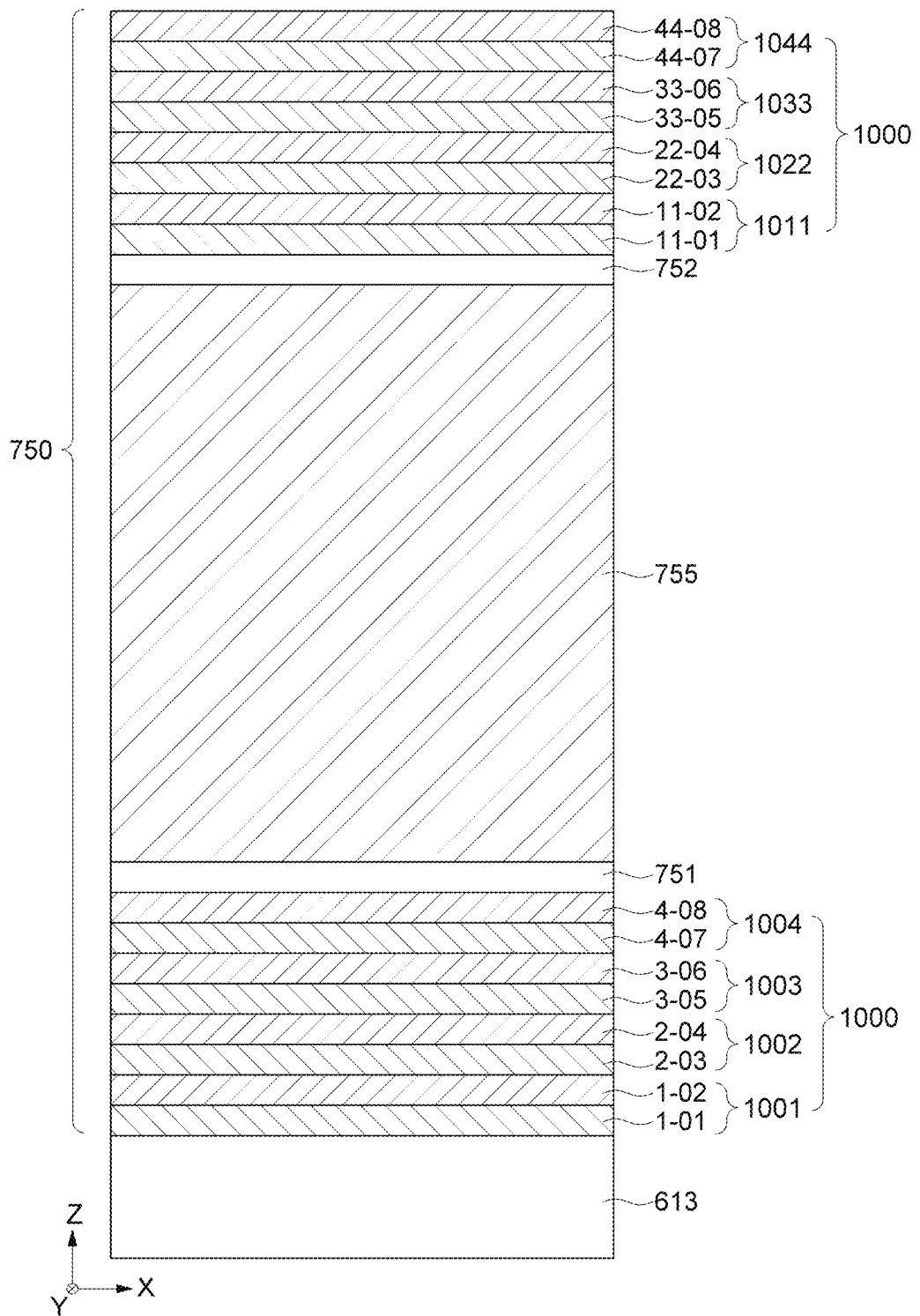
FIG. 18 is a view enlarging a portion A of another exemplary embodiment of FIG. 9.

FIG. 18 is a view enlarging a portion A of FIG. 9 according to another exemplary embodiment.

A sealing unit 750 may include a lower inorganic layer 751, an organic layer 755, an upper inorganic layer 752, and a plurality of composite inorganic layers 1000, as illustrated in FIG. 18. In an exemplary embodiment, the composite inorganic layers 1000 may include a first lower composite inorganic layer 1001, a second lower composite inorganic layer 1002, a third lower composite inorganic layer 1003, a fourth lower composite inorganic layer 1004, a first upper composite inorganic layer 1011, a second upper composite inorganic layer 1022, a third upper composite inorganic layer 1033, and a fourth upper composite inorganic layer 1044, for example.

The first lower composite inorganic layer 1001, the second lower composite inorganic layer 1002, the third lower composite inorganic layer 1003, and the fourth lower composite inorganic layer 1004 of FIG. 18 are substantially the same as the first composite inorganic layer 1001, the second composite inorganic layer 1002, the third composite inorganic layer 1003, and the fourth composite inorganic layer 1004 of FIG. 12 described above, respectively.

The first upper composite inorganic layer 1011, the second upper composite inorganic layer 1022, the third upper composite inorganic layer 1033, and the fourth upper composite inorganic layer 1044 of FIG. 18 are substantially the same as the first composite inorganic layer 1011, the second composite inorganic layer 1022, the third composite inorganic layer 1033, and the fourth composite inorganic layer 1044 of FIG. 16 described above, respectively.

Figure 19:
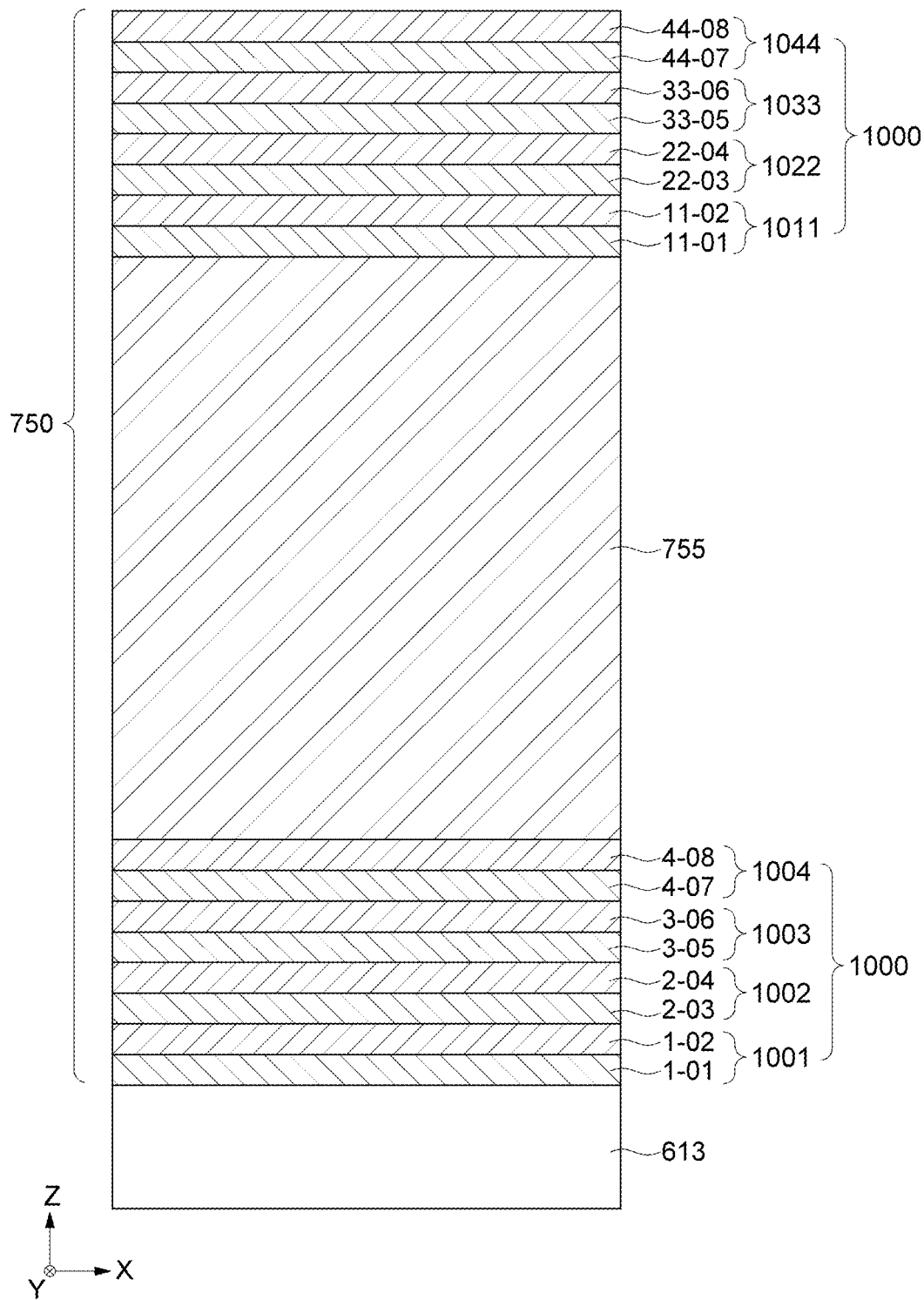
FIG. 19 is a view enlarging a portion A of another exemplary embodiment of FIG. 9.

FIG. 19 is a view enlarging a portion A of FIG. 9 according to another exemplary embodiment.

A sealing unit 750 may include an organic layer 755 and a plurality of composite inorganic layers 1000, as illustrated in FIG. 19. In an exemplary embodiment, the composite inorganic layers 1000 may include a first lower composite inorganic layer 1001, a second lower composite inorganic layer 1002, a third lower composite inorganic layer 1003, a fourth lower composite inorganic layer 1004, a first upper composite inorganic layer 1011, a second upper composite inorganic layer 1022, a third upper composite inorganic layer 1033, and a fourth upper composite inorganic layer 1044, for example.

The sealing unit 750 of FIG. 19, dissimilar to the sealing unit 750 of FIG. 18, does not include the lower inorganic layer 751 and the upper inorganic layer 752.

The organic layer 755, the first to fourth lower composite inorganic layers 1001 to 1004, and the first to fourth upper composite inorganic layers 1011 to 1044 of FIG. 19 are substantially the same as the organic layer 755, the first to fourth lower composite inorganic layers 1001 to 1004, and the first to fourth upper composite inorganic layers 1011 to 1044 of FIG. 18, respectively. However, the fourth lower composite inorganic layer 1004 of FIG. 19 may be located between the third lower composite inorganic layer 1003 and the organic layer 755, and the first upper composite inorganic layer 1011 of FIG. 19 may be located between the organic layer 755 and the second upper composite inorganic layer 1022.

Figure 20:
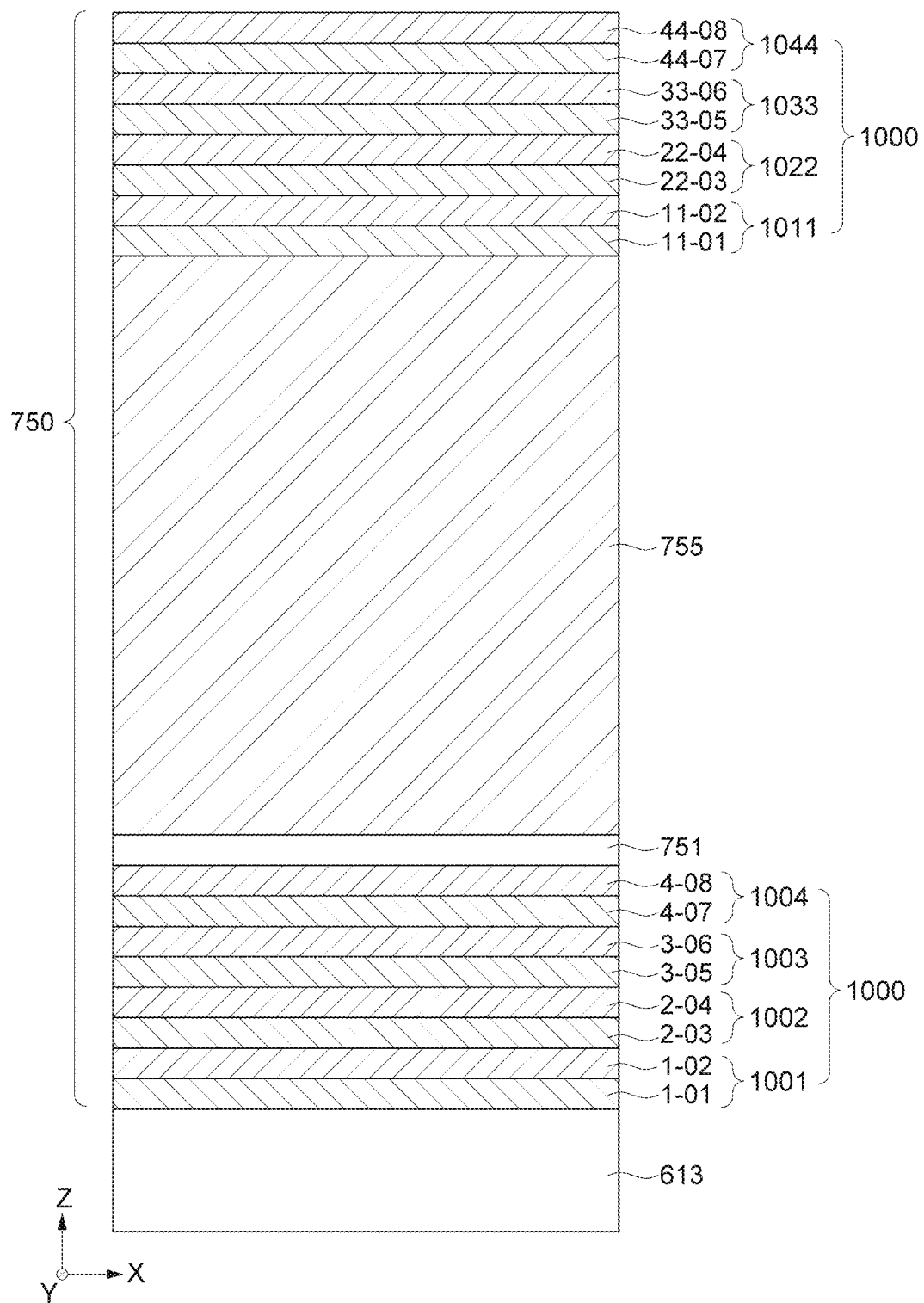
FIG. 20 is a view enlarging a portion A of another exemplary embodiment of FIG. 9.

FIG. 20 is a view enlarging a portion A of FIG. 9 according to another exemplary embodiment.

A sealing unit 750 may include an organic layer 755, a lower inorganic layer 751, and a plurality of composite inorganic layers 1000, as illustrated in FIG. 20. In an exemplary embodiment, the composite inorganic layers 1000 may include a first lower composite inorganic layer 1001, a second lower composite inorganic layer 1002, a third lower composite inorganic layer 1003, a fourth lower composite inorganic layer 1004, a first upper composite inorganic layer 1011, a second upper composite inorganic layer 1022, a third upper composite inorganic layer 1033, and a fourth upper composite inorganic layer 1044, for example.

The sealing unit 750 of FIG. 20, dissimilar to the sealing unit 750 of FIG. 18, does not include the upper inorganic layer 752.

The organic layer 755, the lower inorganic layer 751, the first to fourth lower composite inorganic layers 1001 to 1004, and the first to fourth upper composite inorganic layers 1011 to 1044 of FIG. 20 are substantially the same as those of FIG. 18, respectively. However, the first upper composite inorganic layer 1011 of FIG. 20 may be located between the organic layer 755 and the second upper composite inorganic layer 1022.

Figure 21:
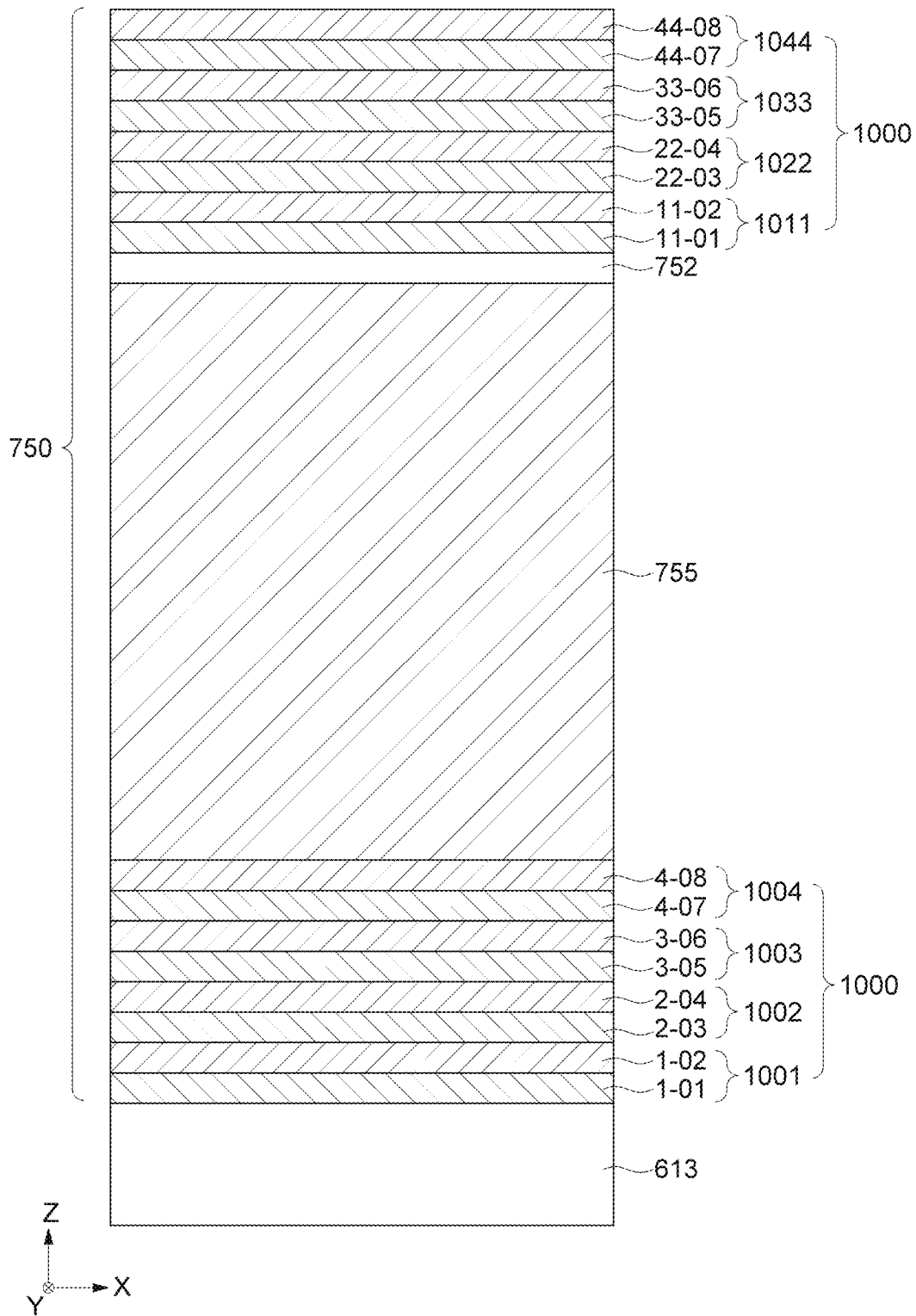
FIG. 21 is a view enlarging a portion A of another exemplary embodiment of FIG. 9.

FIG. 21 is a view enlarging a portion A of FIG. 9 according to another exemplary embodiment.

A sealing unit 750 may include an organic layer 755, an upper inorganic layer 752, and a plurality of composite inorganic layers 1000, as illustrated in FIG. 21. In an exemplary embodiment, the composite inorganic layers 1000 may include a first lower composite inorganic layer 1001, a second lower composite inorganic layer 1002, a third lower composite inorganic layer 1003, a fourth lower composite inorganic layer 1004, a first upper composite inorganic layer 1011, a second upper composite inorganic layer 1022, a third upper composite inorganic layer 1033, and a fourth upper composite inorganic layer 1044, for example.

The sealing unit 750 of FIG. 21, dissimilar to the sealing unit 750 of FIG. 18, does not include the lower inorganic layer 751.

The organic layer 755, the upper inorganic layer 752, the first to fourth lower composite inorganic layers 1001 to 1004, and the first to fourth upper composite inorganic layers 1011 to 1044 of FIG. 21 are substantially the same as those of FIG. 18, respectively.

However, the fourth lower composite inorganic layer 1004 of FIG. 21 may be located between the third lower composite inorganic layer 1003 and the organic layer 755.

As in the various embodiments described above, the sealing unit may include at least one composite inorganic layer. In other words, the sealing unit may have a composite inorganic monolayer structure including one composite inorganic layer, or a composite inorganic multilayer structure including a plurality of composite inorganic layers.

In such an exemplary embodiment, in the composite inorganic multilayer structure, an inorganic layer included in one of adjacent ones of the composite inorganic layers and an inorganic layer included in another of the adjacent ones of the composite inorganic layers face each other, and the two facing inorganic layers have refractive indices different from each other. In an exemplary embodiment, as illustrated in FIG. 12, the second inorganic layer 1-02 of the first composite inorganic layer 100 and the third inorganic layer 2-03 of the second composite inorganic layer 1002 face each other, and the second inorganic layer 1-02 and the third inorganic layer 2-03 have refractive indices different from each other, for example.

In addition, an inorganic layer included in one of adjacent ones of the composite inorganic layers and an inorganic layer included in another of the adjacent ones of the composite inorganic layers face each other, and the two facing inorganic layers may contact each other. In an exemplary embodiment, as illustrated in FIG. 12, the second inorganic layer 1-02 of the first composite inorganic layer 100 and the third inorganic layer 2-03 of the second composite inorganic layer 1002 adjacent thereto face each other, and the second inorganic layer 1-02 and the third inorganic layer 2-03 may contact each other, for example.

Figure 22:
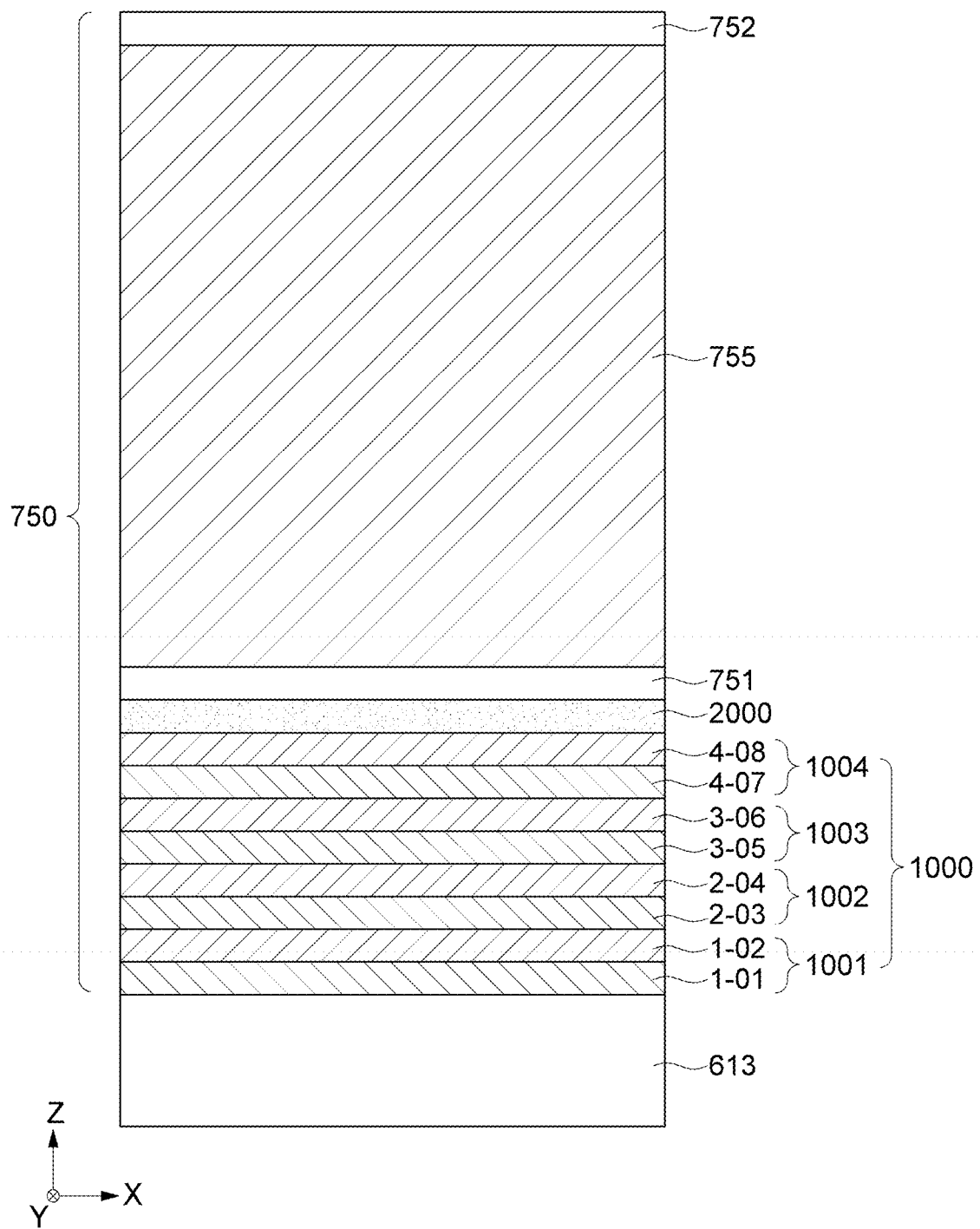
FIG. 22 is a view enlarging a portion A of another exemplary embodiment of FIG. 9.

FIG. 22 is a view enlarging a portion A of FIG. 9 according to another exemplary embodiment.

A sealing unit 750 may include a lower inorganic layer 751, an organic layer 755, an upper inorganic layer 752, an auxiliary inorganic layer 2000, and a plurality of composite inorganic layers 1000, as illustrated in FIG. 22. In an exemplary embodiment, the composite inorganic layers 1000 may include a first composite inorganic layer 1001, a second composite inorganic layer 1002, a third composite inorganic layer 1003, and a fourth composite inorganic layer 1004, for example.

The first composite inorganic layer 1001, the second composite inorganic layer 1002, the third composite inorganic layer 1003, and the fourth composite inorganic layer 1004 of FIG. 22 are substantially the same as the first composite inorganic layer 1001, the second composite inorganic layer 1002, the third composite inorganic layer 1003, and the fourth composite inorganic layer 1004 of FIG. 12, respectively.

The auxiliary inorganic layer 2000 is located close to one of the composite inorganic layers that is located closest to the organic layer 755. In an exemplary embodiment, the auxiliary inorganic layer 2000 may be located on the fourth composite inorganic layer 1004. As a more specific example, the auxiliary inorganic layer 2000 may be located between an eighth inorganic layer 4-08 and the lower inorganic layer 751, for example. In such an exemplary embodiment, the auxiliary inorganic layer 2000 may contact the eighth inorganic layer 4-08 and the lower inorganic layer 751.

The auxiliary inorganic layer 2000 may have a refractive index substantially equal to a refractive index of any inorganic layer included in the fourth composite inorganic layer 1004 that is adjacent thereto. In such an exemplary embodiment, the auxiliary inorganic layer 2000 may have a refractive index substantially equal to a refractive index of one of inorganic layers included in the fourth composite inorganic layer 1004 that is disposed farther away from the auxiliary inorganic layer 2000. In an exemplary embodiment, the auxiliary inorganic layer 2000 may have a refractive index substantially equal to a refractive index of a seventh inorganic layer 4-07, for example.

Figure 23:
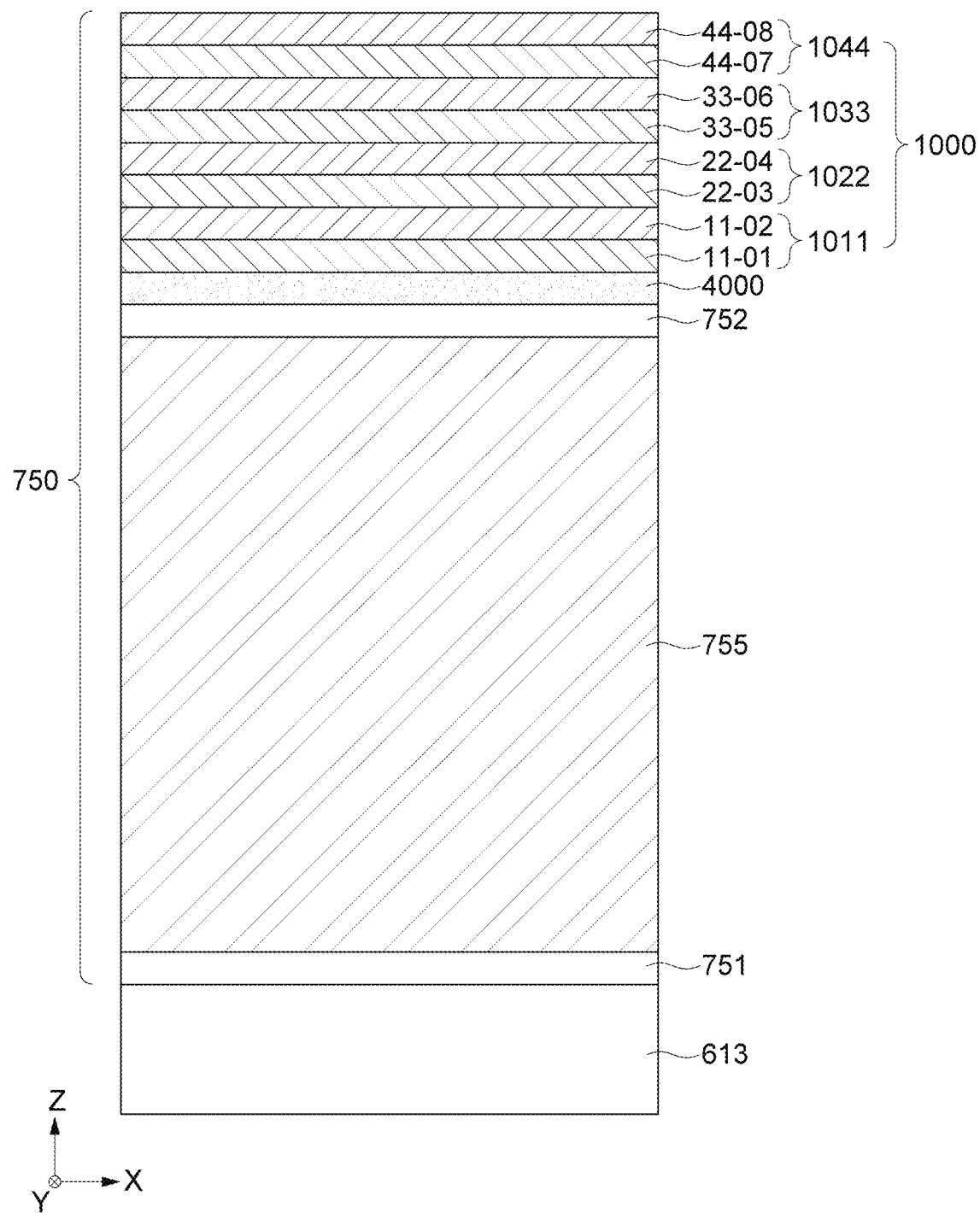
FIG. 23 is a view enlarging a portion A of another exemplary embodiment of FIG. 9.

FIG. 23 is a view enlarging a portion A of FIG. 9 according to another exemplary embodiment.

A sealing unit 750 may include a lower inorganic layer 751, an organic layer 755, an upper inorganic layer 752, an auxiliary inorganic layer 4000, and a plurality of composite inorganic layers 1000, as illustrated in FIG. 23. In an exemplary embodiment, the composite inorganic layers 1000 may include a first composite inorganic layer 1011, a second composite inorganic layer 1022, a third composite inorganic layer 1033, and a fourth composite inorganic layer 1044, for example.

The first composite inorganic layer 1011, the second composite inorganic layer 1022, the third composite inorganic layer 1033, and the fourth composite inorganic layer 1044 of FIG. 23 are substantially the same as the first composite inorganic layer 1011, the second composite inorganic layer 1022, the third composite inorganic layer 1033, and the fourth composite inorganic layer 1044 of FIG. 16, respectively.

The auxiliary inorganic layer 4000 is located close to one of the composite inorganic layers that is located closest to the organic layer 755. In an exemplary embodiment, the auxiliary inorganic layer 4000 may be located beneath the first composite inorganic layer 1011. As a more specific example, the auxiliary inorganic layer 4000 may be located between a first inorganic layer 11-01 and the upper inorganic layer 752, for example. In such an exemplary embodiment, the auxiliary inorganic layer 4000 may contact the first inorganic layer 11-01 and the upper inorganic layer 752.

The auxiliary inorganic layer 4000 may have a refractive index substantially equal to a refractive index of any inorganic layer included in the first composite inorganic layer 1011 that is adjacent thereto. In such an exemplary embodiment, the auxiliary inorganic layer 4000 may have a refractive index substantially equal to a refractive index of one of inorganic layers included in the first composite inorganic layer 1011 that is disposed farther away from the auxiliary inorganic layer 4000. In an exemplary embodiment, the auxiliary inorganic layer 4000 may have a refractive index substantially equal to a refractive index of a second inorganic layer 11-02, for example.

Figure 24:
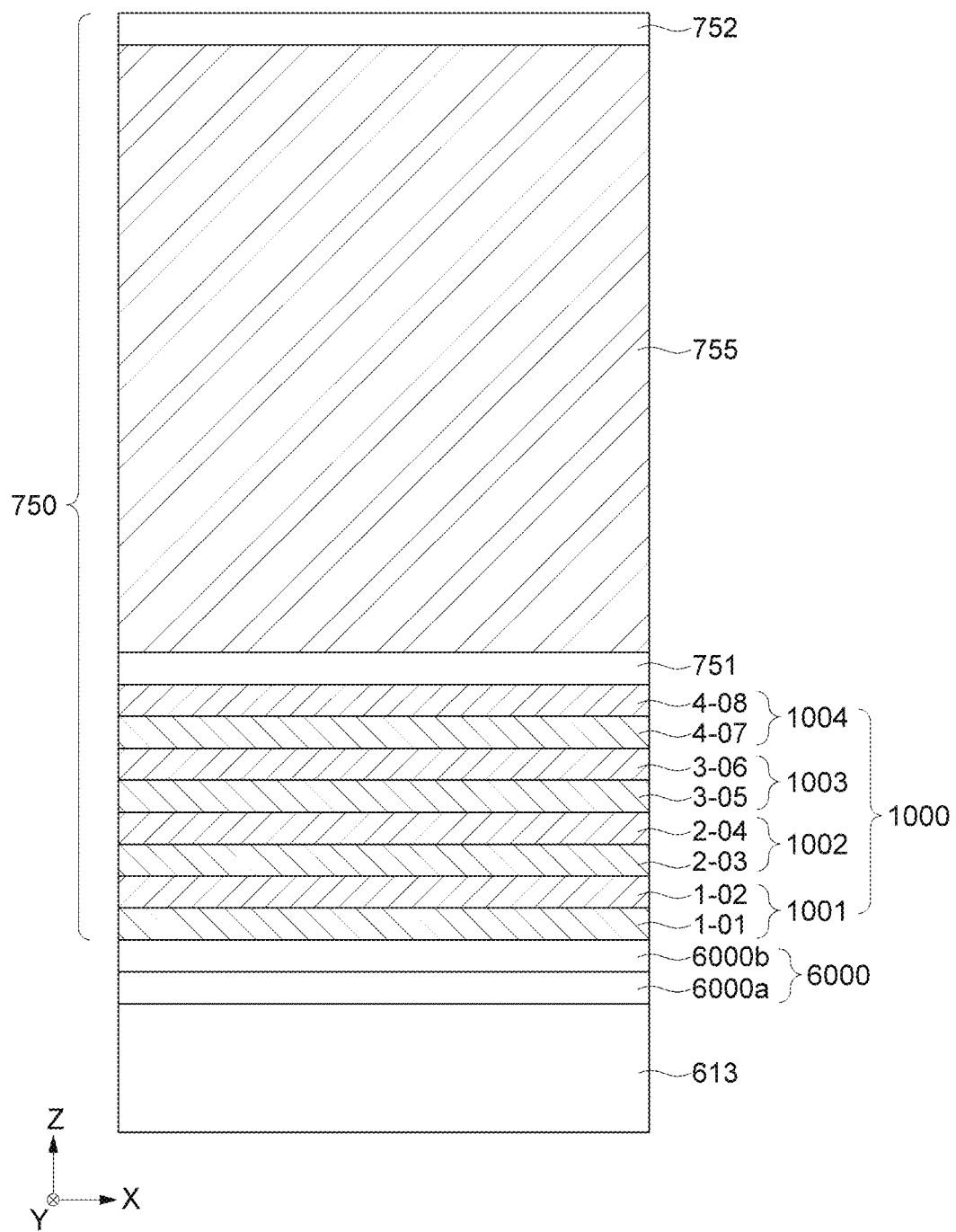
FIG. 24 is a view enlarging a portion A of another exemplary embodiment of FIG. 9.

FIG. 24 is a view enlarging a portion A of FIG. 9 according to another exemplary embodiment.

A sealing unit 750 may include a lower inorganic layer 751, an organic layer 755, an upper inorganic layer 752, an auxiliary inorganic layer, and a plurality of composite inorganic layers 1000, as illustrated in FIG. 24. In an exemplary embodiment, the composite inorganic layers 1000 may include a first composite inorganic layer 1001, a second composite inorganic layer 1002, a third composite inorganic layer 1003, and a fourth composite inorganic layer 1004, for example.

The first composite inorganic layer 1001, the second composite inorganic layer 1002, the third composite inorganic layer 1003, and the fourth composite inorganic layer 1004 of FIG. 24 are substantially the same as the first composite inorganic layer 1001, the second composite inorganic layer 1002, the third composite inorganic layer 1003, and the fourth composite inorganic layer 1004 of FIG. 12, respectively.

As illustrated in FIG. 24, a protective layer 6000 may be located between a common electrode 613 and the sealing unit 750.

The protective layer 6000 may be located on the common electrode 613 so as to overlap an entire surface of a substrate 110. This protective layer 6000 may include at least one of a capping layer 6000a and a metal layer 6000b.

The capping layer 6000a is located on the common electrode 613. In an exemplary embodiment, the capping layer 6000a is located between the common electrode 613 and the metal layer 6000b, for example. The capping layer 6000a may be, for example, the organic layer 755 including an organic material.

The metal layer 6000b is located on the capping layer 6000a. In an exemplary embodiment, the metal layer 6000b may be located between the capping layer 6000a and the first composite inorganic layer 1001, for example. In an exemplary embodiment, the metal layer 6000b may include, for example, LiF.

Figure 25:
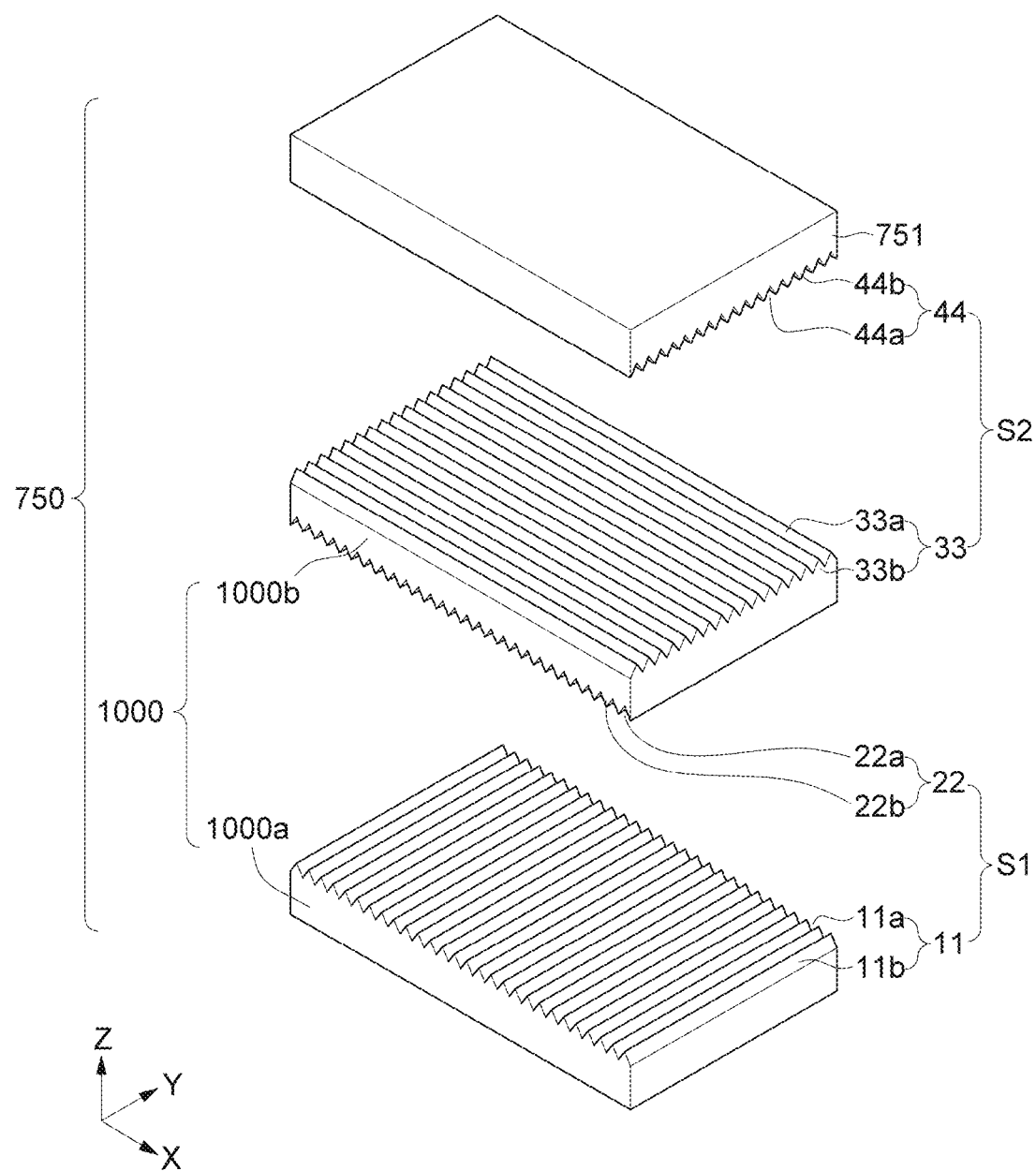
FIG. 25 is an exploded perspective view illustrating a composite inorganic layer of FIG. 11.

FIG. 25 is an exploded perspective view illustrating the composite inorganic layer of FIG. 11.

As illustrated in FIG. 25, an interface S1 (hereinafter, "a first interface") between the first inorganic layer 1-01 and the second inorganic layer 1-02 of the composite inorganic layer 1000 may have a concavo-convex pattern. In other words, the first interface S1 may include concave portions 11a and 22a and convex portions 11b and 22b. With such a structure, the adhesive force between the first inorganic layer 1-01 and the second inorganic layer 1-02 may be improved.

The first interface S1 includes mutually facing surfaces 11 and 22 of the first inorganic layer 1-01 and the second inorganic layer 1-02. When the surface of the first inorganic layer 1-01 of the mutually facing surfaces 11 and 22 is defined as a first surface 11, and the surface of the second inorganic layer 1-02 of the mutually facing surfaces 11 and 22 is defined as a second surface 22, the first surface 11 includes the concave portion 11a and the convex portion 11b, and the second surface 22 includes the concave portion 22a and the convex portion 22b. In such an exemplary embodiment, the convex portion 11b of the first surface 11 is inserted into the concave portion 22a of the second surface 22, and the convex portion 22b of the second surface 22 is inserted into the concave portion 11a of the first surface 11.

In an exemplary embodiment, the convex portions 11b and 22b of the first interface S1 may have a triangular column shape, as in the example of FIG. 25. As another example, the convex portions 11b and 22b of the first interface S1 may have a quadrangular column shape or a semicircular column shape.

In addition, an interface S2 (hereinafter, "a second interface") between the second inorganic layer 1-02 and the lower inorganic layer 751 may have a concavo-convex pattern. In other words, the second interface S2 may include concave portions 33a and 44a and convex portions 33b and 44b. With such a structure, the adhesive force between the second inorganic layer 1-02 and the lower inorganic layer 751 may be improved.

The second interface S2 includes mutually facing surfaces 33 and 44 of the second inorganic layer 1-02 and the lower inorganic layer 751. When the surface of the second inorganic layer 1-02 of the mutually facing surfaces 33 and 44 is defined as a third surface 33, and the surface of the fourth inorganic layer 1-02 of the mutually facing surfaces 33 and 44 is defined as a fourth surface 44, the third surface 33 includes the concave portion 33a and the convex portion 33b, and the fourth surface 44 includes the concave portion 44a and the convex portion 44b. In such an exemplary embodiment, the convex portion 33b of the third surface 33 is inserted into the concave portion 44a of the fourth surface 44, and the convex portion 44b of the fourth surface 44 is inserted into the concave portion 33a of the third surface 33.

In an exemplary embodiment, the convex portions 33b and 44b of the second interface S2 may have a triangular column shape, as in the example of FIG. 25. As another example, the convex portions 33b and 44b of the second interface S2 may have a quadrangular column shape or a semicircular column shape.

An arrangement direction of the convex portions 11b or 22b included in the first interface S1 and an arrangement direction of the convex portions 33b or 44b included in the second interface S2 may cross each other. In one exemplary embodiment, for example, as illustrated in FIG. 25, the convex portions 11b of the first interface S1 may be arranged along the X-axis direction, and the convex portions 33b of the second interface S2 may be arranged along the Y-axis direction. With such a structure, the brightness of light that passes through the sealing unit 750 may be improved in addition to the improvement of the adhesion between the neighboring layers.

As illustrated in FIG. 25, the convex portions 11b and 22b of the first interface S1 and the convex portions 33b and 44b of the second interface S2 may have a substantially same shape.

In an alternative exemplary embodiment, although not illustrated, the convex portions 11b and 22b of the first interface S1 and the convex portions 33b and 44b of the second interface S2 may have different shapes. In an exemplary embodiment, the convex portions 11b and 22b of the first interface S1 may have a triangular column shape, and the convex portions 33b and 44b of the second interface S2 may have a quadrangular column shape, for example.

Figure 26:
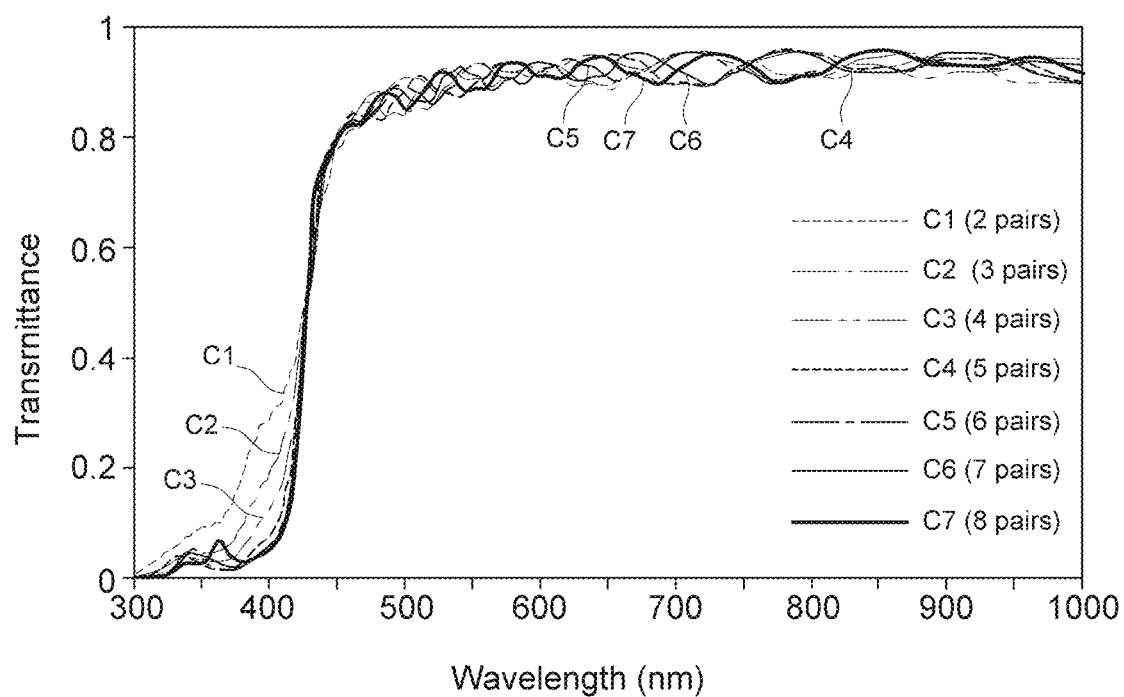
FIG. 26 is a diagram illustrating an exemplary embodiment of a change in transmittance of a composite inorganic multilayer according to the invention depending on the application of sunlight.

FIG. 26 is a diagram illustrating a change in transmittance of a composite inorganic multilayer according to an exemplary embodiment of the invention depending on the sunlight.

In FIG. 26, the X-axis represents the wavelength of sunlight, and the Y-axis represents the transmittance (i.e., the light transmittance).

A composite inorganic layer of FIG. 26 includes a $TiO_2$ inorganic layer (e.g., the first inorganic layer 1-01) and an $Al_2O_3$ inorganic layer (e.g., the second inorganic layer 1-02).

First to seventh curves C1 to C7 show the transmittance of each composite inorganic multilayer depending on the wavelength of sunlight. Specifically, the first curve C1 represents a transmittance change of a first composite inorganic multilayer including two (e.g., two pairs of) composite inorganic layers, the second curve C2 represents a transmittance change of a second composite inorganic multilayer including three (e.g., three pairs of) composite inorganic layers, the third curve C3 represents a transmittance change of a third composite inorganic multilayer including four (e.g., four pairs of) composite inorganic layers, the fourth curve C4 represents a transmittance change of a fourth composite inorganic multilayer including five (e.g., five pairs of) composite inorganic layers, the fifth curve C5 represents a transmittance change of a fifth composite inorganic multilayer including six (e.g., six pairs of) composite inorganic layers, the sixth curve C6 represents a transmittance change of a sixth composite inorganic multilayer including seven (e.g., seven pairs of) composite inorganic layers, and the seventh curve C7 represents a transmittance change of a seventh composite inorganic multilayer including eight (e.g., eight pairs of) composite inorganic layers.

The first composite inorganic layer has a structure in which two $TiO_2$ inorganic layers and two $Al_2O_3$ inorganic layers are alternately stacked, the second composite inorganic layer has a structure in which three $TiO_2$ inorganic layers and three $Al_2O_3$ inorganic layers are alternately stacked, the third composite inorganic layer has a structure in which four $TiO_2$ inorganic layers and four $Al_2O_3$ inorganic layers are alternately stacked, the fourth composite inorganic layer has a structure in which five $TiO_2$ inorganic layers and five $Al_2O_3$ inorganic layers are alternately stacked, the fifth composite inorganic layer has a structure in which six $TiO_2$ inorganic layers and six $Al_2O_3$ inorganic layers are alternately stacked, the sixth composite inorganic layer has a structure in which seven $TiO_2$ inorganic layers and seven $Al_2O_3$ inorganic layers are alternately stacked, and the seventh composite inorganic layer has a structure in which eight $TiO_2$ inorganic layers and eight $Al_2O_3$ inorganic layers are alternately stacked.

As illustrated in FIG. 26, in the wavelength range of ultraviolet ("UV") light (e.g., the wavelength range from about 320 nm to about 405 nm), the first to seventh composite inorganic multilayers have relatively low transmittance (e.g., a transmittance of about 0.1 or less or about 10% or less). Accordingly, the sealing unit 750 including the composite inorganic layer according to an exemplary embodiment the invention may have excellent UV light blocking ability.

Figure 27:
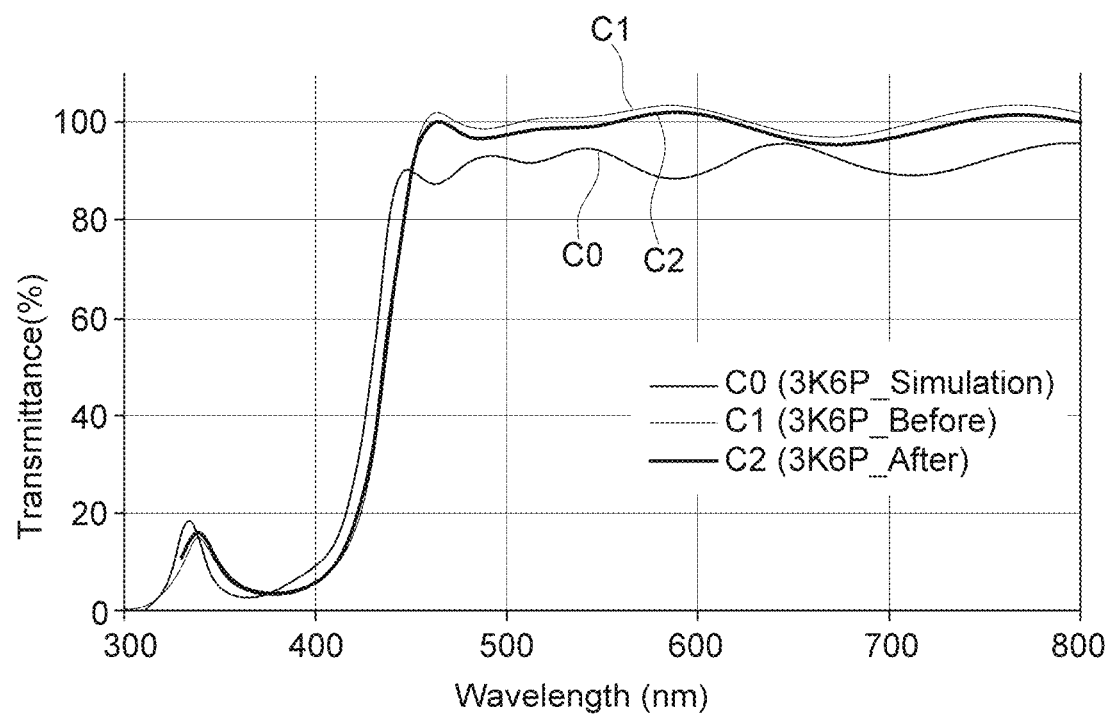
FIG. 27 is a diagram illustrating an exemplary embodiment of a change in transmittance of the composite inorganic multilayer according to the invention depending on the application of sunlight.

FIG. 27 is a diagram illustrating a change in transmittance of the composite inorganic multilayer according to an exemplary embodiment of the invention depending on the application of sunlight.

In FIG. 27, the X-axis represents the wavelength of sunlight, and the Y-axis represents the transmittance (i.e., the light transmittance).

A composite inorganic layer of FIG. 27 includes a $TiO_2$ inorganic layer (e.g., the first inorganic layer 1-01) and an $Al_2O_3$ inorganic layer (e.g., the second inorganic layer 1-02).

Each curve C0, C1, and C2 of FIG. 27 represents transmittance of a composite inorganic multilayer including six (e.g., six pairs of) composite inorganic layers disposed on a $SiN_x$ layer having a thickness of about 3000 Angstroms (Å) for each condition. Specifically, a reference curve C0 represents a simulation result of transmittance of the composite inorganic multilayer, a first curve C1 represents transmittance of the composite inorganic multilayer (hereinafter, "first composite inorganic multilayer") before the sunlight is applied thereto, and a second curve C2 represents transmittance of the composite inorganic multilayer (hereinafter, "second composite inorganic multilayer") to which the sunlight is applied for a predetermined period of time.

As illustrated in FIG. 27, in the wavelength range of UV light (e.g., the wavelength range from about 320 nm to about 405 nm), the first composite inorganic multilayer and the second composite inorganic multilayer have relatively low transmittance (e.g., a transmittance of about 0.1 or less or about 10% or less). In addition, the first composite inorganic multilayer and the second composite inorganic multilayer have a substantially equal transmittance in the UV wavelength range. Accordingly, the sealing unit including the composite inorganic layer according to an exemplary embodiment the invention may have excellent UV light blocking ability after the sunlight is applied thereto for a relatively long time.

Figures 28, 29, 30:
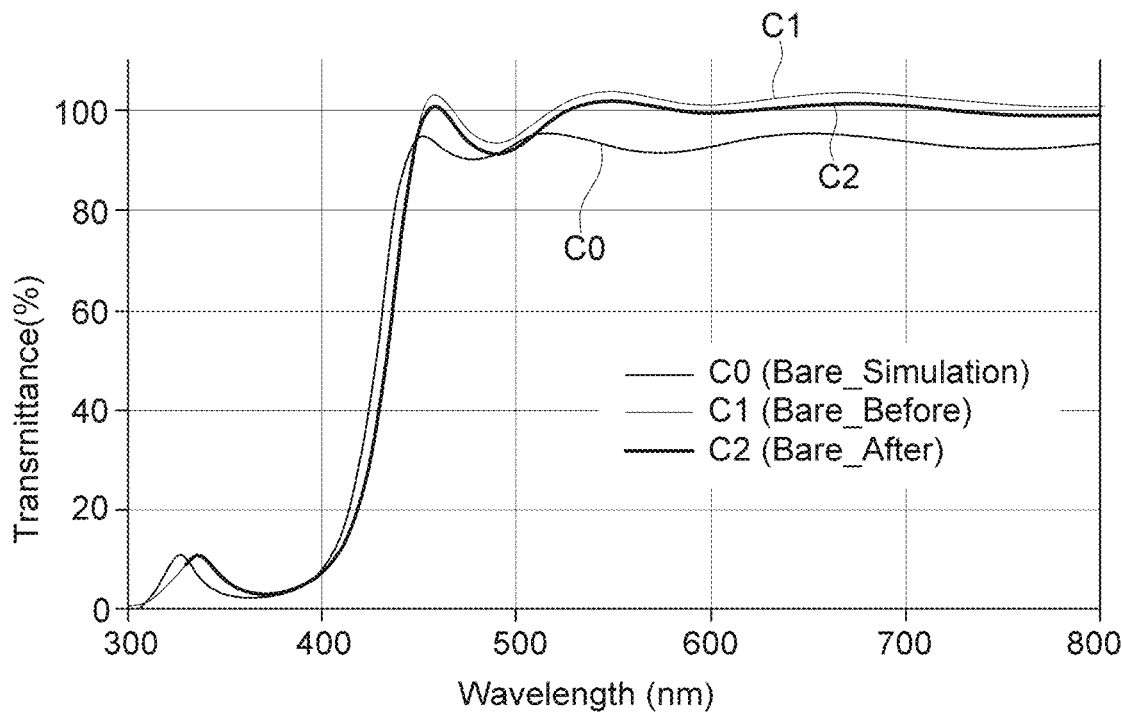
FIG. 28 is a diagram illustrating another exemplary embodiment of a change in transmittance of the composite inorganic multilayer according to the invention depending on the application of sunlight.
FIG. 29 is a table showing an exemplary embodiment of a material and a refractive index of each inorganic layer included in the composite inorganic layer according to the invention.
FIG. 30 is a table showing an exemplary embodiment of combinations of a composite inorganic layer according to the invention and an exemplary embodiment of the transmittance of the combinations for each wavelength according to the invention.

FIG. 28 is a diagram illustrating a change in transmittance of the composite inorganic multilayer according to another exemplary embodiment of the invention depending on the application of sunlight.

In FIG. 28, the X-axis represents the wavelength of sunlight, and the Y-axis represents the transmittance (i.e., the light transmittance).

A composite inorganic layer of FIG. 28 includes a $TiO_2$ inorganic layer (e.g., the first inorganic layer 1-01) and an $Al_2O_3$ inorganic layer (e.g., the second inorganic layer 1-02).

Each curve C0, C1, and C2 of FIG. 28 represents transmittance of a composite inorganic multilayer including six (e.g., six pairs of) composite inorganic layers disposed on a bear glass. Specifically, a reference curve C0 represents a simulation result of transmittance of the composite inorganic multilayer, a first curve C1 represents transmittance of the composite inorganic multilayer (hereinafter, "first composite inorganic multilayer") before the sunlight is applied thereto, and a second curve C2 represents transmittance of the composite inorganic multilayer (hereinafter, "second composite inorganic multilayer") to which the sunlight is applied for a predetermined period of time.

As illustrated in FIG. 28, in the wavelength range of UV light (e.g., the wavelength range from about 320 nm to about 405 nm), the first composite inorganic multilayer and the second composite inorganic multilayer have relatively low transmittance (e.g., a transmittance of about 0.1 or less or about 10% or less). In addition, the first composite inorganic multilayer and the second composite inorganic multilayer have a substantially equal transmittance in the UV wavelength range. Accordingly, the sealing unit including the composite inorganic layer according to the embodiment the invention may have excellent UV light blocking ability after the sunlight is applied thereto for a relatively long time.

FIG. 29 is a table showing a material and a refractive index of each inorganic layer included in the composite inorganic layer according to an exemplary embodiment of the invention.

As illustrated in FIG. 29, $TiO_2$ has a refractive index of about 2.288, $SiN_x$ has a refractive index in a range from about 1.833 to about 1.882, $AlO_x$ has a refractive index in a range from about 1.627 to about 1.677, and $SiO_x$ has a refractive index in a range from about 1.463 to about 1.487.

In addition, there appears in FIG. 29 the refractive index difference between $TiO_2$ and each material, and a refractive index difference (0.825) between $TiO_2$ and $SiO_x$ is the largest. In an exemplary embodiment, one composite inorganic layer may include $TiO_2$ as a high refractive index material (e.g., a material for the first inorganic layer 1-01) and may include $SiO_x$ as a low refractive index material (e.g., a material for the second inorganic layer 1-02), for example.

FIG. 30 is a table showing combinations of a composite inorganic layer according to an exemplary embodiment of the invention and the transmittance of the combinations for each wavelength according to an exemplary embodiment of the invention.

As illustrated in FIG. 30, the composite inorganic layer according to an exemplary embodiment of the invention may have a combination ① (hereinafter, "first combination") including a first inorganic layer 1-01 of $TiO_2$ and a second inorganic layer 1-02 of $SiN_x$ (n=1.882).

In addition, as illustrated in FIG. 30, the composite inorganic layer according to an exemplary embodiment of the invention may have a combination ② (hereinafter, "second combination") including a first inorganic layer 1-01 of $TiO_2$ and a second inorganic layer 1-02 of $SiN_x$ (n=1.833).

In addition, as illustrated in FIG. 30, the composite inorganic layer according to an exemplary embodiment of the invention may have a combination ③ (hereinafter, "third combination") including a first inorganic layer 1-01 of $TiO_2$ and a second inorganic layer 1-02 of $AlO_x$ (n=1.677).

In addition, as illustrated in FIG. 30, the composite inorganic layer according to an exemplary embodiment of the invention may have a combination ④ (hereinafter, "fourth combination") including a first inorganic layer 1-01 of $TiO_2$ and a second inorganic layer 1-02 of $AlO_x$ (n=1.627).

In addition, as illustrated in FIG. 30, the composite inorganic layer according to an exemplary embodiment of the invention may have a combination ⑤ (hereinafter, "fifth combination") including a first inorganic layer 1-01 of $TiO_2$ and a second inorganic layer 1-02 of $SiO_x$ (n=1.487).

In addition, as illustrated in FIG. 30, the composite inorganic layer according to an exemplary embodiment of the invention may have a combination ⑥ (hereinafter, "sixth combination") including a first inorganic layer 1-01 of $TiO_2$ and a second inorganic layer 1-02 of $SiO_x$ (n=1.463).

As illustrated in FIG. 30, the transmittances of the first combination ① in the wavelength range of about 405 nm and about 450 nm are about 11.46% and about 70.88%, respectively, the transmittances of the second combination ② in the wavelength range of about 405 nm and about 450 nm are about 10.60% and about 74.35%, respectively, the transmittances of the third combination ③ in the wavelength range of about 405 nm and about 450 nm are about 8.60% and about 76.89%, respectively, the transmittances of the fourth combination ④ in the wavelength range of about 405 nm and about 450 nm are about 8.08% and about 77.33%, respectively, the transmittances of the fifth combination ⑤ in the wavelength range of about 405 nm and about 450 nm are about 7.41% and about 78.10%, respectively, and the transmittances of the sixth combination ⑥ in the wavelength range of about 405 nm and about 450 nm are about 7.25% and about 78.30%, respectively.

The first combination ① and the second combination ② have relatively high transmittance in the relatively low wavelength range (405 nm). The third combination ③, the fourth combination ④, the fifth combination ⑤, and the sixth combination ⑥ have relatively low transmittance (e.g., transmittance of about 0.1 or less or about 10% or less) in the relatively low wavelength range (405 nm).

Figures 31, 32A:
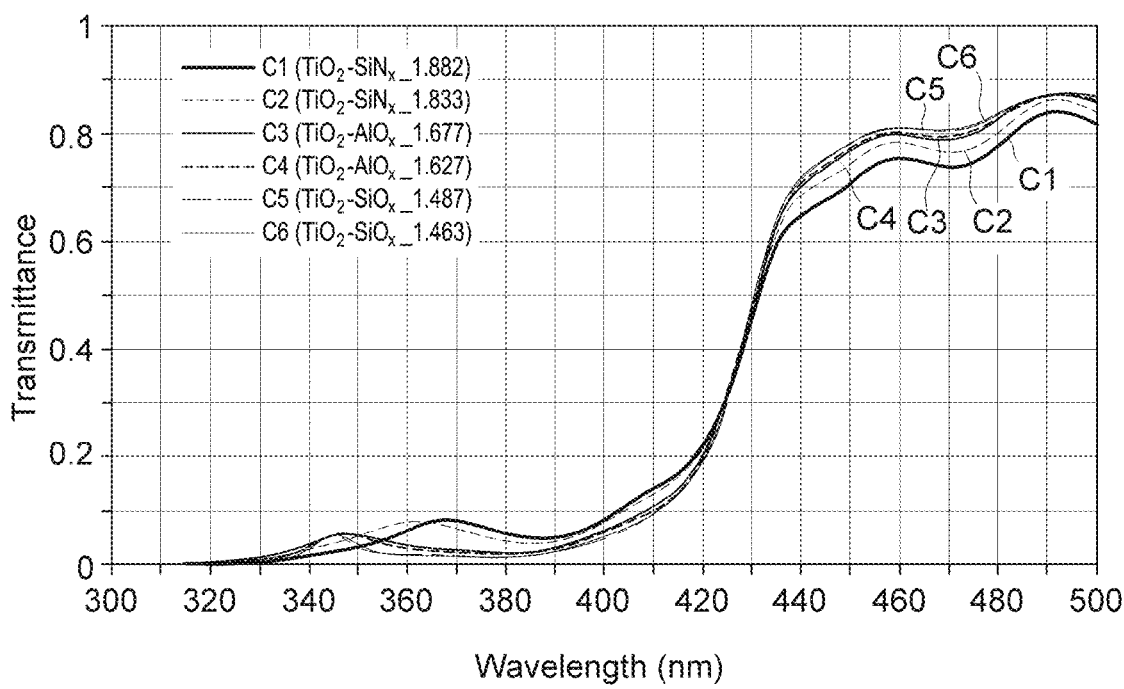
FIG. 31 is a graph illustrating characteristics of each combination in FIG. 30.
FIG. 32A is a table showing the transmittance of a composite inorganic multilayer which is disposed on a $SiN_x$ layer and includes $SiN_x$ and $SiO_x$.

FIG. 31 is a graph illustrating characteristics of each combination in FIG. 30.

In FIG. 31, the X-axis represents the wavelength of sunlight, and the Y-axis represents the transmittance (i.e., the light transmittance).

As illustrated in FIG. 31, the first curve C1 related to the first combination ① and the second curve C2 related to the second combination ② show transmittance higher than about 0.1 or about 10% in the relatively low wavelength range (405 nm). The third curve C3 related to the third combination ③, the fourth curve C4 related to the fourth combination ④, the fifth curve C5 related to the fifth combination ⑤, and the sixth curve C6 related to the sixth combination ⑥ show relatively low transmittance (e.g., transmittance of about 0.1 or less or about 10% or less) in the relatively low wavelength range (405 nm).

Figure 32B:
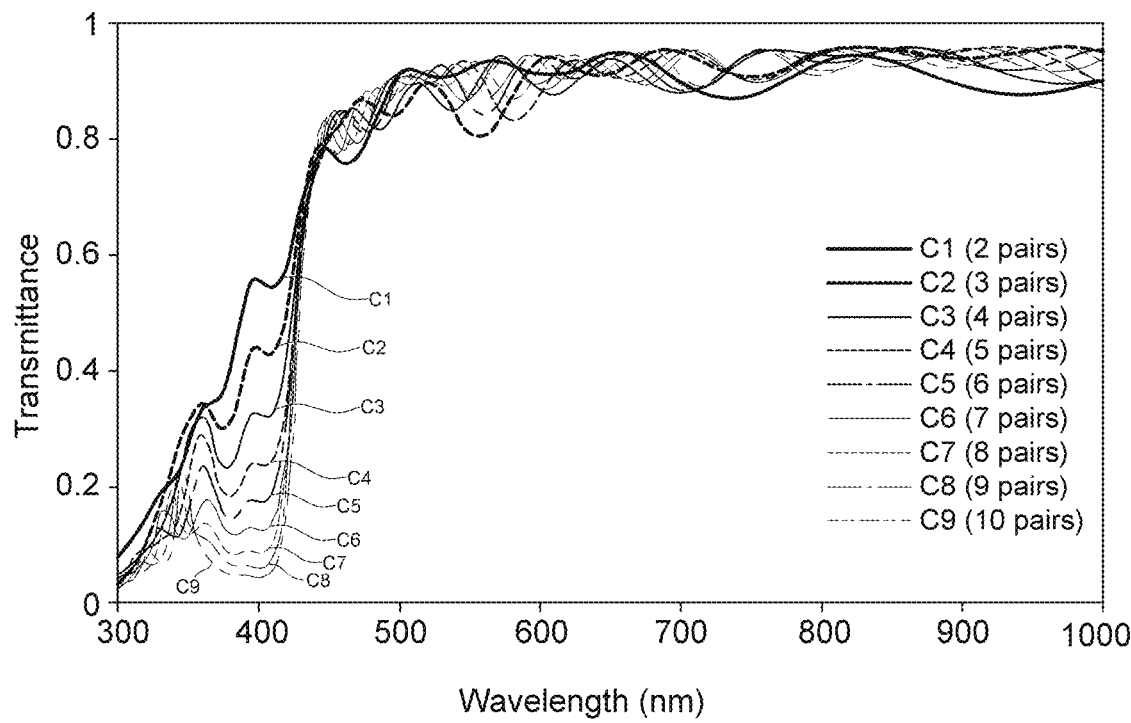
FIG. 32B is a graph illustrating the transmittance of the composite inorganic multilayer of FIG. 32A.
Figure 32C:
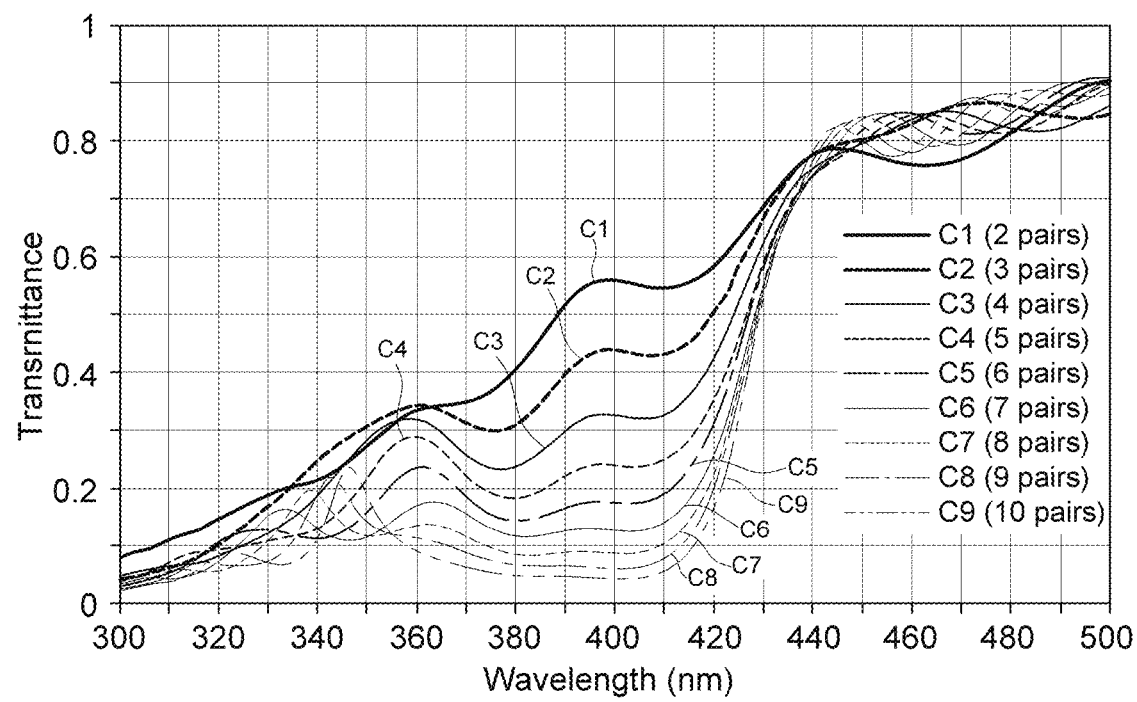
FIG. 32C is a view enlarging a partial wavelength range of FIG. 32B.

FIG. 32A is a table showing the transmittance of a composite inorganic multilayer which is disposed on a $SiN_x$ layer and includes $SiN_x$ and $SiO_x$, FIG. 32B is a graph illustrating the transmittance of the composite inorganic multilayer of FIG. 32A, and FIG. 32C is a view enlarging a partial wavelength range of FIG. 32B.

In FIGS. 32B and 32C, the X-axis represents the wavelength of sunlight, and the Y-axis represents the transmittance (i.e., the light transmittance).

A composite inorganic layer of FIGS. 32A, 32B and 32C includes a $SiN_x$ inorganic layer (e.g., the first inorganic layer 1-01) and a $SiO_x$ inorganic layer (e.g., the second inorganic layer 1-02). In such an exemplary embodiment, the refractive index of $SiN_x$ of the composite inorganic layer may be about 1.833, and the refractive index of $SiO_x$ of the composite inorganic layer may be about 1.487.

First to ninth curves C1 to C9 in FIGS. 32B and 32C show transmittance of each composite inorganic multilayer depending on the wavelength of sunlight.

Specifically, the first curve C1 represents a transmittance change of a first composite inorganic multilayer including two (e.g., two pairs of) composite inorganic layers, the second curve C2 represents a transmittance change of a second composite inorganic multilayer including three (e.g., three pairs of) composite inorganic layers, the third curve C3 represents a transmittance change of a third composite inorganic multilayer including four (e.g., four pairs of) composite inorganic layers, the fourth curve C4 represents a transmittance change of a fourth composite inorganic multilayer including five (e.g., five pairs of) composite inorganic layers, the fifth curve C5 represents a transmittance change of a fifth composite inorganic multilayer including six (e.g., six pairs of) composite inorganic layers, the sixth curve C6 represents a transmittance change of a sixth composite inorganic multilayer including seven (e.g., seven pairs of) composite inorganic layers, the seventh curve C7 represents a transmittance change of a seventh composite inorganic multilayer including eight (e.g., eight pairs of) composite inorganic layers, the eighth curve C8 represents a transmittance change of an eighth composite inorganic multilayer including nine (e.g., nine pairs of) composite inorganic layers, and the ninth curve C9 represents a transmittance change of a ninth composite inorganic multilayer including ten (e.g., ten pairs of) composite inorganic layers.

The first composite inorganic multilayer has a structure in which two $SiN_x$ inorganic layers and two $SiO_x$ inorganic layers are alternately stacked on an $SiN_x$ layer (e.g., the upper inorganic layer 752), the second composite inorganic multilayer has a structure in which three $SiN_x$ inorganic layers and three $SiO_x$ inorganic layers are alternately stacked on the $SiN_x$ layer (e.g., the upper inorganic layer 752), the third composite inorganic multilayer has a structure in which four $SiN_x$ inorganic layers and four $SiO_x$ inorganic layers are alternately stacked on the $SiN_x$ layer (e.g., the upper inorganic layer 752), the fourth composite inorganic multilayer has a structure in which five $SiN_x$ inorganic layers and five $SiO_x$ inorganic layers are alternately stacked on the $SiN_x$ layer (e.g., the upper inorganic layer 752), the fifth composite inorganic multilayer has a structure in which six $SiN_x$ inorganic layers and six $SiO_x$ inorganic layers are alternately stacked on the $SiN_x$ layer (e.g., the upper inorganic layer 752), the sixth composite inorganic multilayer has a structure in which seven $SiN_x$ inorganic layers and seven $SiO_x$ inorganic layers are alternately stacked on the $SiN_x$ layer (e.g., the upper inorganic layer 752), the seventh composite inorganic multilayer has a structure in which eight $SiN_x$ inorganic layers and eight $SiO_x$ inorganic layers are alternately stacked on the $SiN_x$ layer (e.g., the upper inorganic layer 752), the eighth composite inorganic multilayer has a structure in which nine $SiN_x$ inorganic layers and nine $SiO_x$ inorganic layers are alternately stacked on the $SiN_x$ layer (e.g., the upper inorganic layer 752), and the ninth composite inorganic multilayer has a structure in which ten $SiN_x$ inorganic layers and ten $SiO_x$ inorganic layers are alternately stacked on the $SiN_x$ layer (e.g., the upper inorganic layer 752).

FIG. 32A shows the transmittance of the fourth to ninth composite inorganic multilayers.

As illustrated in FIG. 32, the transmittances of the fourth composite inorganic multilayer in the wavelength range of about 405 nm and about 450 nm are about 23.76% and about 80.08%, respectively, the transmittances of the fifth composite inorganic multilayer in the wavelength range of about 405 nm and about 450 nm are about 17.55% and about 81.93%, respectively, the transmittances of the sixth composite inorganic multilayer in the wavelength range of about 405 nm and about 450 nm are about 12.74% and about 83.68%, respectively, the transmittances of the seventh composite inorganic multilayer in the wavelength range of about 405 nm and about 450 nm are about 9.04% and about 84.08%, respectively, the transmittances of the eighth composite inorganic multilayer in the wavelength range of about 405 nm and about 450 nm are about 6.37% and about 82.54%, respectively, and the transmittances of the ninth composite inorganic multilayer in the wavelength range of about 405 nm and about 450 nm are about 4.50% and about 80.14%, respectively.

As illustrated in FIG. 32A, in the wavelength range of UV light (e.g., the wavelength range from about 320 nm to about 405 nm), the seventh, eighth, and ninth composite inorganic multilayers have relatively low transmittance (e.g., a transmittance of about 0.1 or less or about 10% or less). Accordingly, the sealing unit including one of the seventh, eighth, and ninth composite inorganic multilayers may have excellent UV light blocking ability.

Figures 33A, 33B:
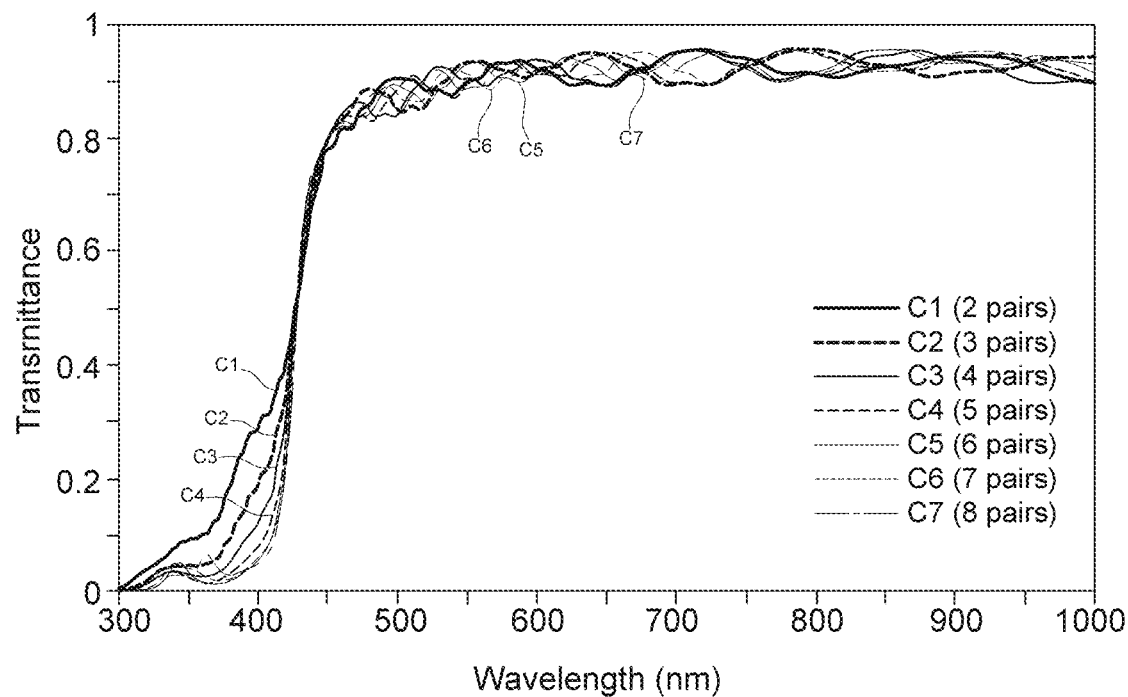
FIG. 33A is a table showing the transmittance and the thickness of a composite inorganic layer which is disposed on a $SiN_x$ layer and includes $TiO_2$ and $Al_2O_3$.
FIG. 33B is a graph illustrating the transmittance of the composite inorganic layer of FIG. 33A.
Figures 33C, 34A:
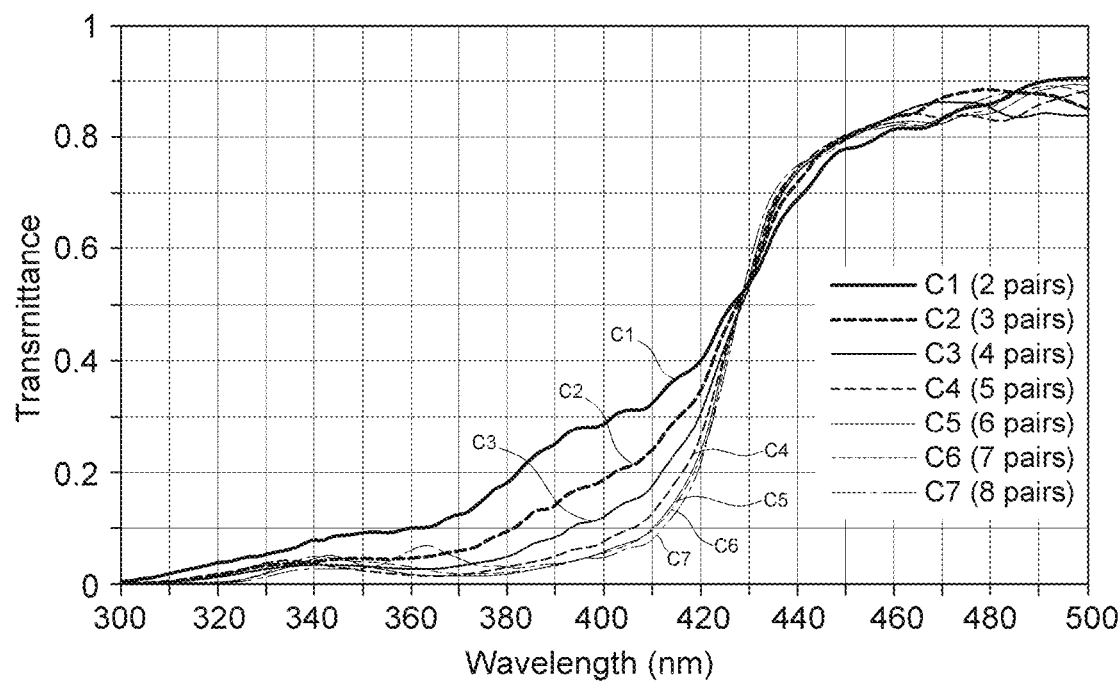
FIG. 33C is a view enlarging a partial wavelength range of FIG. 33B.
FIG. 34A is a table showing the transmittance of a composite inorganic multilayer including a $TiO_2$ layer and an inorganic layer having a refractive index less than that of $TiO_2$.

FIG. 33A is a table showing the transmittance and the thickness of a composite inorganic layer which is disposed on a $SiN_x$ layer and includes $TiO_2$ and $Al_2O_3$, FIG. 33B is a graph illustrating the transmittance of the composite inorganic layer of FIG. 33A, and FIG. 33C is a view enlarging a partial wavelength range of FIG. 33B.

In FIGS. 33B and 33C, the X-axis represents the wavelength of sunlight, and the Y-axis represents the transmittance (i.e., the light transmittance).

A composite inorganic layer of FIGS. 33A, 33B and 33C includes a $TiO_2$ inorganic layer (e.g., the first inorganic layer 1-01) and an $Al_2O_3$ inorganic layer (e.g., the second inorganic layer 1-02). In such an exemplary embodiment, the refractive index of $TiO_2$ of the composite inorganic layer may be about 2.288, and the refractive index of $Al_2O_3$ of the composite inorganic layer may be about 1.627.

First to seventh curves C1 to C7 show transmittance of each composite inorganic multilayer depending on the wavelength of sunlight. Specifically, the first curve C1 represents a transmittance change of a first composite inorganic multilayer including two (e.g., two pairs of) composite inorganic layers, the second curve C2 represents a transmittance change of a second composite inorganic multilayer including three (e.g., three pairs of) composite inorganic layers, the third curve C3 represents a transmittance change of a third composite inorganic multilayer including four (e.g., four pairs of) composite inorganic layers, the fourth curve C4 represents a transmittance change of a fourth composite inorganic multilayer including five (e.g., five pairs of) composite inorganic layers, the fifth curve C5 represents a transmittance change of a fifth composite inorganic multilayer including six (e.g., six pairs of) composite inorganic layers, the sixth curve C6 represents a transmittance change of a sixth composite inorganic multilayer including seven (e.g., seven pairs of) composite inorganic layers, and the seventh curve C7 represents a transmittance change of a seventh composite inorganic multilayer including eight (e.g., eight pairs of) composite inorganic layers.

The first composite inorganic multilayer has a structure in which two $TiO_2$ inorganic layers and two $Al_2O_3$ inorganic layers are alternately stacked on a $SiN_x$ layer (e.g., the upper inorganic layer 752), the second composite inorganic multilayer has a structure in which three $TiO_2$ inorganic layers and three $Al_2O_3$ inorganic layers are alternately stacked on a $SiN_x$ layer (e.g., the upper inorganic layer 752), the third composite inorganic multilayer has a structure in which four $TiO_2$ inorganic layers and four $Al_2O_3$ inorganic layers are alternately stacked on a $SiN_x$ layer (e.g., the upper inorganic layer 752), the fourth composite inorganic multilayer has a structure in which five $TiO_2$ inorganic layers and five $Al_2O_3$ inorganic layers are alternately stacked on a $SiN_x$ layer (e.g., the upper inorganic layer 752), the fifth composite inorganic multilayer has a structure in which six $TiO_2$ inorganic layers and six $Al_2O_3$ inorganic layers are alternately stacked on a $SiN_x$ layer (e.g., the upper inorganic layer 752), the sixth composite inorganic multilayer has a structure in which seven $TiO_2$ inorganic layers and seven $Al_2O_3$ inorganic layers are alternately stacked on a $SiN_x$ layer (e.g., the upper inorganic layer 752), and the seventh composite inorganic multilayer has a structure in which eight $TiO_2$ inorganic layers and eight $Al_2O_3$ inorganic layers are alternately stacked on a $SiN_x$ layer (e.g., the upper inorganic layer 752).

The transmittance of the second to seventh composite inorganic multilayers is shown in FIG. 33A.

Referring to FIG. 33A, the transmittances of the second composite inorganic multilayer in the wavelength range of about 405 nm and about 450 nm are about 21.46% and about 79.50%, respectively, the transmittances of the third composite inorganic multilayer in the wavelength range of about 405 nm and about 450 nm are about 14.87% and about 79.86%, respectively, the transmittances of the fourth composite inorganic multilayer in the wavelength range of about 405 nm and about 450 nm are about 9.97% and about 80.16%, respectively, the transmittances of the fifth composite inorganic multilayer in the wavelength range of about 405 nm and about 450 nm are about 7.72% and about 79.48%, respectively, the transmittances of the sixth composite inorganic multilayer in the wavelength range of about 405 nm and about 450 nm are about 7.60% and about 79.61%, respectively, and the transmittances of the seventh composite inorganic multilayer in the wavelength range of about 405 nm and about 450 nm are about 6.47% and about 79.47% respectively.

Referring to FIG. 33A, a thickness of the second composite inorganic multilayer is about 3650 Å, a thickness of the third composite inorganic multilayer is about 4670 Å, a thickness of the fourth composite inorganic multilayer is about 5740 Å, a thickness of the fifth composite inorganic multilayer is about 6820 Å, a thickness of the sixth composite inorganic multilayer is about 8130 Å, and a thickness of the seventh composite inorganic multilayer is about 9400 Å.

As illustrated in FIG. 33A, in the wavelength range of UV light (e.g., the wavelength range from about 320 nm to about 405 nm), the fourth to seventh composite inorganic multilayers have relatively low transmittance (e.g., a transmittance of about 0.1 or less or about 10% or less). Accordingly, the sealing unit including one of the fourth to seventh composite inorganic layers may have excellent UV light blocking ability.

Figure 34B:
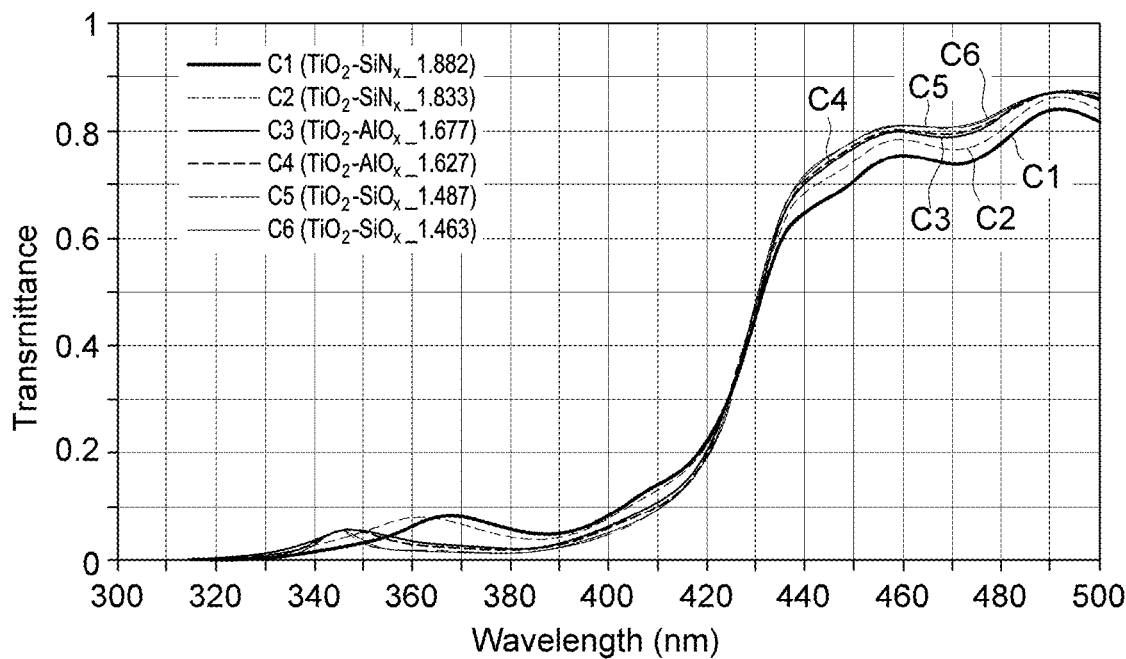
FIG. 34B is a graph illustrating the transmittance of each combination of FIG. 34A.
Figure 34C:
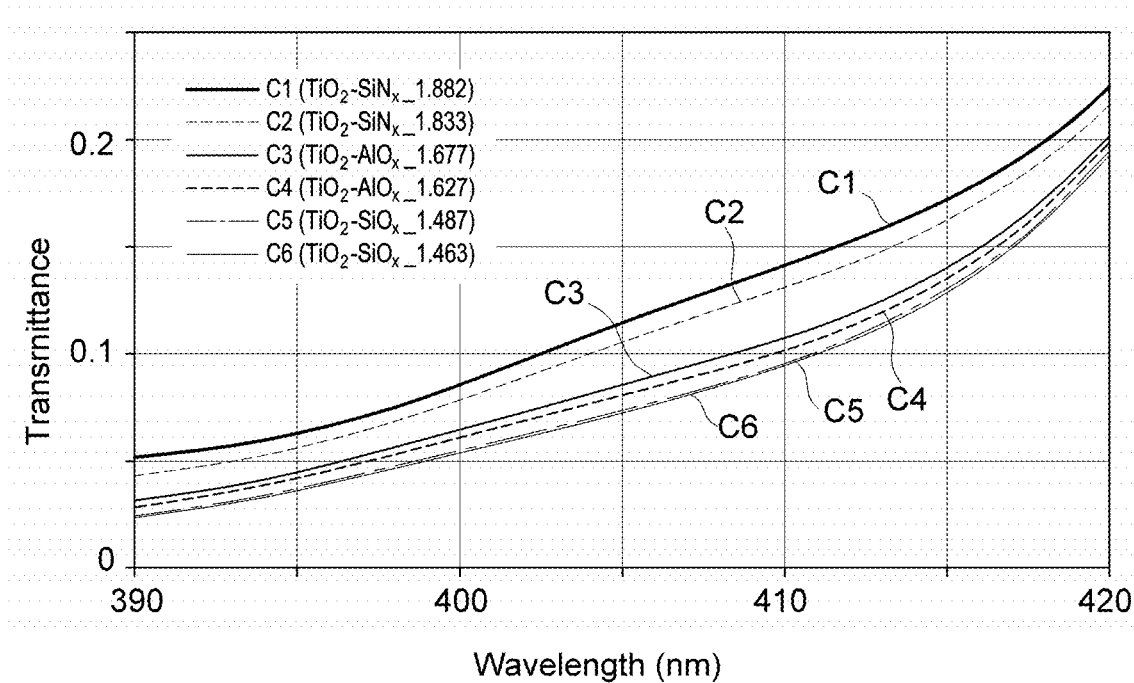
FIG. 34C is a view enlarging a partial wavelength range of FIG. 34B.
Figure 34D:
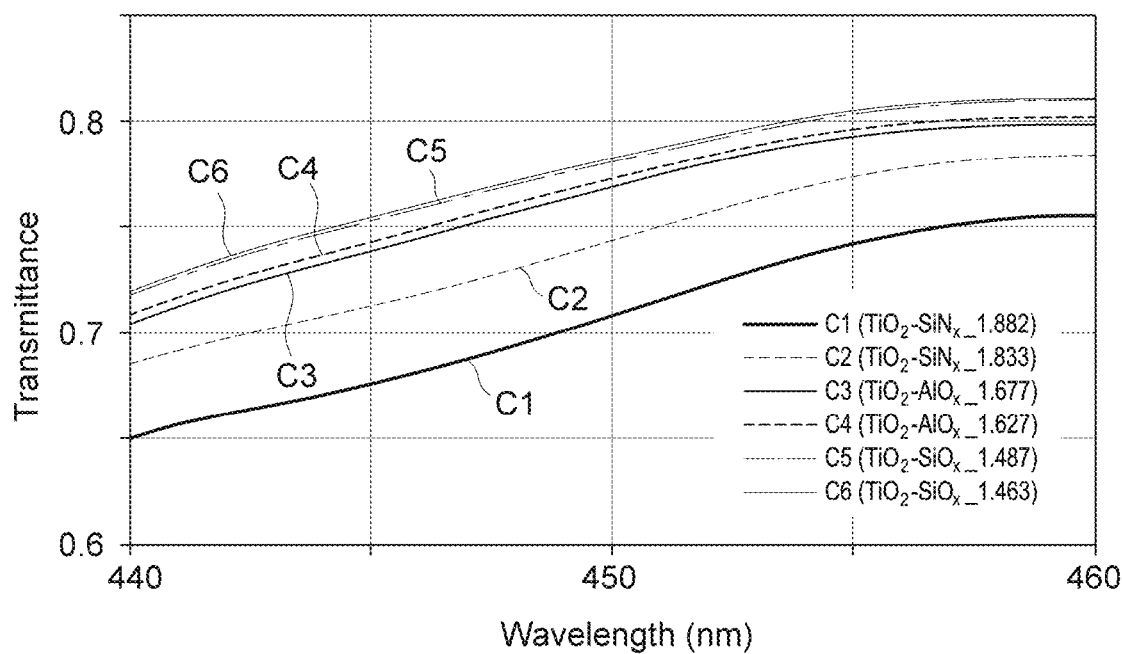
FIG. 34D is a view enlarging another partial wavelength range of FIG. 34B.

FIG. 34A is a table showing transmittance of a composite inorganic multilayer including a $TiO_2$ layer and an inorganic layer having a refractive index less than that of $TiO_2$, FIG. 34B is a graph illustrating transmittance of each combination of FIG. 34A, FIG. 34C is a view enlarging a partial wavelength range of FIG. 34B, and FIG. 34D is a view enlarging another partial wavelength range of FIG. 34B.

In FIGS. 34B, 34C, and 34D, the X-axis represents the wavelength of sunlight, and the Y-axis represents the transmittance (i.e., the light transmittance).

As illustrated in FIG. 34A, a first composite inorganic multilayer ① according to an exemplary embodiment of the invention includes a plurality of composite inorganic layers which include a first inorganic layer 1-01 of $TiO_x$ and a second inorganic layer 1-02 of $SiN_x$ (n=1.882).

As illustrated in FIG. 34A, a second composite inorganic multilayer ② according to an exemplary embodiment of the invention includes a plurality of composite inorganic layers which include a first inorganic layer 1-01 of $TiO_2$ and a second inorganic layer 1-02 of $SiN_x$ (n=1.833).

As illustrated in FIG. 34A, a third composite inorganic multilayer 3 according to an exemplary embodiment of the invention includes a plurality of composite inorganic layers which include a first inorganic layer 1-01 of $TiO_2$ and a second inorganic layer 1-02 of $AlO_x$ (n=1.677).

As illustrated in FIG. 34A, a fourth composite inorganic multilayer ③ according to an exemplary embodiment of the invention includes a plurality of composite inorganic layers which include a first inorganic layer 1-01 of $TiO_2$ and a second inorganic layer 1-02 of $AlO_x$ (n=1.627).

As illustrated in FIG. 34A, a fifth composite inorganic multilayer ④ according to an exemplary embodiment of the invention includes a plurality of composite inorganic layers which include a first inorganic layer 1-01 of $TiO_2$ and a second inorganic layer 1-02 of $SiO_x$ (n=1.487).

As illustrated in FIG. 34A, a sixth composite inorganic multilayer ⑤ according to an exemplary embodiment of the invention includes a plurality of composite inorganic layers which include a first inorganic layer 1-01 of $TiO_2$ and a second inorganic layer 1-02 of $SiO_x$ (n=1.463).

The first to sixth composite inorganic multilayers ① to ⑥ described above may each include the same number of composite inorganic layers. In an exemplary embodiment, each of the first to sixth composite inorganic multilayers ① to ⑥ may include seven composite inorganic layers, for example. As a specific example, the first composite inorganic multilayer ① may have a structure in which seven $TiO_2$ inorganic layers and seven $SiN_x$ (n=1.882) inorganic layers are alternately stacked, the second composite inorganic multilayer ② may have a structure in which seven $TiO_2$ inorganic layers and seven $SiN_x$ (n=1.883) inorganic layers are alternately stacked, the third composite inorganic multilayer ③ may have a structure in which seven $TiO_2$ inorganic layers and seven $AlO_x$ (n=1.677) inorganic layers are alternately stacked, the fourth composite inorganic multilayer ④ may have a structure in which seven $TiO_2$ inorganic layers and seven $AlO_x$ (n=1.627) inorganic layers are alternately stacked, the fifth composite inorganic multilayer ⑤ may have a structure in which seven $TiO_2$ inorganic layers and seven $SiO_x$ (n=1.487) inorganic layers are alternately stacked, and the sixth composite inorganic multilayer ⑥ may have a structure in which seven $TiO_2$ inorganic layers and seven $SiO_x$ (n=1.463) inorganic layers are alternately stacked, As illustrated in FIGS. 34B and 34C, in the relatively low wavelength range (e.g., the wavelength range from about 320 nm to about 405 nm), as the refractive index difference between the inorganic layers in the composite inorganic multilayer (or composite inorganic layer) increases, the transmittance of the composite inorganic multilayer (or composite inorganic layer) decreases.

As illustrated in FIGS. 34B and 34D, in the relatively high wavelength range, as the refractive index difference between the inorganic layers in the composite inorganic multilayer (or composite inorganic layer) increases, the transmittance of the composite inorganic multilayer (or composite inorganic layer) increases.

Accordingly, the greater the refractive index difference between the inorganic layers included in the composite inorganic layer, the greater the UV light blocking effect.

FIG. 35 is a view illustrating sealing units according to various embodiments of the invention and thicknesses of related layers.

A first sealing unit ① may include an $Al_2O_3$ auxiliary inorganic layer disposed on a $SiN_x$ layer (e.g., the upper inorganic layer 752) and a first composite inorganic multilayer disposed on the $Al_2O_3$ auxiliary inorganic layer.

The first composite inorganic multilayer may include five composite inorganic layers L1, L2, L3, L4, and L5. In an exemplary embodiment, the first composite inorganic multilayer may include five $TiO_2$ inorganic layers and five $Al_2O_3$ inorganic layers that are alternately stacked on the $SiN_x$ layer, for example.

In the first sealing unit ①, the $SiN_x$ layer may have a thickness of about 5000 Å, the $Al_2O_3$ auxiliary inorganic layer may have a thickness of about 575 Å, the $TiO_2$ inorganic layer of the first composite inorganic layer L1 may have a thickness of about 189 Å, the $Al_2O_3$ inorganic layer of the first composite inorganic layer L1 may have a thickness of about 771 Å, the $TiO_2$ inorganic layer of the second composite inorganic layer L2 may have a thickness of about 173 Å, the $Al_2O_3$ inorganic layer of the second composite inorganic layer L2 may have a thickness of about 969 Å, the $TiO_2$ inorganic layer of the third composite inorganic layer L3 may have a thickness of about 152 Å, the $Al_2O_3$ inorganic layer of the third composite inorganic layer L3 may have a thickness of about 713 Å, the $TiO_2$ inorganic layer of the fourth composite inorganic layer L4 may have a thickness of about 403 Å, the $Al_2O_3$ inorganic layer of the fourth composite inorganic layer L4 may have a thickness of about 318 Å, the $TiO_2$ inorganic layer of the fifth composite inorganic layer L5 may have a thickness of about 443 Å, and the $Al_2O_3$ inorganic layer of the fifth composite inorganic layer L5 may have a thickness of about 1061 Å.

The total thickness of the $TiO_2$ inorganic layers is about 1360 Å, the total thickness of the $Al_2O_3$ inorganic layers including the $Al_2O_3$ auxiliary inorganic layer is about 4407 Å, and the total thickness of the $Al_2O_3$ auxiliary inorganic layer, the $TiO_2$ inorganic layers and the $Al_2O_3$ inorganic layers is about 5767 Å.

In an exemplary embodiment, the $Al_2O_3$ auxiliary inorganic layer of the first sealing unit ① may be located beneath the organic layer 755 or beneath the lower inorganic layer 751, and the first composite inorganic multilayer of the first sealing unit ① may be located beneath the $Al_2O_3$ auxiliary inorganic layer. In such an exemplary embodiment, the first composite inorganic layer L1 of the first composite inorganic multilayer may be located beneath the $Al_2O_3$ auxiliary inorganic layer, the second composite inorganic layer L2 may be located beneath the first composite inorganic layer L1, the third composite inorganic layer L3 may be located beneath the second composite inorganic layer L2, the fourth composite inorganic layer L4 may be located beneath the third composite inorganic layer L3, and the fifth inorganic layer L5 may be located beneath the fourth composite inorganic layer L4. In other words, the first to fifth composite inorganic layers L1 to L5 may be located between the $Al_2O_3$ auxiliary inorganic layer and the common electrode 613. In addition, between the $TiO_2$ inorganic layer and the $Al_2O_3$ inorganic layer in each of the composite inorganic layers, the $Al_2O_3$ inorganic layer is located closer to the common electrode 613.

A second sealing unit ② may include an $Al_2O_3$ auxiliary inorganic layer disposed on a $SiN_x$ layer (e.g., the upper inorganic layer 752) and a second composite inorganic multilayer disposed on the $Al_2O_3$ auxiliary inorganic layer.

The second composite inorganic multilayer may include seven composite inorganic layers L1, L2, L3, L4, L5, L6 and L7. In an exemplary embodiment, the second composite inorganic multilayer may include seven $TiO_2$ inorganic layers and seven $Al_2O_3$ inorganic layers that are alternately stacked, for example.

In the second sealing unit ②, the $SiN_x$ layer may have a thickness of about 5000 Å, the $Al_2O_3$ auxiliary inorganic layer may have a thickness of about 562 Å, the $TiO_2$ inorganic layer of the first composite inorganic layer L1 may have a thickness of about 74 Å, the $Al_2O_3$ inorganic layer of the first composite inorganic layer L1 may have a thickness of about 1470 Å, the $TiO_2$ inorganic layer of the second composite inorganic layer L2 may have a thickness of about 87 Å, the $Al_2O_3$ inorganic layer of the second composite inorganic layer L2 may have a thickness of about 733 Å, the $TiO_2$ inorganic layer of the third composite inorganic layer L3 may have a thickness of about 248 Å, the $Al_2O_3$ inorganic layer of the third composite inorganic layer L3 may have a thickness of about 645 Å, the $TiO_2$ inorganic layer of the fourth composite inorganic layer L4 may have a thickness of about 202 Å, the $Al_2O_3$ inorganic layer of the fourth composite inorganic layer L4 may have a thickness of about 1079 Å, the $TiO_2$ inorganic layer of the fifth composite inorganic layer L5 may have a thickness of about 108 Å, the $Al_2O_3$ inorganic layer of the fifth composite inorganic layer L5 may have a thickness of about 747 Å, the $TiO_2$ inorganic layer of the sixth composite inorganic layer L6 may have a thickness of about 406 Å, the $Al_2O_3$ inorganic layer of the sixth composite inorganic layer L6 may have a thickness of about 295 Å, the $TiO_2$ inorganic layer of the seventh composite inorganic layer L7 may have a thickness of about 453 Å, and the $Al_2O_3$ inorganic layer of the seventh composite inorganic layer L7 may have a thickness of about 1046 Å.

The total thickness of the $TiO_2$ inorganic layers is about 1578 Å, the total thickness of the $Al_2O_3$ inorganic layers including the $Al_2O_3$ auxiliary inorganic layer is about 6577 Å, and the total thickness of the $Al_2O_3$ auxiliary inorganic layer, the $TiO_2$ inorganic layers and the $Al_2O_3$ inorganic layers is about 8155 Å.

In an exemplary embodiment, the $Al_2O_3$ auxiliary inorganic layer of the second sealing unit ② may be located beneath the organic layer 755 or beneath the lower inorganic layer 751, and the second composite inorganic multilayer of the second sealing unit ② may be located beneath the $Al_2O_3$ auxiliary inorganic layer. In such an exemplary embodiment, the first composite inorganic layer L1 of the second composite inorganic multilayer may be located beneath the $Al_2O_3$ auxiliary inorganic layer, the second composite inorganic layer L2 may be located beneath the first composite inorganic layer L1, the third composite inorganic layer L3 may be located beneath the second composite inorganic layer L2, the fourth composite inorganic layer L4 may be located beneath the third composite inorganic layer L3, the fifth inorganic layer L5 may be located beneath the fourth composite inorganic layer L4, the sixth inorganic layer L6 may be located beneath the fourth composite inorganic layer L5, and the seventh inorganic layer L7 may be located beneath the sixth composite inorganic layer L6. In other words, the first to seventh composite inorganic layers L1 to L7 may be located between the $Al_2O_3$ auxiliary inorganic layer and the common electrode 613. In addition, between the $TiO_2$ inorganic layer and the $Al_2O_3$ inorganic layer in each of the composite inorganic layers, the $Al_2O_3$ inorganic layer is located closer to the common electrode 613.

A third sealing unit ③ may include an $Al_2O_3$ auxiliary inorganic layer disposed on a $SiN_x$ layer (e.g., the upper inorganic layer 752) and a third composite inorganic multilayer disposed on the $Al_2O_3$ auxiliary inorganic layer.

The third composite inorganic multilayer may include five composite inorganic layers L1, L2, L3, L4, and L5. In an exemplary embodiment, the third composite inorganic multilayer may include five $TiO_2$ inorganic layers and five $Al_2O_3$ inorganic layers that are alternately stacked, for example.

In the third sealing unit ③, the $SiN_x$ layer may have a thickness of about 3000 Å, the $Al_2O_3$ auxiliary inorganic layer may have a thickness of about 575 Å, the $TiO_2$ inorganic layer of the first composite inorganic layer L1 may have a thickness of about 189 Å, the $Al_2O_3$ inorganic layer of the first composite inorganic layer L1 may have a thickness of about 771 Å, the $TiO_2$ inorganic layer of the second composite inorganic layer L2 may have a thickness of about 173 Å, the $Al_2O_3$ inorganic layer of the second composite inorganic layer L2 may have a thickness of about 969 Å, the $TiO_2$ inorganic layer of the third composite inorganic layer L3 may have a thickness of about 152 Å, the $Al_2O_3$ inorganic layer of the third composite inorganic layer L3 may have a thickness of about 713 Å, the $TiO_2$ inorganic layer of the fourth composite inorganic layer L4 may have a thickness of about 403 Å, the $Al_2O_3$ inorganic layer of the fourth composite inorganic layer L4 may have a thickness of about 318 Å, the $TiO_2$ inorganic layer of the fifth composite inorganic layer L5 may have a thickness of about 443 Å, and the $Al_2O_3$ inorganic layer of the fifth composite inorganic layer L5 may have a thickness of about 1061 Å.

The total thickness of the $TiO_2$ inorganic layers is about 1360 Å, the total thickness of the $Al_2O_3$ inorganic layers including the $Al_2O_3$ auxiliary inorganic layer is about 4407 Å, and the total thickness of the $Al_2O_3$ auxiliary inorganic layer, the $TiO_2$ inorganic layers and the $Al_2O_3$ inorganic layers is about 5767 Å.

In an exemplary embodiment, the $Al_2O_3$ auxiliary inorganic layer of the third sealing unit ③ may be located beneath the organic layer 755 or below the lower inorganic layer 751, and the third composite inorganic multilayer of the third sealing unit ③ may be located beneath the $Al_2O_3$ auxiliary inorganic layer. In such an exemplary embodiment, the first composite inorganic layer L1 of the third composite inorganic multilayer may be located beneath the $Al_2O_3$ auxiliary inorganic layer, the second composite inorganic layer L2 may be located beneath the first composite inorganic layer L1, the third composite inorganic layer L3 may be located beneath the second composite inorganic layer L2, the fourth composite inorganic layer L4 may be located beneath the third composite inorganic layer L3, and the fifth inorganic layer L5 may be located beneath the fourth composite inorganic layer L4. In other words, the first to fifth composite inorganic layers L1 to L5 may be located between the $Al_2O_3$ auxiliary inorganic layer and the common electrode 613. In addition, between the $TiO_2$ inorganic layer and the $Al_2O_3$ inorganic layer in each of the composite inorganic layers, the $Al_2O_3$ inorganic layer is located closer to the common electrode 613.

A fourth sealing unit ④ may include an $Al_2O_3$ auxiliary inorganic layer disposed on a $SiN_x$ layer (e.g., the upper inorganic layer 752) and a fourth composite inorganic multilayer disposed on the $Al_2O_3$ auxiliary inorganic layer.

The fourth composite inorganic multilayer may include seven composite inorganic layers L1, L2, L3, L4, L5, L6 and L7. In an exemplary embodiment, the fourth composite inorganic multilayer may include seven $TiO_2$ inorganic layers and seven $Al_2O_3$ inorganic layers that are alternately stacked, for example.

In the fourth sealing unit ④, the $SiN_x$ layer may have a thickness of about 3000 Å, the $Al_2O_3$ auxiliary inorganic layer may have a thickness of about 562 Å, the $TiO_2$ inorganic layer of the first composite inorganic layer L1 may have a thickness of about 74 Å, the $Al_2O_3$ inorganic layer of the first composite inorganic layer L1 may have a thickness of about 1470 Å, the $TiO_2$ inorganic layer of the second composite inorganic layer L2 may have a thickness of about 87 Å, the $Al_2O_3$ inorganic layer of the second composite inorganic layer L2 may have a thickness of about 733 Å, the $TiO_2$ inorganic layer of the third composite inorganic layer L3 may have a thickness of about 248 Å, the $Al_2O_3$ inorganic layer of the third composite inorganic layer L3 may have a thickness of about 645 Å, the $TiO_2$ inorganic layer of the fourth composite inorganic layer L4 may have a thickness of about 202 Å, the $Al_2O_3$ inorganic layer of the fourth composite inorganic layer L4 may have a thickness of about 1079 Å, the $TiO_2$ inorganic layer of the fifth composite inorganic layer L5 may have a thickness of about 108 Å, the $Al_2O_3$ inorganic layer of the fifth composite inorganic layer L5 may have a thickness of about 747 Å, the $TiO_2$ inorganic layer of the sixth composite inorganic layer L6 may have a thickness of about 406 Å, the $Al_2O_3$ inorganic layer of the sixth composite inorganic layer L6 may have a thickness of about 295 Å, the $TiO_2$ inorganic layer of the seventh composite inorganic layer L7 may have a thickness of about 453 Å, and the $Al_2O_3$ inorganic layer of the seventh composite inorganic layer L7 may have a thickness of about 1046 Å.

The total thickness of the $TiO_2$ inorganic layers is about 1578 Å, the total thickness of the $Al_2O_3$ inorganic layers including the $Al_2O_3$ auxiliary inorganic layer is about 6577 Å, and the total thickness of the $Al_2O_3$ auxiliary inorganic layer, the $TiO_2$ inorganic layers and the $Al_2O_3$ inorganic layers is about 8155 Å.

In an exemplary embodiment, the $Al_2O_3$ auxiliary inorganic layer of the fourth sealing unit ④ may be located beneath the organic layer 755 or beneath the lower inorganic layer 751, and the fourth composite inorganic multilayer of the fourth sealing unit ④ may be located beneath the $Al_2O_3$ auxiliary inorganic layer. In such an exemplary embodiment, the first composite inorganic layer L1 of the fourth composite inorganic multilayer may be located beneath the $Al_2O_3$ auxiliary inorganic layer, the second composite inorganic layer L2 may be located beneath the first composite inorganic layer L1, the third composite inorganic layer L3 may be located beneath the second composite inorganic layer L2, the fourth composite inorganic layer L4 may be located beneath the third composite inorganic layer L3, the fifth inorganic layer L5 may be located beneath the fourth composite inorganic layer L4, the sixth inorganic layer L6 may be located beneath the fourth composite inorganic layer L5, and the seventh inorganic layer L7 may be located beneath the sixth composite inorganic layer L6. In other words, the first to seventh composite inorganic layers L1 to L7 may be located between the $Al_2O_3$ auxiliary inorganic layer and the common electrode 613. In addition, between the $TiO_2$ inorganic layer and the $Al_2O_3$ inorganic layer in each of the composite inorganic layers, the $Al_2O_3$ inorganic layer is located closer to the common electrode 613.

A fifth sealing unit ⑤ may include an $Al_2O_3$ auxiliary inorganic layer disposed on a $SiN_x$ layer (e.g., the upper inorganic layer 752) and a fifth composite inorganic multilayer disposed on the $Al_2O_3$ auxiliary inorganic layer.

The fifth composite inorganic multilayer may include five composite inorganic layers L1, L2, L3, L4, and L5. In an exemplary embodiment, the fifth composite inorganic multilayer may include five $TiO_2$ inorganic layers and five $Al_2O_3$ inorganic layers that are alternately stacked, for example.

In the fifth sealing unit ⑤, the $SiN_x$ layer may have a thickness of about 1000 Å, the $Al_2O_3$ auxiliary inorganic layer may have a thickness of about 117 Å, the $TiO_2$ inorganic layer of the first composite inorganic layer L1 may have a thickness of about 164 Å, the $Al_2O_3$ inorganic layer of the first composite inorganic layer L1 may have a thickness of about 709 Å, the $TiO_2$ inorganic layer of the second composite inorganic layer L2 may have a thickness of about 250 Å, the $Al_2O_3$ inorganic layer of the second composite inorganic layer L2 may have a thickness of about 730 Å, the $TiO_2$ inorganic layer of the third composite inorganic layer L3 may have a thickness of about 234 Å, the $Al_2O_3$ inorganic layer of the third composite inorganic layer L3 may have a thickness of about 643 Å, the $TiO_2$ inorganic layer of the fourth composite inorganic layer L4 may have a thickness of about 403 Å, the $Al_2O_3$ inorganic layer of the fourth composite inorganic layer L4 may have a thickness of about 362 Å, the $TiO_2$ inorganic layer of the fifth composite inorganic layer L5 may have a thickness of about 409 Å, and the $Al_2O_3$ inorganic layer of the fifth composite inorganic layer L5 may have a thickness of about 1107 Å.

The total thickness of the $TiO_2$ inorganic layers is about 1460 Å, the total thickness of the $Al_2O_3$ inorganic layers including the $Al_2O_3$ auxiliary inorganic layer is about 3668 Å, and the total thickness of the $Al_2O_3$ auxiliary inorganic layer, the $TiO_2$ inorganic layers and the $Al_2O_3$ inorganic layers is about 5128 Å.

In an exemplary embodiment, the $Al_2O_3$ auxiliary inorganic layer of the fifth sealing unit ⑤ may be located beneath the organic layer 755 or below the lower inorganic layer 751, and the fifth composite inorganic multilayer of the fifth sealing unit ⑤ may be located beneath the $Al_2O_3$ auxiliary inorganic layer. In such an exemplary embodiment, the first composite inorganic layer L1 of the fifth composite inorganic multilayer may be located beneath the $Al_2O_3$ auxiliary inorganic layer, the second composite inorganic layer L2 may be located beneath the first composite inorganic layer L1, the third composite inorganic layer L3 may be located beneath the second composite inorganic layer L2, the fourth composite inorganic layer L4 may be located beneath the third composite inorganic layer L3, and the fifth inorganic layer L5 may be located beneath the fourth composite inorganic layer L4. In other words, the first to fifth composite inorganic layers L1 to L5 may be located between the $Al_2O_3$ auxiliary inorganic layer and the common electrode 613. In addition, between the $TiO_2$ inorganic layer and the $Al_2O_3$ inorganic layer in each of the composite inorganic layers, the $Al_2O_3$ inorganic layer is located closer to the common electrode 613.

A sixth sealing unit ⑥ may include an $Al_2O_3$ auxiliary inorganic layer disposed on a $SiN_x$ layer (e.g., the upper inorganic layer 752) and a sixth composite inorganic multilayer disposed on the $Al_2O_3$ auxiliary inorganic layer.

The sixth composite inorganic multilayer may include seven composite inorganic layers L1, L2, L3, L4, L5, L6 and L7. In an exemplary embodiment, the sixth composite inorganic multilayer may include seven $TiO_2$ inorganic layers and seven $Al_2O_3$ inorganic layers that are alternately stacked, for example.

In the sixth sealing unit ⑥, the $SiN_x$ layer may have a thickness of about 1000 Å, the $Al_2O_3$ auxiliary inorganic layer may have a thickness of about 117 Å, the $TiO_2$ inorganic layer of the first composite inorganic layer L1 may have a thickness of about 35 Å, the $Al_2O_3$ inorganic layer of the first composite inorganic layer L1 may have a thickness of about 1040 Å, the $TiO_2$ inorganic layer of the second composite inorganic layer L2 may have a thickness of about 206 Å, the $Al_2O_3$ inorganic layer of the second composite inorganic layer L2 may have a thickness of about 545 Å, the $TiO_2$ inorganic layer of the third composite inorganic layer L3 may have a thickness of about 371 Å, the $Al_2O_3$ inorganic layer of the third composite inorganic layer L3 may have a thickness of about 531 Å, the $TiO_2$ inorganic layer of the fourth composite inorganic layer L4 may have a thickness of about 253 Å, the $Al_2O_3$ inorganic layer of the fourth composite inorganic layer L4 may have a thickness of about 962 Å, the $TiO_2$ inorganic layer of the fifth composite inorganic layer L5 may have a thickness of about 153 Å, the $Al_2O_3$ inorganic layer of the fifth composite inorganic layer L5 may have a thickness of about 667 Å, the $TiO_2$ inorganic layer of the sixth composite inorganic layer L6 may have a thickness of about 459 Å, the $Al_2O_3$ inorganic layer of the sixth composite inorganic layer L6 may have a thickness of about 259 Å, the $TiO_2$ inorganic layer of the seventh composite inorganic layer L7 may have a thickness of about 470 Å, and the $Al_2O_3$ inorganic layer of the seventh composite inorganic layer L7 may have a thickness of about 1047 Å.

The total thickness of the $TiO_2$ inorganic layers is about 1947 Å, the total thickness of the $Al_2O_3$ inorganic layers including the $Al_2O_3$ auxiliary inorganic layer is about 5168 Å, and the total thickness of the $Al_2O_3$ auxiliary inorganic layer, the $TiO_2$ inorganic layers and the $Al_2O_3$ inorganic layers is about 7115 Å.

In an exemplary embodiment, the $Al_2O_3$ auxiliary inorganic layer of the sixth sealing unit ⑥ may be located beneath the organic layer 755 or beneath the lower inorganic layer 751, and the sixth composite inorganic multilayer of the sixth sealing unit ⑥ may be located beneath the $Al_2O_3$ auxiliary inorganic layer. In such an exemplary embodiment, the first composite inorganic layer L1 of the sixth composite inorganic multilayer may be located beneath the $Al_2O_3$ auxiliary inorganic layer, the second composite inorganic layer L2 may be located beneath the first composite inorganic layer L1, the third composite inorganic layer L3 may be located beneath the second composite inorganic layer L2, the fourth composite inorganic layer L4 may be located beneath the third composite inorganic layer L3, the fifth inorganic layer L5 may be located beneath the fourth composite inorganic layer L4, the sixth inorganic layer L6 may be located beneath the fourth composite inorganic layer L5, and the seventh inorganic layer L7 may be located beneath the sixth composite inorganic layer L6. In other words, the first to seventh composite inorganic layers L1 to L7 may be located between the $Al_2O_3$ auxiliary inorganic layer and the common electrode 613. In addition, between the $TiO_2$ inorganic layer and the $Al_2O_3$ inorganic layer in each of the composite inorganic layers, the $Al_2O_3$ inorganic layer is located closer to the common electrode 613.

A seventh sealing unit ⑦ may include an $Al_2O_3$ auxiliary inorganic layer and a seventh composite inorganic multilayer disposed on the $Al_2O_3$ auxiliary inorganic layer. In an exemplary embodiment, the Al₂O₃ auxiliary inorganic layer of the seventh sealing unit ⑦ may be disposed on the organic layer 755.

The seventh composite inorganic multilayer may include five composite inorganic layers L1, L2, L3, L4, and L5. In an exemplary embodiment, the seventh composite inorganic multilayer may include five TiO₂ inorganic layers and five Al₂O₃ inorganic layers that are alternately stacked, for example.

In the seventh sealing unit ⑦, the SiN$_x$ layer may have a thickness of about 0 Å, the Al₂O₃ auxiliary inorganic layer may have a thickness of about 117 Å, the TiO₂ inorganic layer of the first composite inorganic layer L1 may have a thickness of about 164 Å, the Al₂O₃ inorganic layer of the first composite inorganic layer L1 may have a thickness of about 709 Å, the TiO₂ inorganic layer of the second composite inorganic layer L2 may have a thickness of about 250 Å, the Al₂O₃ inorganic layer of the second composite inorganic layer L2 may have a thickness of about 730 Å, the TiO₂ inorganic layer of the third composite inorganic layer L3 may have a thickness of about 234 Å, the Al₂O₃ inorganic layer of the third composite inorganic layer L3 may have a thickness of about 643 Å, the TiO₂ inorganic layer of the fourth composite inorganic layer L4 may have a thickness of about 403 Å, the Al₂O₃ inorganic layer of the fourth composite inorganic layer L4 may have a thickness of about 362 Å, the TiO₂ inorganic layer of the fifth composite inorganic layer L5 may have a thickness of about 409 Å, and the Al₂O₃ inorganic layer of the fifth composite inorganic layer L5 may have a thickness of about 1107 Å.

The total thickness of the TiO₂ inorganic layers is about 1460 Å, the total thickness of the Al₂O₃ inorganic layers including the Al₂O₃ auxiliary inorganic layer is about 3668 Å, and the total thickness of the Al₂O₃ auxiliary inorganic layer, the TiO₂ inorganic layers and the Al₂O₃ inorganic layers is about 5128 Å.

In an exemplary embodiment, the Al₂O₃ auxiliary inorganic layer of the seventh sealing unit ⑦ may be located beneath the organic layer 755 or beneath the lower inorganic layer 751, and the seventh composite inorganic multilayer of the seventh sealing unit ⑦ may be located beneath the Al₂O₃ auxiliary inorganic layer. In such an exemplary embodiment, the first composite inorganic layer L1 of the seventh composite inorganic multilayer may be located beneath the Al₂O₃ auxiliary inorganic layer, the second composite inorganic layer L2 may be located beneath the first composite inorganic layer L1, the third composite inorganic layer L3 may be located beneath the second composite inorganic layer L2, the fourth composite inorganic layer L4 may be located beneath the third composite inorganic layer L3, and the fifth inorganic layer L5 may be located beneath the fourth composite inorganic layer L4. In other words, the first to fifth composite inorganic layers L1 to L5 may be located between the Al₂O₃ auxiliary inorganic layer and the common electrode 613. In addition, between the TiO₂ inorganic layer and the Al₂O₃ inorganic layer in each of the composite inorganic layers, the Al₂O₃ inorganic layer is located closer to the common electrode 613.

An eighth sealing unit ⑧ may include an Al₂O₃ auxiliary inorganic layer and an eighth composite inorganic multilayer disposed on the Al₂O₃ auxiliary inorganic layer. In an exemplary embodiment, the Al₂O₃ auxiliary inorganic layer of the eighth sealing unit ⑧ may be disposed on the organic layer 755.

The eighth composite inorganic multilayer may include seven composite inorganic layers L1, L2, L3, L4, L5, L6 and L7. In an exemplary embodiment, the eighth composite inorganic multilayer may include seven TiO₂ inorganic layers and seven Al₂O₃ inorganic layers that are alternately stacked, for example.

In the eighth sealing unit ⑧, the SiN$_x$ layer may have a thickness of about 0 Å, the Al₂O₃ auxiliary inorganic layer may have a thickness of about 117 Å, the TiO₂ inorganic layer of the first composite inorganic layer L1 may have a thickness of about 35 Å, the Al₂O₃ inorganic layer of the first composite inorganic layer L1 may have a thickness of about 1040 Å, the TiO₂ inorganic layer of the second composite inorganic layer L2 may have a thickness of about 206 Å, the Al₂O₃ inorganic layer of the second composite inorganic layer L2 may have a thickness of about 545 Å, the TiO₂ inorganic layer of the third composite inorganic layer L3 may have a thickness of about 371 Å, the Al₂O₃ inorganic layer of the third composite inorganic layer L3 may have a thickness of about 531 Å, the TiO₂ inorganic layer of the fourth composite inorganic layer L4 may have a thickness of about 253 Å, the Al₂O₃ inorganic layer of the fourth composite inorganic layer L4 may have a thickness of about 962 Å, the TiO₂ inorganic layer of the fifth composite inorganic layer L5 may have a thickness of about 153 Å, the Al₂O₃ inorganic layer of the fifth composite inorganic layer L5 may have a thickness of about 667 Å, the TiO₂ inorganic layer of the sixth composite inorganic layer L6 may have a thickness of about 459 Å, the Al₂O₃ inorganic layer of the sixth composite inorganic layer L6 may have a thickness of about 259 Å, the TiO₂ inorganic layer of the seventh composite inorganic layer L7 may have a thickness of about 470 Å, and the Al₂O₃ inorganic layer of the seventh composite inorganic layer L7 may have a thickness of about 1047 Å.

The total thickness of the TiO₂ inorganic layers is about 1947 Å, the total thickness of the Al₂O₃ inorganic layers including the Al₂O₃ auxiliary inorganic layer is about 5168 Å, and the total thickness of the Al₂O₃ auxiliary inorganic layer, the TiO₂ inorganic layers and the Al₂O₃ inorganic layers is about 7115 Å.

In an exemplary embodiment, the Al₂O₃ auxiliary inorganic layer of the eighth sealing unit ⑧ may be located beneath the organic layer 755 or beneath the lower inorganic layer 751, and the eighth composite inorganic multilayer of the eighth sealing unit ⑧ may be located beneath the Al₂O₃ auxiliary inorganic layer. In such an exemplary embodiment, the first composite inorganic layer L1 of the eighth composite inorganic multilayer may be located beneath the Al₂O₃ auxiliary inorganic layer, the second composite inorganic layer L2 may be located beneath the first composite inorganic layer L1, the third composite inorganic layer L3 may be located beneath the second composite inorganic layer L2, the fourth composite inorganic layer L4 may be located beneath the third composite inorganic layer L3, the fifth inorganic layer L5 may be located beneath the fourth composite inorganic layer L4, the sixth inorganic layer L6 may be located beneath the fourth composite inorganic layer L5, and the seventh inorganic layer L7 may be located beneath the sixth composite inorganic layer L6. In other words, the first to seventh composite inorganic layers L1 to L7 may be located between the Al₂O₃ auxiliary inorganic layer and the common electrode 613. In addition, between the TiO₂ inorganic layer and the Al₂O₃ inorganic layer in each of the composite inorganic layers, the Al₂O₃ inorganic layer is located closer to the common electrode 613.

In an exemplary embodiment, the sealing unit 750 according to various embodiments of the invention may also be applied to a flexible display device.

Figure 36:
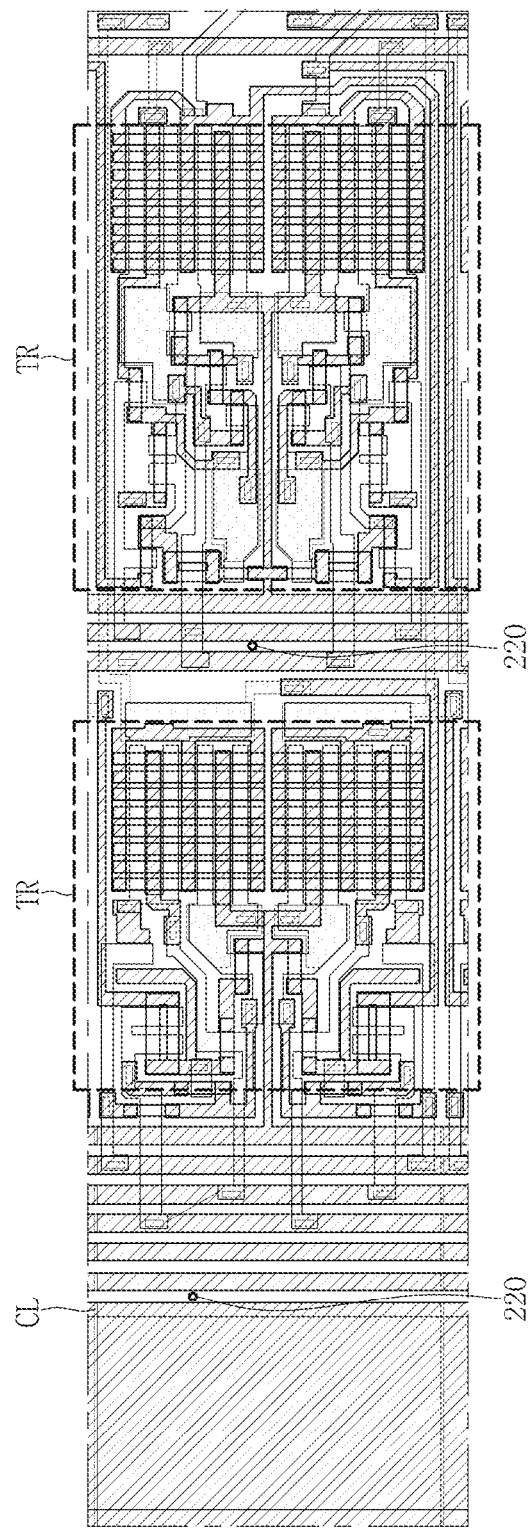
FIG. 36 is a detailed configuration view illustrating a scan driver of FIG. 1.

FIG. 36 is a detailed configuration view illustrating the scan driver of FIG. 1.

The scan driver 102 includes a plurality of driving switching elements TR, as illustrated in FIG. 36. The plurality of driving switching elements TR may be connected to a plurality of clock lines CL.

Each of the driving switching elements TR receives a clock signal from the corresponding clock line and generates and outputs a scan signal based on the clock signal.

The coupling depression 220 and the extension portion 750b described above may be located in the non-display area 100b of the substrate 100. In an exemplary embodiment, the coupling depression 220 and the extension portion 750b in the non-display area 100b may be located between adjacent clock lines CL, for example.

In an alternative exemplary embodiment, although not illustrated, the coupling depression 220 and the extension portion 750b described above may be located between different clock lines connected to the emission control driver 103. That is, the coupling depression 220 and the extension portion 750b described above may be located between adjacent ones of the different clock lines.

In an alternative exemplary embodiment, although not illustrated, the coupling depressions 220 and the extension portions 750b described above may be disposed on any portion of the substrate 100 so long as they do not overlap a conductive pattern (e.g., the scan line, the emission control line, the data line, or the like).

FIGS. 37A to 37M are cross-sectional views for explaining a process of manufacturing a display device according to an exemplary embodiment of the invention.

Figure 37A:
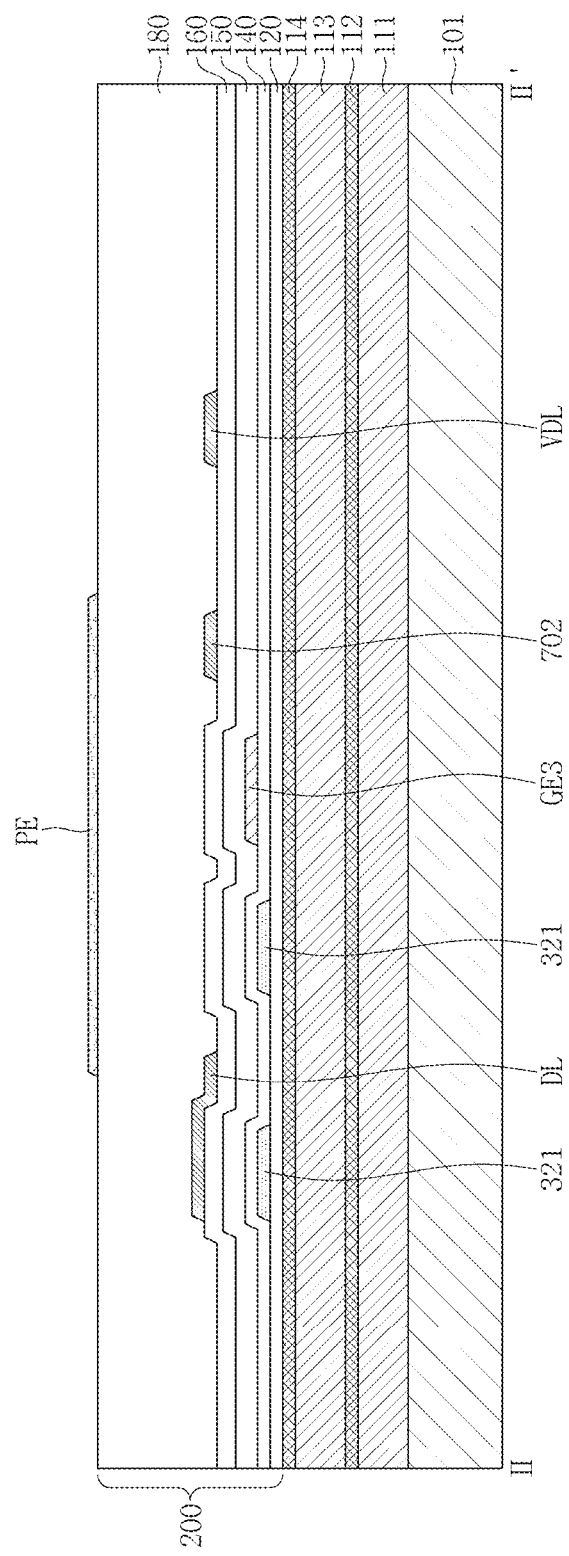
FIGS. 37A to 37M are cross-sectional views for explaining an exemplary embodiment of a process of manufacturing a display device according to the invention.

First, as illustrated in FIG. 37A, the first layer 111, the second layer 112, the third layer 113, the fourth layer 114, the buffer layer 120, the semiconductor layer 321, the gate insulating layer 140, the first insulating interlayer 150, the second insulating interlayer 160, the planarization layer 180, and the pixel electrode PE are sequentially formed on the carrier substrate 101.

In addition, the first gate electrode GE1, the second gate electrode GE2, the third gate electrode GE3, the fourth gate electrode GE4, the fifth gate electrode GE5, the sixth gate electrode GE6, the seventh gate electrode GE7, the (n−1)-th scan line SLn−1, the n-th scan line SLn, the (n+1)-th scan line SLn+1, the emission control line EL, the initialization line IL, the capacitor electrode 201, the first connection electrode 701, the second connection electrode 702, the third connection electrode 703, the data line DL and the high potential line VDL are also formed on the carrier substrate 101.

Figure 37B:
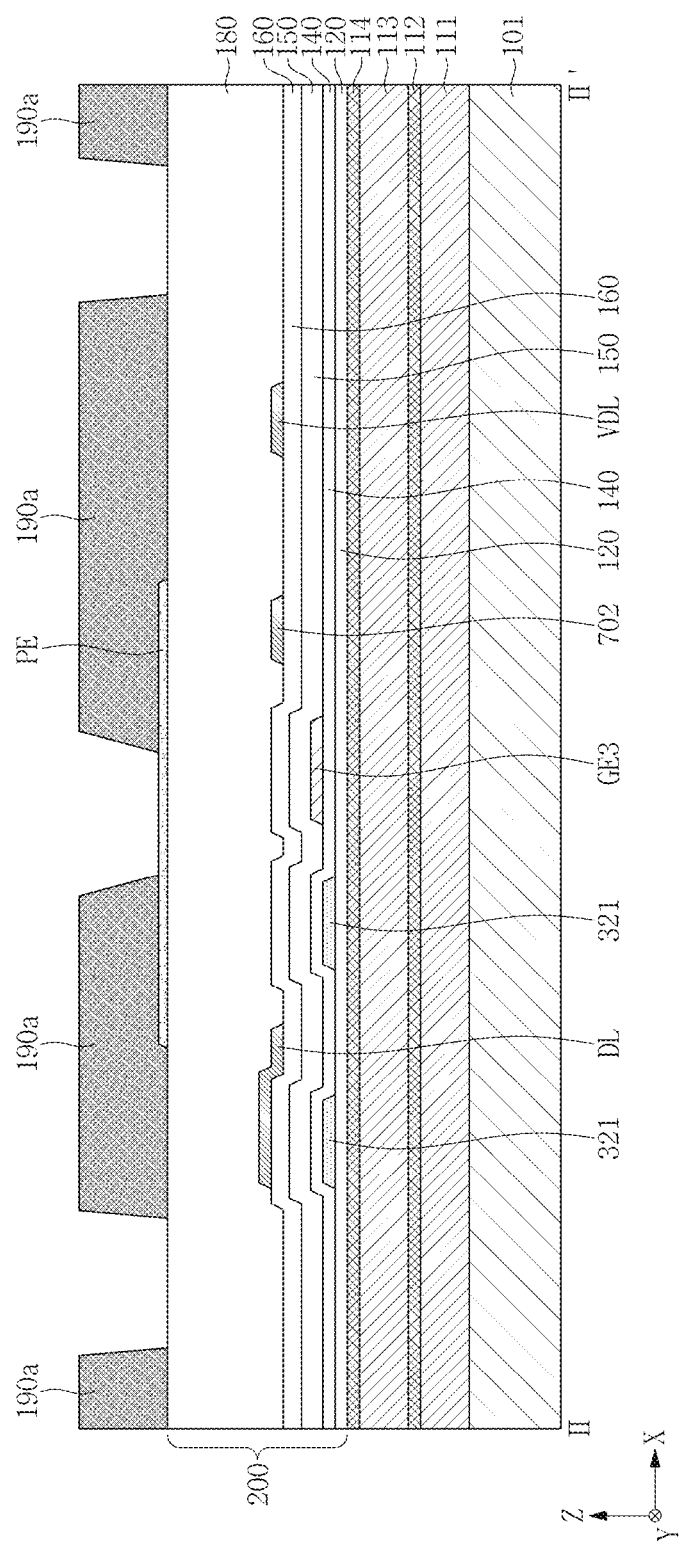

Next, as illustrated in FIG. 37B, an intermediate light blocking layer 190a is formed on the pixel electrode PE and the planarization layer 180. In an exemplary embodiment, the intermediate light blocking layer 190a may be formed on the pixel electrode PE and the planarization layer 180 by a chemical vapor deposition ("CVD") method, for example.

In an exemplary embodiment, the intermediate light blocking layer 190a may include, for example, a polyimide-based resin, for example.

Figure 37C:
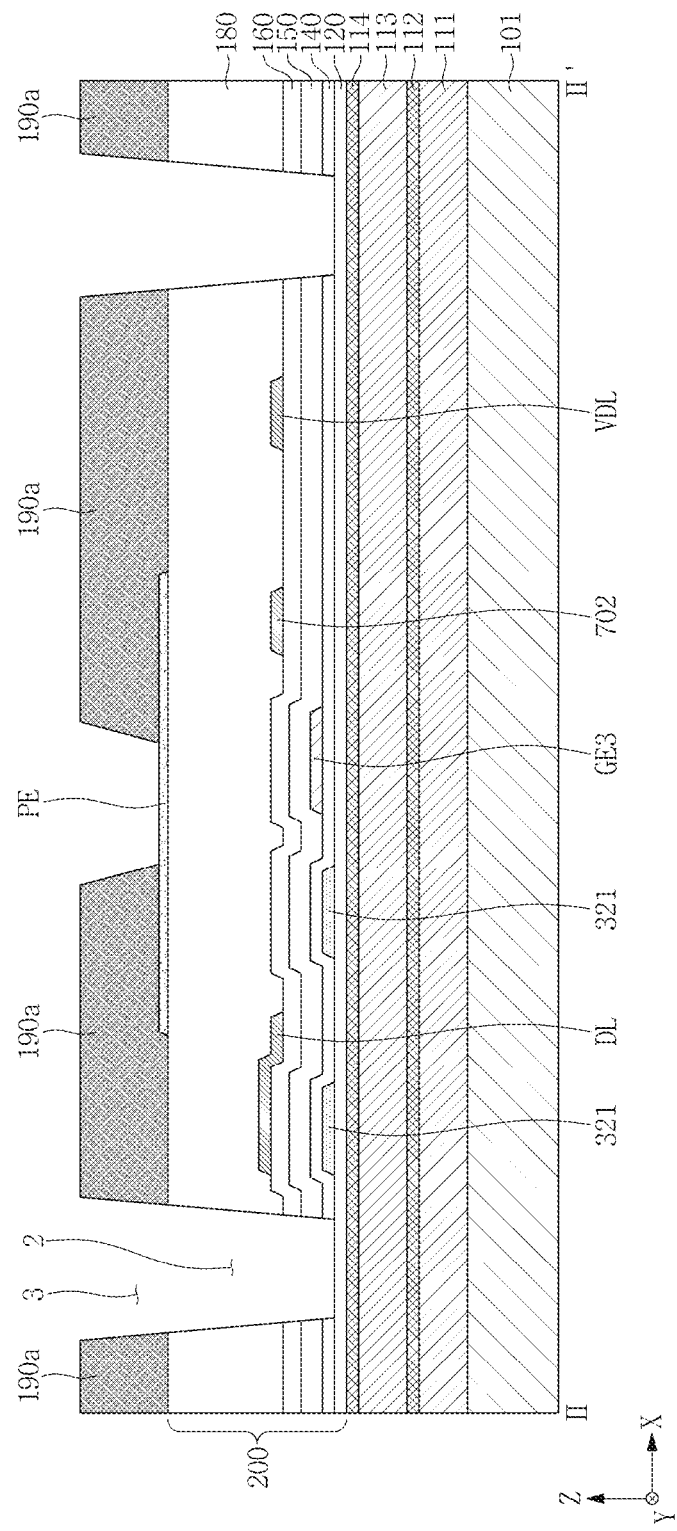

Next, as illustrated in FIG. 37C, an etching process is performed, using the intermediate light blocking layer 190a as a mask. The planarization layer 180, the second insulating interlayer 160, the first insulating interlayer 150, and the gate insulating layer 140 are sequentially patterned by this etching process. In other words, a portion of each of the planarization layer 180, the second insulating interlayer 160, the first insulating interlayer 150, and the gate insulating layer 140 that is exposed by the intermediate light blocking layer 190a is removed in a selective manner. Accordingly, a third intermediate hole 3 and a second intermediate hole 2 for exposing the buffer layer 120 are defined.

In an exemplary embodiment, the planarization layer 180, the second insulating interlayer 160, the first insulating interlayer 150, and the gate insulating layer 140 may be removed by a dry-etching method using an etching gas, for example.

Figure 37D:
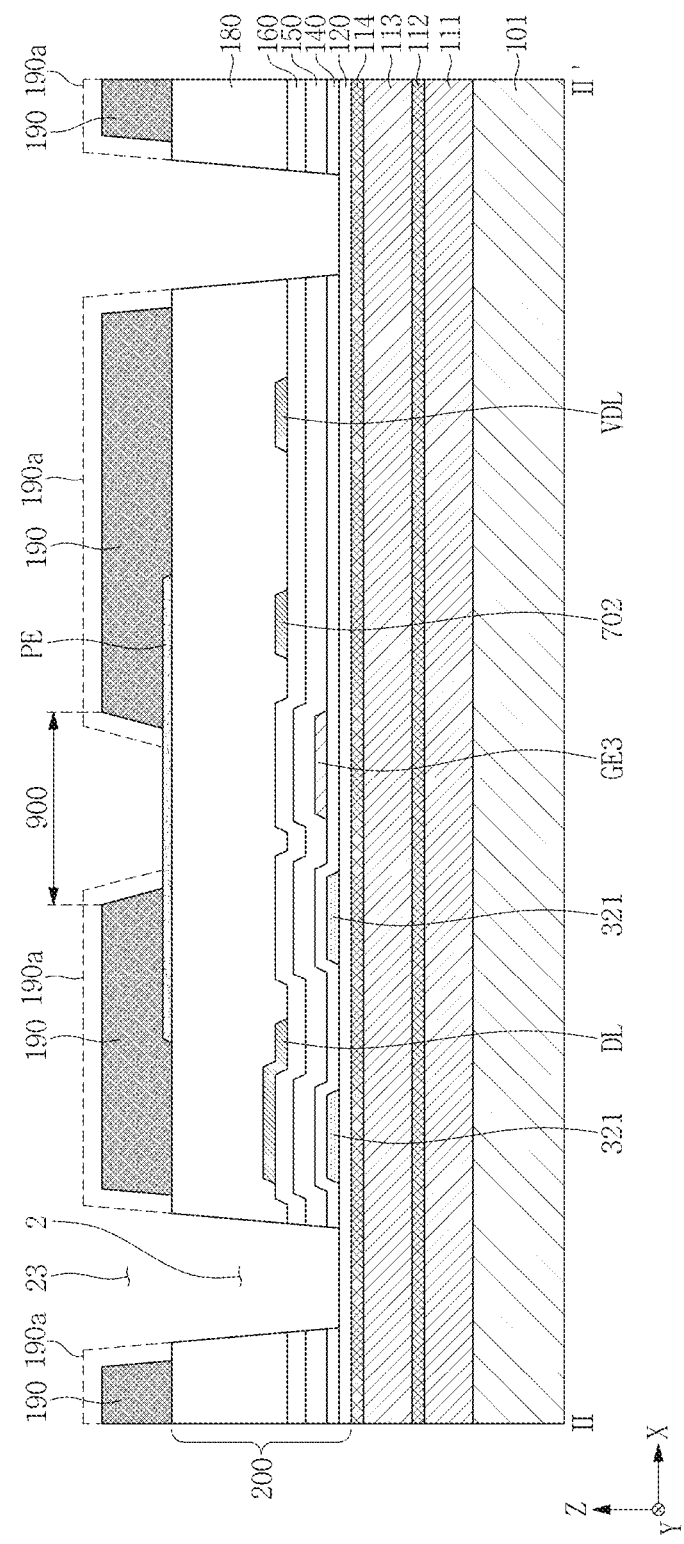

Then, as illustrated in FIG. 37D, an ashing process is performed. As a part of the intermediate light blocking layer 190a is removed by this ashing process, the light blocking layer 190 and the third hole 23 are formed. The light blocking layer 190 has a thickness and a width less than those of the intermediate light blocking layer 190a, and the third hole 23 has a width larger than a width of the third intermediate hole 3.

Next, although not illustrated, a photoresist is formed over the entire surface of the carrier substrate 101 including the light blocking layer 190.

Figure 37E:
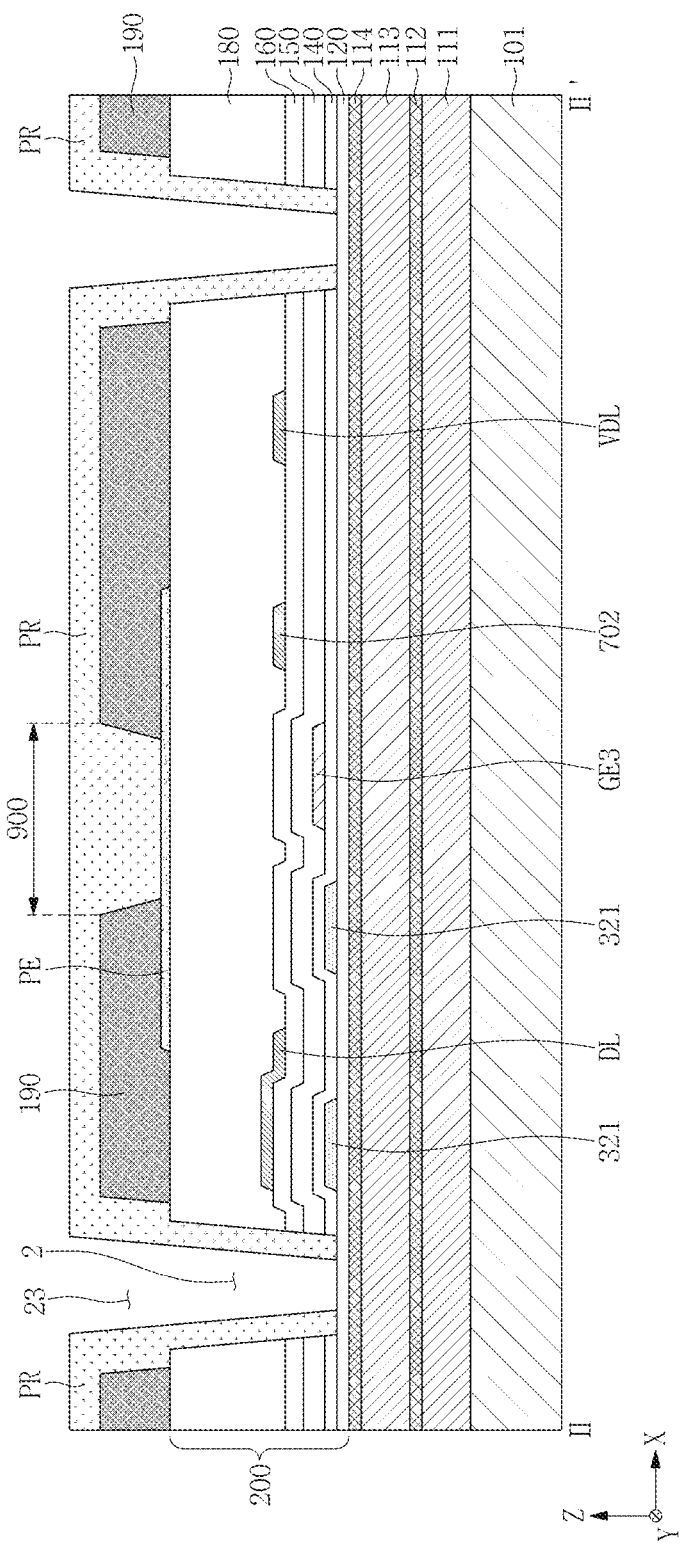

Then, when a part of the photoresist is selectively removed by an exposure process and a development process, a photoresist pattern PR is formed, as illustrated in FIG. 37E. The photoresist pattern PR exposes a part of the buffer layer 120. That is, the photoresist pattern PR masks remaining portions except for a part of the buffer layer 120.

Figure 37F:
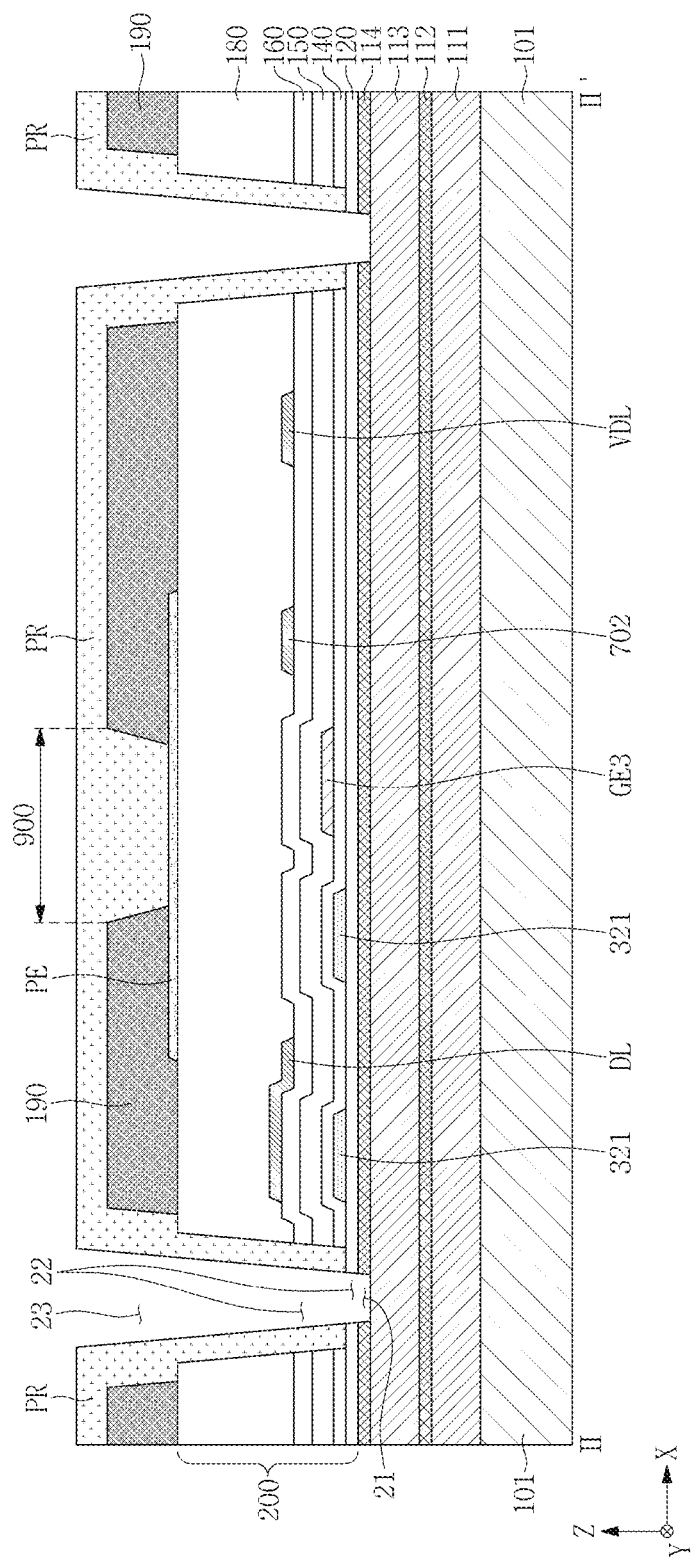

Next, as illustrated in FIG. 37F, an etching process is performed, using the photoresist pattern PR as a mask. The buffer layer 120 and the fourth layer 114 are sequentially patterned by this etching process. In other words, a portion of each of the buffer layer 120 and the fourth layer 114 that is exposed by the photoresist pattern PR is removed in a selective manner. Accordingly, the second hole 22 and the first hole 21 for exposing the third layer 113 are formed.

In an exemplary embodiment, each of the buffer layer 120 and the fourth layer 114 described above may be removed by a dry-etching method using an etching gas, for example.

Since the buffer layer 120 and the fourth layer 114 include an inorganic material, they may be removed by the above-described dry etching method. However, since the third layer 113 located beneath the fourth layer 114 includes an organic material, it may not be easily removed by a general dry etching method.

In an exemplary embodiment, the processes illustrated in FIGS. 37E and 37F may be performed substantially simultaneously with the step of removing the insulating layer located at the bending portion 77 of the display device 1000 illustrated in FIG. 1.

The display device 1000 is bent with respect to the bending portion 77. In an exemplary embodiment, a part of the display device at which the data driver 104 is located is bent, while rotating toward a back surface of the display device 1000, with respect to the bending portion 77, for example. In such an exemplary embodiment, a process of removing an insulating layer of the bending portion 77 is performed so that the display device 1000 may be bent well.

The buffer layer 120 and the fourth layer 114 described above may be removed together during the etching process for removing the insulating layer of the bending portion 77. In such an exemplary embodiment, the buffer layer 120 and the fourth layer 114 may be selectively removed without any additional process.

Figure 37G:
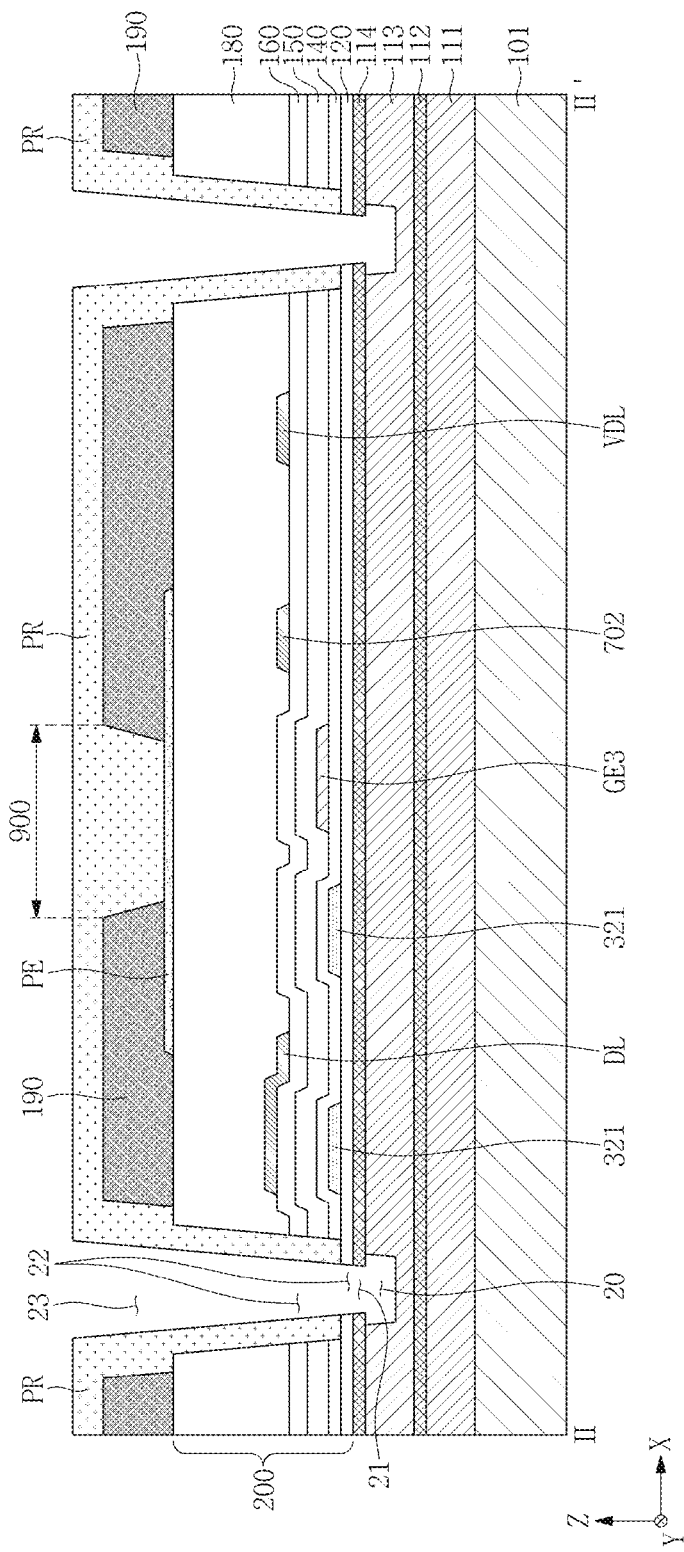

Next, as illustrated in FIG. 37G, an etching process is performed, using the photoresist pattern PR as a mask. A surface of the third layer 113 is patterned by this etching process. In other words, a portion of a surface of the third layer 113 that is exposed by the photoresist pattern PR is removed in a selective manner. Accordingly, the depression 20 is defined in the exposed surface of the third layer 113.

In an exemplary embodiment, since the third layer 113 includes an organic material, the third layer 113 may be removed by an etching method using oxygen (O$_2$) gas (e.g., oxygen etching or oxygen ashing), for example. Accordingly, a side surface of the fourth layer 114 (i.e., a surface that is exposed by the first hole 21) is not removed during the oxygen etching process of FIG. 37G, and only the third layer 113 including an organic material may be selectively removed.

As the time for the oxygen etching increases, the third layer 113 is removed more and a width of the depression 20 increases. In an exemplary embodiment, since the fourth layer 114 is not substantially removed during the oxygen etching process, a width of the first hole 21 is substantially maintained. When the width of the depression 20 of the third layer 113 is larger than the width of the first hole 21 because the oxygen etching time is sufficiently long, an under-cut phenomenon occurs in which the depression 20 extends to the below of the fourth layer 114. In other words, when the oxygen etching is performed for a long time to such an extent that the under-cut phenomenon of the third layer 113 occurs, the depression 20 of the third layer 113 may have a width larger than the width of the first hole 21 of the fourth layer 114.

Figure 37H:
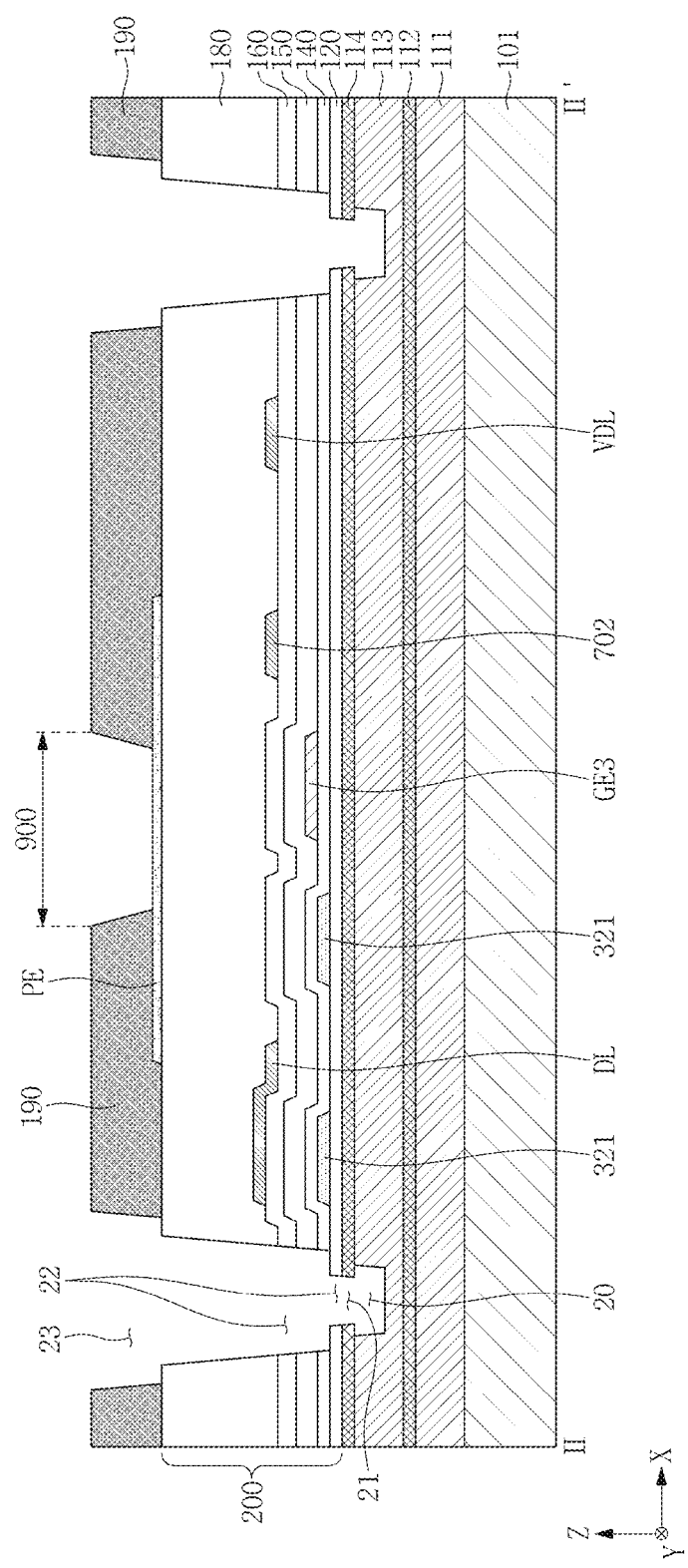

Subsequently, when the photoresist pattern PR is removed, a coupling depression 220 including the depression 20, the first hole 21, the second hole 22, and the third hole 23 is defined, as illustrated in FIG. 37H.

Figure 37I:
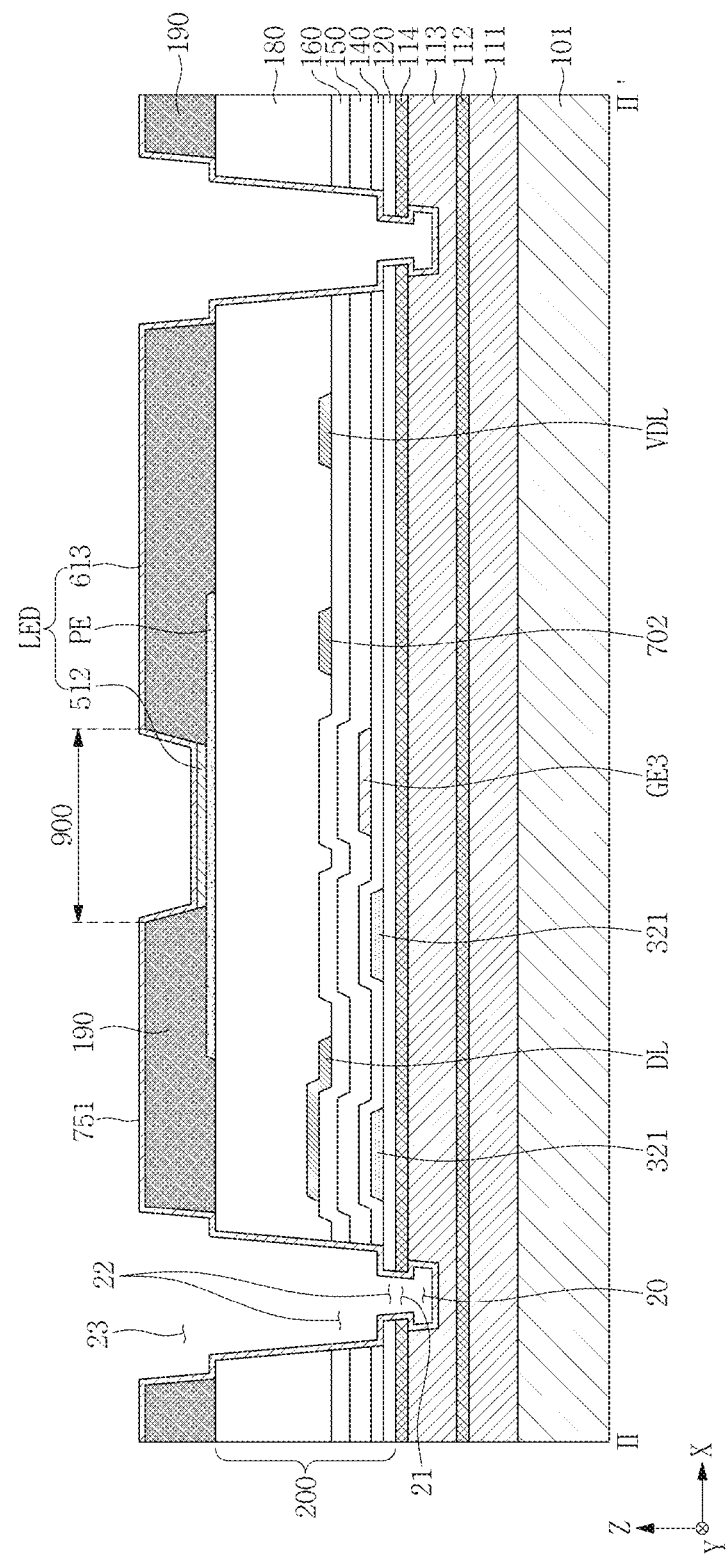

Thereafter, as illustrated in FIG. 37I, the light emitting layer 512 and the common electrode 613 are sequentially formed. The light emitting layer 512 is disposed on the pixel electrode PE in the light emission area 900, and the common electrode 613 is formed on the light blocking layer 190 and the light emitting layer 512. In addition, the common electrode 613 is formed along the inner wall of the coupling depression 220 (that is, a portion of each layer that is exposed by the coupling depression 220).

Figure 37J:
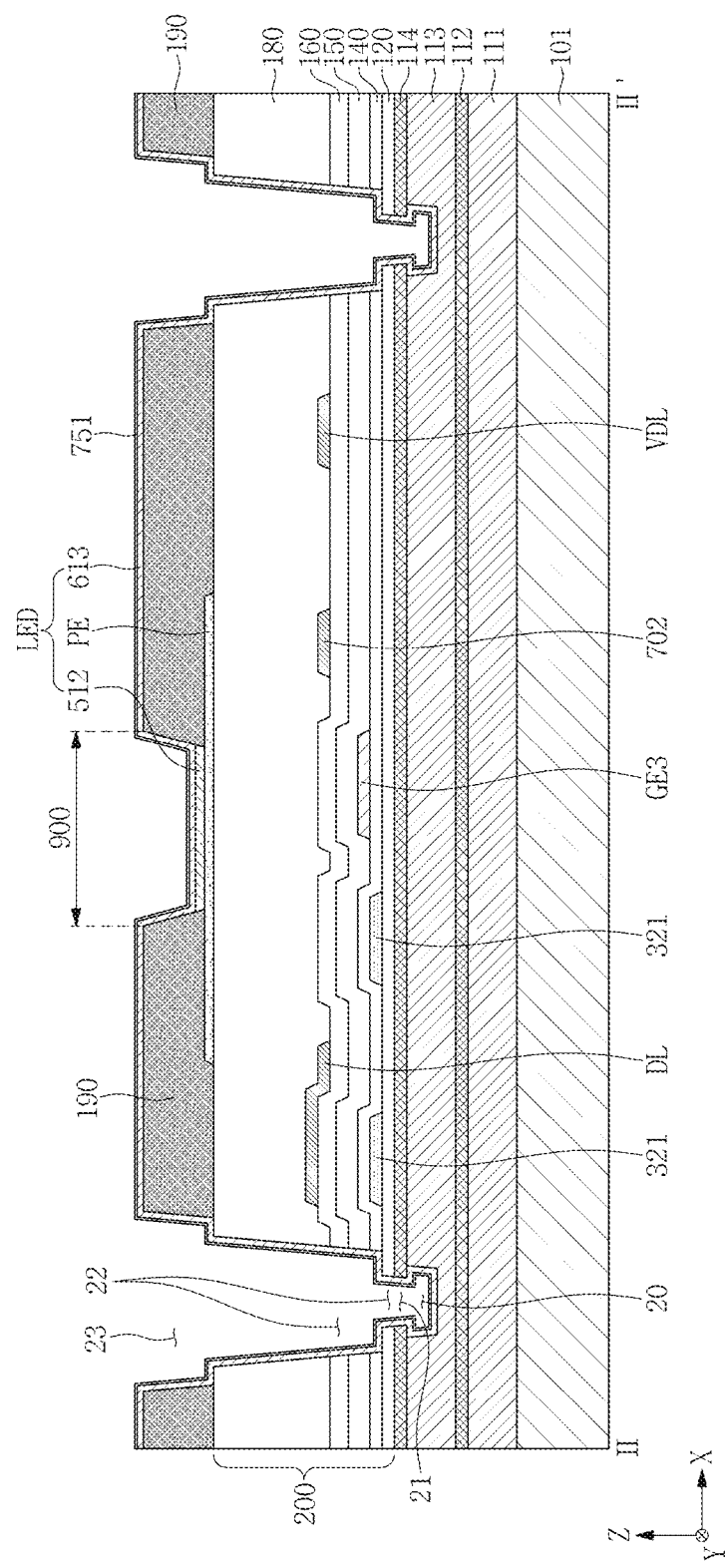
Figure 37K:
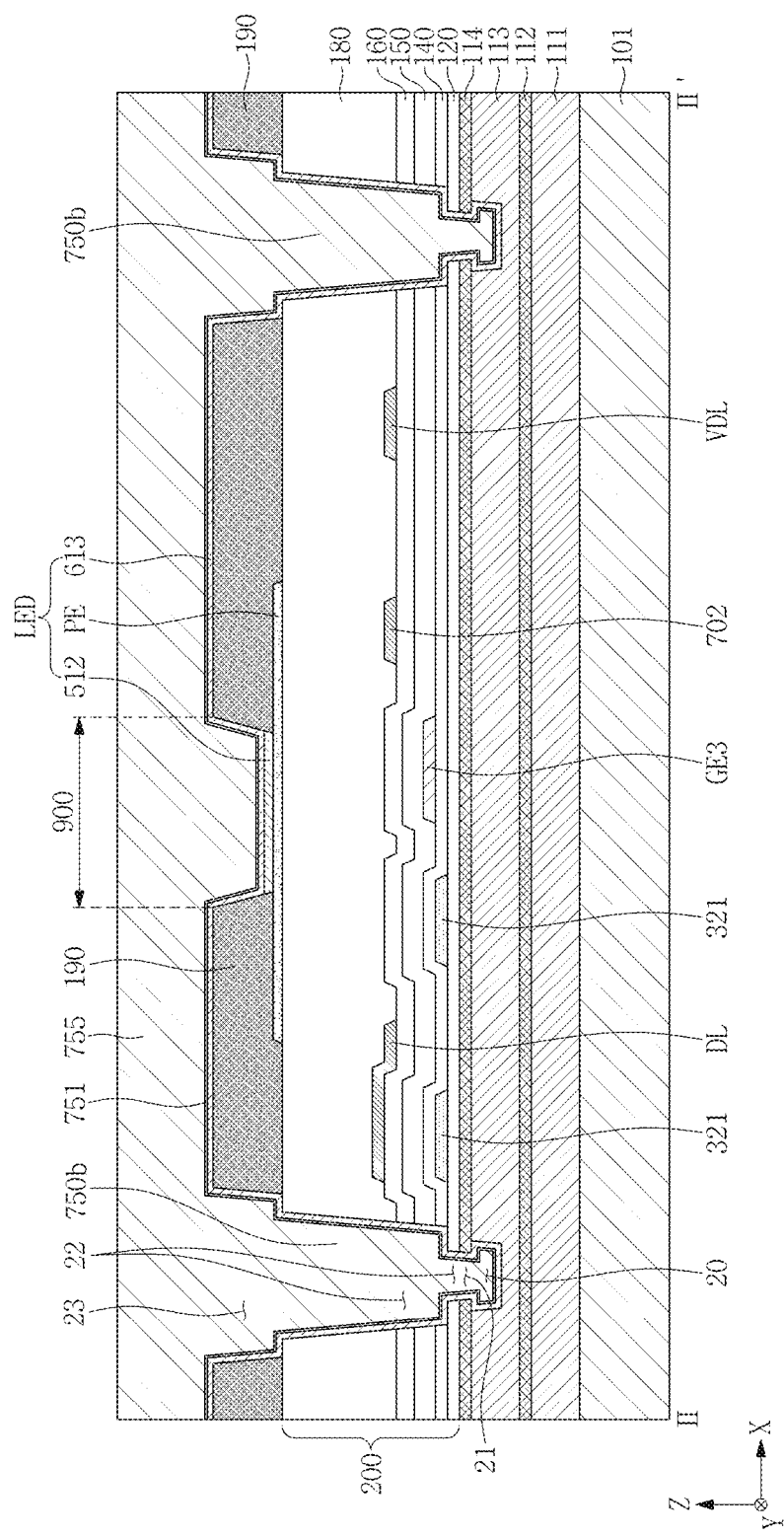
Figure 37L:
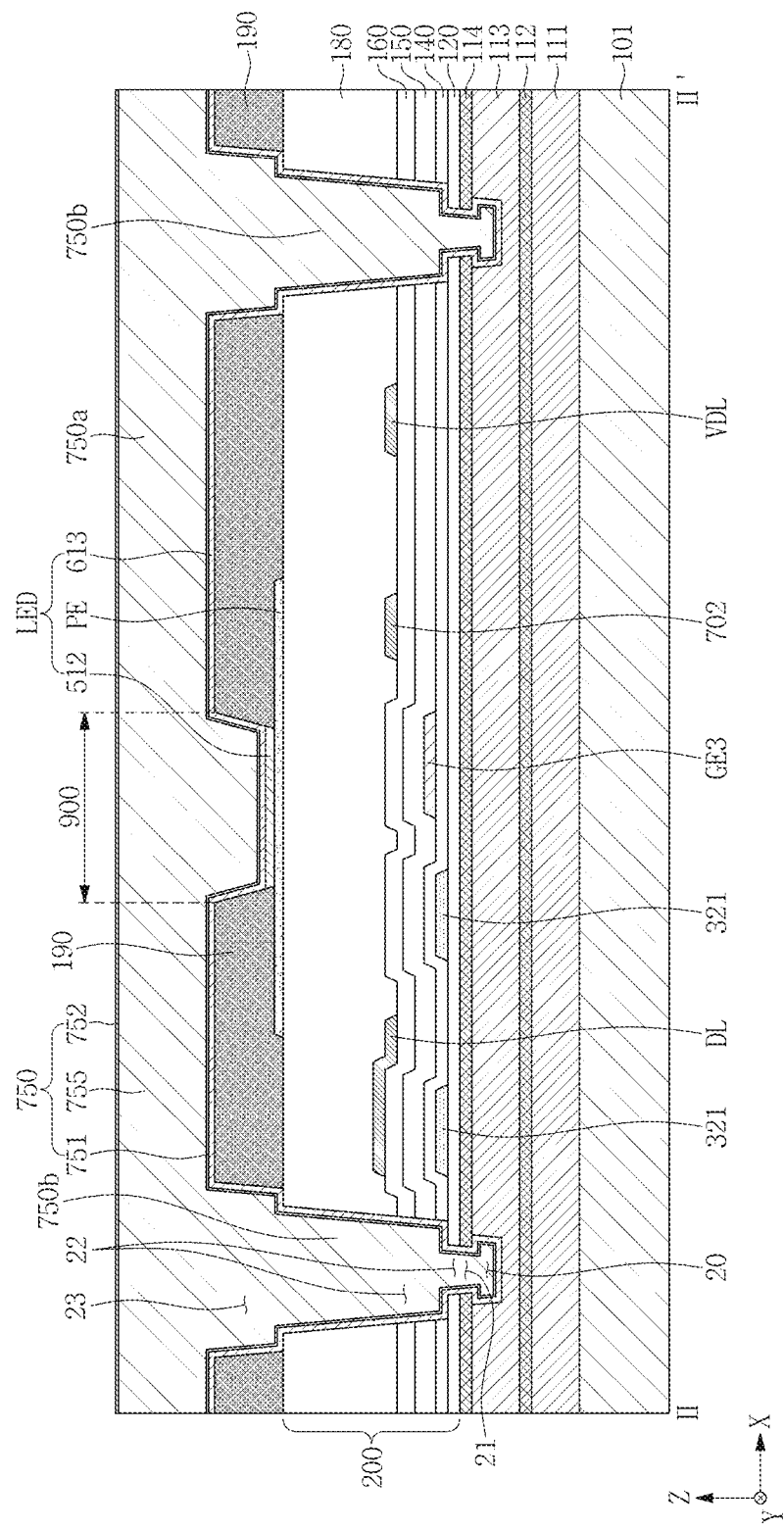

Next, as illustrated in FIGS. 37J to 37L, the sealing unit 750 is formed. The sealing unit 750 includes the first inorganic layer 751, the organic layer 755, and the second inorganic layer 752. A manufacturing method of the sealing unit 750 will be described below.

First, as illustrated in FIG. 37J, the first inorganic layer 751 is formed on the common electrode 613.

Next, as illustrated in FIG. 37K, the organic layer 755 is formed on the first inorganic layer 751.

Next, as illustrated in FIG. 37L, the second inorganic layer 752 is formed on the organic layer 755.

The sealing unit 750 manufactured through FIGS. 37J to 37L includes the cover portion 750a and the extension portion 750b, as illustrated in FIG. 37L. As illustrated in FIG. 37L, the extension portion 750b passes through the third hole 23, the second hole 22, and the first hole 21 to be inserted into the depression 20.

Figure 37M:
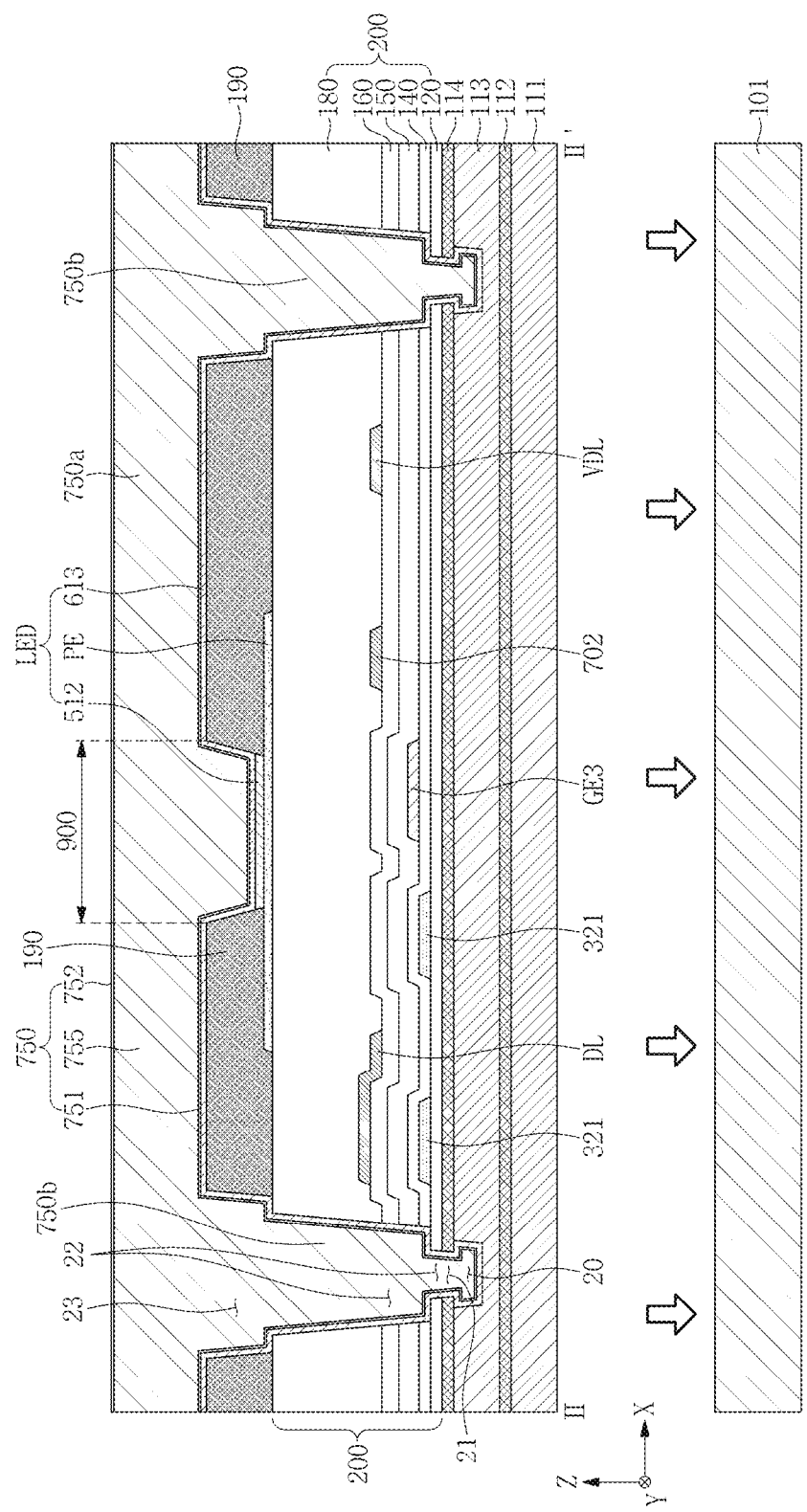

Next, the carrier substrate 101 is removed from the first layer 111, as illustrated in FIG. 37M.

Next, as illustrated in FIG. 6, the base layer 110 is attached to the first layer 111.

Figure 38:
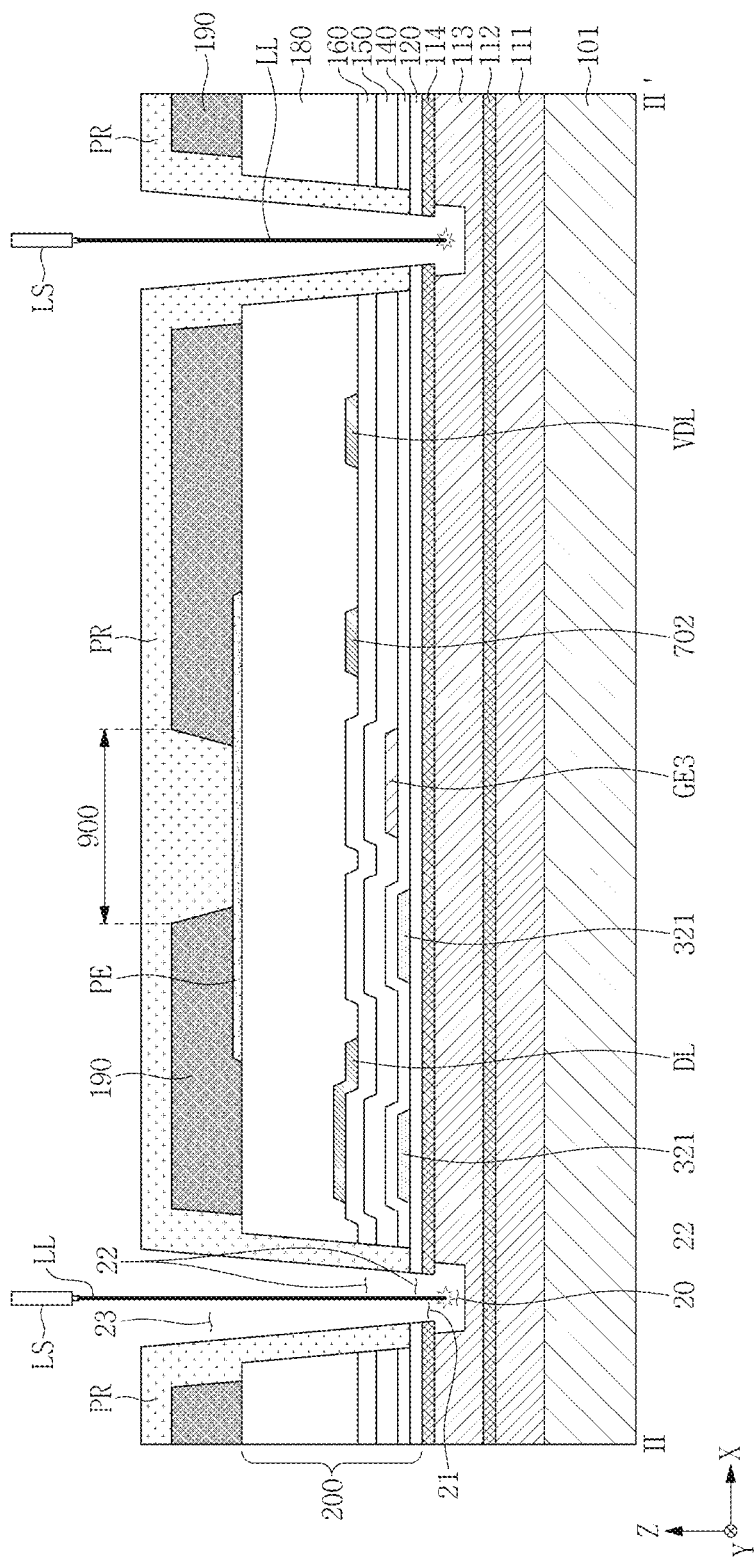
FIG. 38 is a view for explaining a method of defining a depression using a laser.

FIG. 38 is a view for explaining a method of defining a depression using a laser.

The depression 20 of the third layer 113 illustrated in FIG. 37G may be defined using laser beams instead of the above-described oxygen etching.

In an exemplary embodiment, after the process of FIG. 37F, a laser beam LL emitted from a laser apparatus LS is incident to a surface of the third layer 113, as illustrated in FIG. 38, for example. Then, the surface thereof is removed by the laser beam LL to define the depression 20. In other words, a portion of the surface of the third layer 113 that is exposed by the photoresist pattern PR is selectively removed by the laser beam LL. Accordingly, the depression 20 is defined in the exposed surface of the third layer 113.

In such an exemplary embodiment, when the emission time of the laser beam LL is sufficiently long or the intensity is sufficiently strong, the under-cut phenomenon described above occurs in the third layer 113. In other words, when the emission time or the intensity of the laser beam LL is adjusted to such an extent that the under-cut phenomenon occurs in the third layer 113, the depression 20 of the third layer 113 may have a width larger than a width of the first hole 21 of the fourth layer 114.

In an exemplary embodiment, the above-described laser beam LL may be emitted after the photoresist pattern PR is removed. Specifically, the photoresist pattern PR may be removed immediately after FIG. 37F and then the laser beam LL may be emitted toward the exposed surface of the third layer 113.

Figure 39:
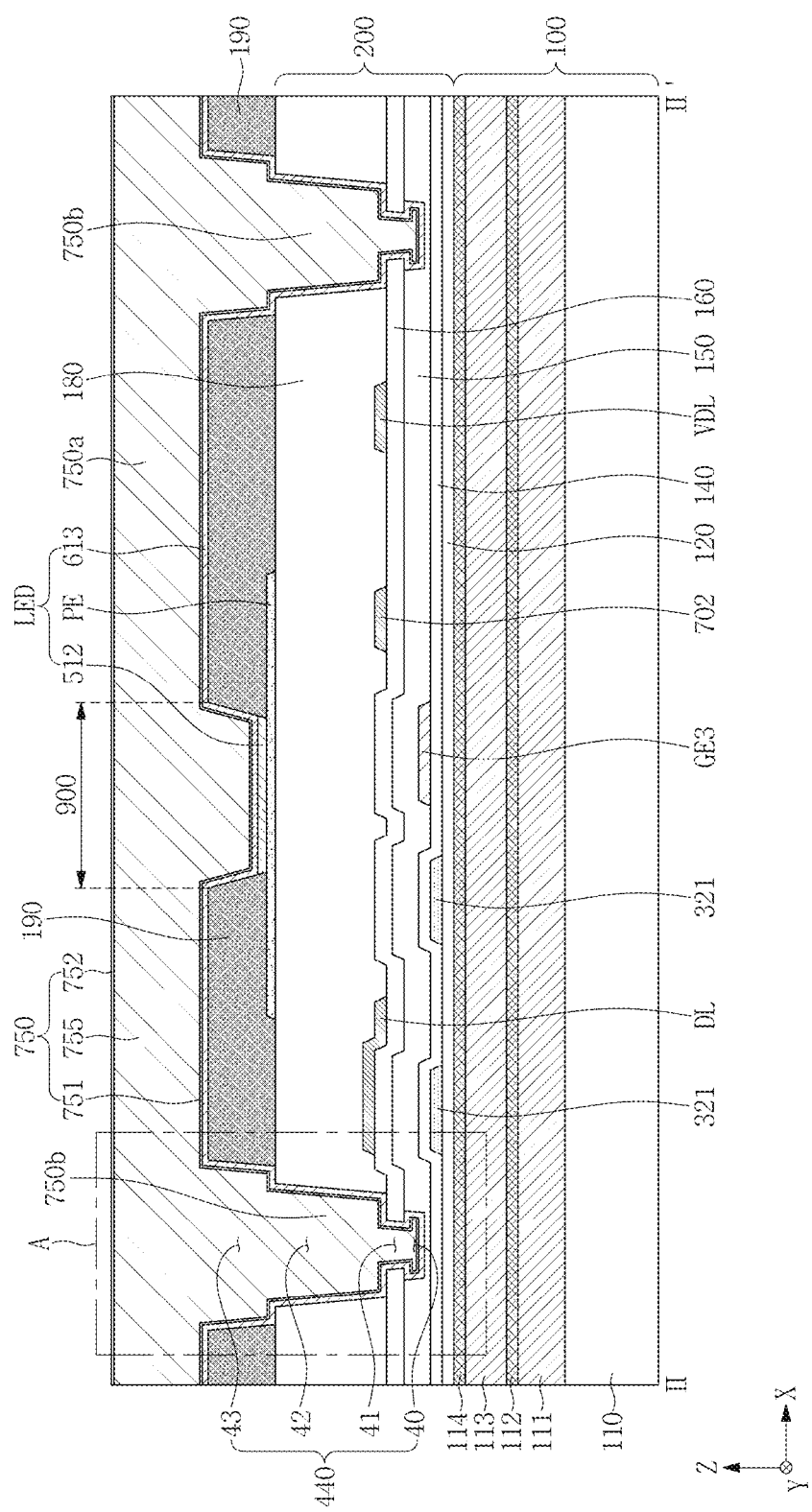
FIG. 39 is a cross-sectional view taken along line II-IF of another exemplary embodiment of FIG. 3 according to the invention.
Figure 40:
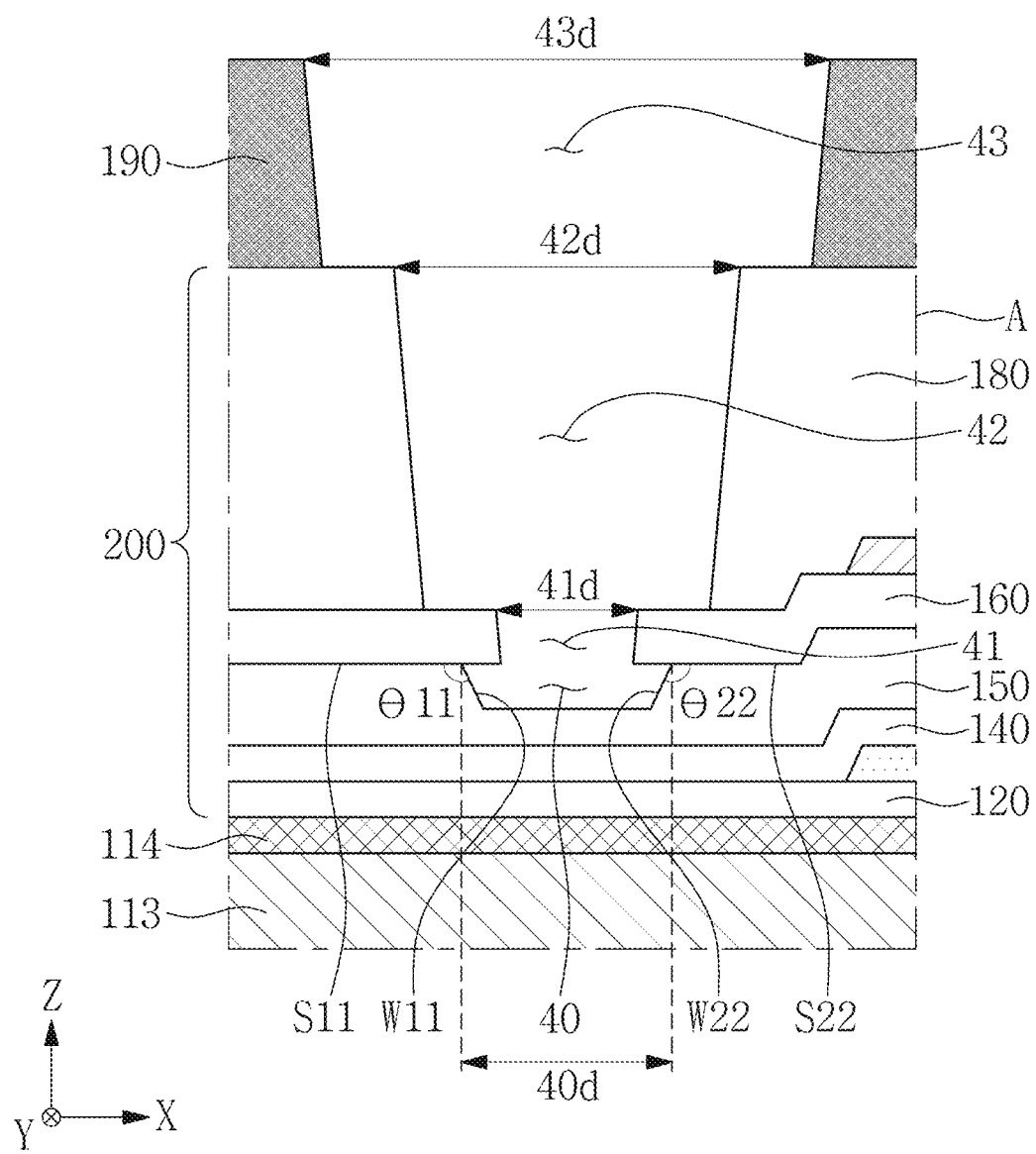
FIG. 40 is a view enlarging a portion A of FIG. 39.

FIG. 39 is a cross-sectional view taken along line II-IF of FIG. 3 according to another exemplary embodiment of the invention, and FIG. 40 is a view enlarging a portion A of FIG. 39. The sealing unit 750 and the common electrode 613 are omitted in FIG. 40.

A portion of the sealing unit 750 is inserted into the pixel circuit unit 200, as illustrated in FIG. 39. In an exemplary embodiment, the sealing unit 750 includes the cover portion 750a and the extension portion 750b extending from the cover portion 750a toward the pixel circuit unit 200, and the extension portion 750b is inserted into the pixel circuit unit 200, for example.

To this end, a hole or a depression at portions corresponding to the extension portion 750b of the sealing unit 750 is formed in the pixel circuit unit 200 and the light blocking layer 190. In an exemplary embodiment, a depression 40, a first hole 41, and a second hole 42 located corresponding to the extension portion 750b are formed in the pixel circuit unit 200, and a third hole 43 located corresponding to the extension portion 750b is formed in the light blocking layer 190, for example.

The depression 40 of the pixel circuit unit 200 may be located, for example, in the first insulating interlayer 150 of the pixel circuit unit 200. The first hole 41 of the pixel circuit unit 200 may be located in the second insulating interlayer 160 of the pixel circuit unit 200, for example. The second hole 42 of the pixel circuit unit 200 may be located in the planarization layer 180 of the pixel circuit unit 200.

The depression 40, the first hole 41, the second hole 42, and the third hole 43 are located corresponding to each other. In addition, adjacent ones of the depression 40, the first hole 41, the second hole 42, and the third hole 43 are connected to each other.

The first hole 41 may be located between the depression 40 and the second hole 42.

As illustrated in FIGS. 39 and 40, the depression 40 has a width (or diameter) which gradually increases along a direction (e.g., the Z-axis direction) from the first insulating interlayer 150 toward the second insulating interlayer 160. As illustrated in FIG. 40, a width 40d (or diameter) of the depression 40 is a value measured in the X-axis direction (or Y-axis direction). As used herein, the width 40d (or diameter) of the depression 40 means a maximum width (or maximum diameter) or an average width (or average diameter) of the depression 40.

At least one of mutually facing inner walls W11 and W22 of the depression 40 is inclined at a predetermined angle with respect to interfaces S11 and S22 between the first insulating interlayer 150 and the second insulating interlayer 160. In an exemplary embodiment, an angle defined between at least one of the mutually facing inner walls W11 and W22 and the interfaces S11 and S22 is an obtuse angle, for example. As a more specific example, an angle θ11 defined between the inner wall W11 and the interface S11 adjacent to the inner wall W11 is an obtuse angle.

The first hole 41 has a width (or diameter) which gradually increases along the Z-axis direction. A width 41d (or diameter) of the first hole 41 is a value measured in the X-axis direction (or Y-axis direction). In such an exemplary embodiment, the width 41d (or diameter) of the first hole 41 means a maximum width (or maximum diameter) or an average width (or average diameter) of the first hole 41.

The second hole 42 has a width (or diameter) which gradually increases along the Z-axis direction. A width 42d (or diameter) of the second hole 42 is a value measured in the X-axis direction (or Y-axis direction). In such an exemplary embodiment, the width 42d (or diameter) of the second hole 42 means a maximum width (or maximum diameter) or an average width (or average diameter) of the second hole 42.

The third hole 43 has a width (or diameter) which gradually increases along the Z-axis direction. A width 43d (or diameter) of the third hole 43 is a value measured in the X-axis direction (or Y-axis direction). In such an exemplary embodiment, the width 43d (or diameter) of the third hole 43 means a maximum width (or maximum diameter) or an average width (or average diameter) of the third hole 43.

The width 40d (or diameter) of the depression 40 is larger than the width 41d (or diameter) of the first hole 41. As illustrated in FIG. 40, a cross-section of the depression 40 and the first hole 41 may have the shape of an anchor. In such an exemplary embodiment, the cross-section of the extension portion 750b inserted into the depression 40 and the first hole 41 may also have the shape of an anchor.

From a planar point of view, the first hole 41 is surrounded by the depression 40. In addition, from a planar point of view of FIG. 1, the first hole 41 and the depression 40 overlap each other.

From a planar point of view, the first hole 41, the second hole 42, and the depression 40 are surrounded by the third hole 43.

The width 42d (or diameter) of the second hole 42 is larger than the width 41d (or diameter) of the first hole 41.

The width 43d (or diameter) of the third hole 43 is larger than the width 42d (or diameter) of the second hole 42.

The extension portion 750b of the sealing unit 750 described above is inserted (or buried) in the depression 40, the first hole 41, the second hole 42, and the third hole 43 having such a structure. In an exemplary embodiment, the extension portion 750b sequentially passes through the third hole 43, the second hole 42 and the first hole 41, and is inserted into the depression 40, for example. In such an exemplary embodiment, since the width 40d (or diameter) of the depression 40 is larger than the width 41d (or diameter) of the first hole 41, the extension portion 750b inserted into the depression 40, the first hole 41, the second hole 42, and the third hole 43 is not well separated in the Z-axis direction. Accordingly, a coupling force between the sealing unit 750 and the structure therebelow may be improved.

The depression 40, the first hole 41, the second hole 42, and the third hole 43 described above may be located in the display area 100a of the substrate 100. In an exemplary embodiment, when an entire hole including the depression 40, the first hole 41, the second hole 42, and the third hole 43 is defined as one coupling depression 440, the coupling depression 440 and the extension portion 750b may be located in the display area 100a of the substrate 100, for example.

The coupling depression 420 and the extension portion 750b of the display area 100a may be located between the high potential line VDL and the data line DL which are adjacent to each other.

The above-described coupling depression 440 and the extension portion 750b may be located in the non-display area 100b of the substrate 100. In an exemplary embodiment, the coupling depression 440 and the extension portion 750b of the non-display area 100b may be located between adjacent clock lines CL, for example.

In addition, although not illustrated, the above-described coupling depression 440 and the extension portion 750b may be located between clock lines connected to the emission control driver 103.

The depression illustrated in FIG. 39 may be defined by the above-described oxygen etching or laser beams LL. In such an exemplary embodiment, the first insulating interlayer 150 may include an organic material, and the second insulating interlayer 160 may include an inorganic material.

In an exemplary embodiment, when the first insulating interlayer 150 and the second insulating interlayer 160 both include an inorganic material, the first insulating interlayer 150 and the second insulating interlayer 160 may be removed by a general dry etching method. In such an exemplary embodiment, it is desirable that a difference between an etching rate of the first insulating interlayer 150 and an etching rate of the second insulating interlayer 160 become larger. In an exemplary embodiment, it is desirous that the first insulating interlayer 150 have a higher etching rate than that of the second insulating interlayer 160, for example.

Figure 41:
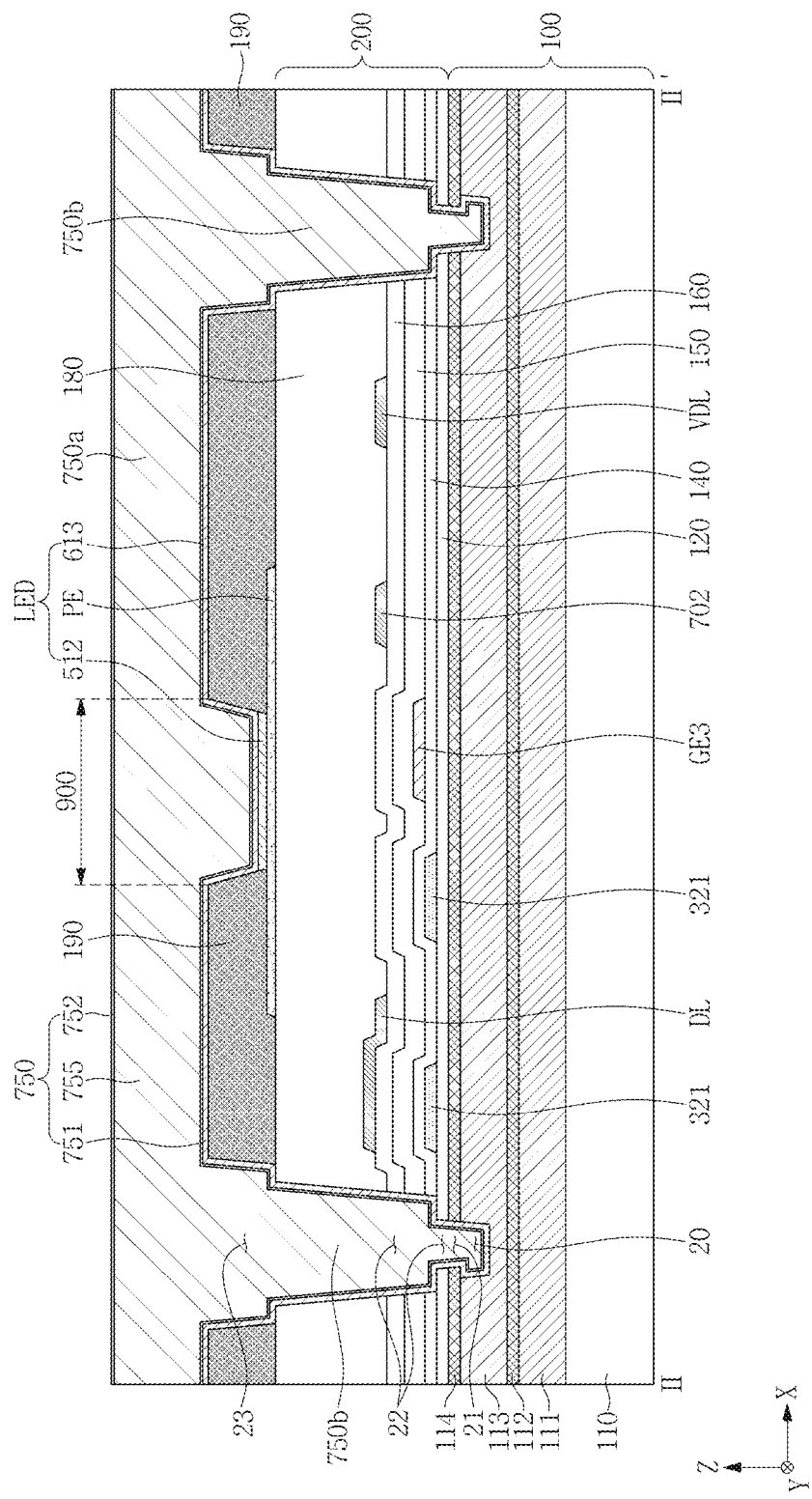
FIG. 41 is a cross-sectional view taken along line of another exemplary embodiment of FIG. 3.

FIG. 41 is a cross-sectional view taken along line II-II' of FIG. 3 according to another exemplary embodiment.

As illustrated in FIG. 41, one of mutually facing inner walls of the depression 20 and one of mutually facing inner walls of the first hole 21 may be located on a straight line. Accordingly, a cross-section of the depression 20 may have an asymmetrical shape with respect to the Z-axis.

In an exemplary embodiment, when the depression 20 and the first hole 21 located on the left side of FIG. 41 are defined as a left depression and a first left hole, respectively, and the depression 20 and the first hole 21 located on the right side of FIG. 41 are defined as a right depression and a first right hole, respectively, a right inner wall of the left depression and a right inner wall of the first left hole are located on a straight line, and a left inner wall of the right depression and a left inner wall of the first right hole are located on a straight line, for example.

The structure of the depression 20 illustrated in FIG. 41 may be made by the laser beam LL described above. In an exemplary embodiment, the depression 20 having the structure illustrated in FIG. 41 may be defined by adjusting an emission angle of the laser beam LL, for example.

Figure 42:
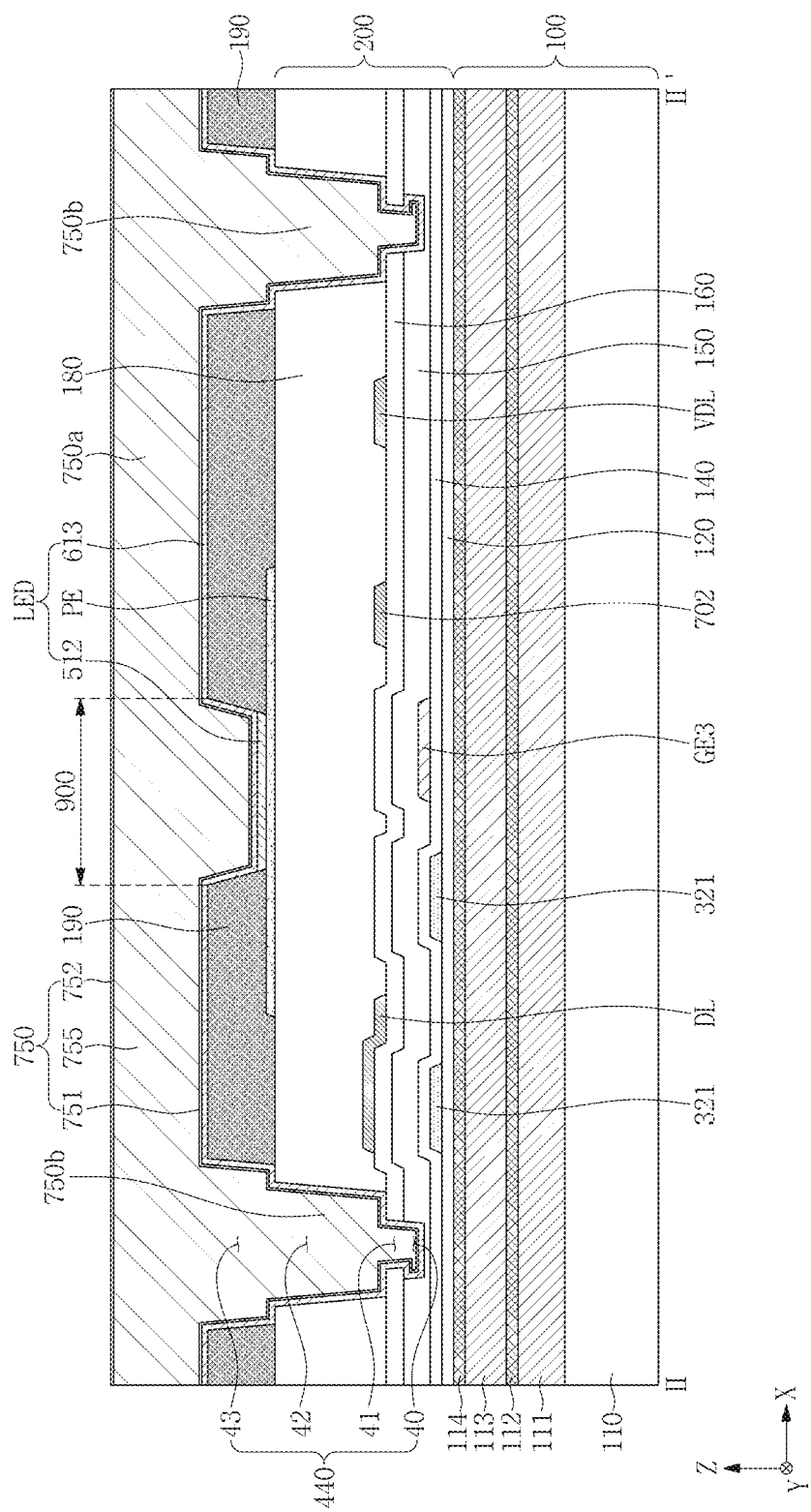
FIG. 42 is a cross-sectional view taken along line of another exemplary embodiment of FIG. 3.

FIG. 42 is a cross-sectional view taken along line II-II' of FIG. 3 according to another exemplary embodiment.

As illustrated in FIG. 42, one of mutually facing inner walls of the depression 40 and one of mutually facing inner walls of the first hole 41 may be located on a straight line. Accordingly, a cross-section of the depression 40 may have an asymmetrical shape with respect to the Z-axis.

In an exemplary embodiment, when the depression 40 and the first hole 41 located on the left side of FIG. 42 are defined as a left depression and a first left hole, respectively, and the depression 40 and the first hole 41 located on the right side of FIG. 42 are defined as a right depression and a first right hole, respectively, a right inner wall of the left depression and a right inner wall of the first left hole are located on a straight line, and a left inner wall of the right depression and a left inner wall of the first right hole are located on a straight line, for example.

The structure of the depression 40 illustrated in FIG. 42 may be made by the laser beam LL described above. In an exemplary embodiment, the depression 40 having the structure illustrated in FIG. 42 may be defined by adjusting an emission angle of the laser beam LL, for example.

As set forth hereinabove, a display device according to one or more embodiments may provide the following effects.

First, a sealing unit is coupled to a depression of a substrate or a pixel circuit unit. Accordingly, a coupling force between the sealing unit and the substrate may be improved. By such coupling force enhancement, a dead space of the display device may be substantially minimized.

Second, the sealing unit including a composite inorganic layer according to one or more embodiments of the invention may have excellent UV light blocking ability.

Third, adhesion between inorganic layers in the composite inorganic layer according to one or more embodiments of the invention may be improved.

Fourth, a coupling force between the sealing unit and the substrate may be improved.

While the invention has been illustrated and described with reference to the exemplary embodiments thereof, it will be apparent to those of ordinary skill in the art that various changes in form and detail may be made thereto without departing from the spirit and scope according to an exemplary embodiment of the invention.

What is claimed is:

1. A display device comprising:
    a substrate;
    a pixel circuit unit disposed on the substrate and having a second hole;
    a light blocking layer disposed on the pixel circuit unit and having a third hole, the third hole located corresponding to the second hole;
    a light emitting layer disposed on the pixel circuit unit to correspond to a light emission area defined by the light blocking layer; and
    a sealing unit on the light blocking layer,
    wherein the substrate comprises:
        a first layer having a depression corresponding to the second hole; and
        a second layer disposed between the first layer and the pixel circuit unit and having a first hole between the depression and the second hole,
    the sealing unit comprises:
        a cover portion disposed on the light blocking layer; and
        an extension portion extending from the cover portion to be inserted into the first hole, the second hole, the third hole and the depression, and
    the depression has a width larger than a width of the first hole, the pixel circuit unit comprises:
    a buffer layer on the second layer;
    a gate insulating layer on the buffer layer;
    a first insulating interlayer on the gate insulating layer;
    a second insulating interlayer on the first insulating layer;
    a planarization layer on the second insulating layer,
    the second hole penetrates the buffer layer, the gate insulating layer, the first insulating interlayer, the second insulating interlayer and the planarization layer.

2. The display device of claim 1, wherein the depression has a width gradually increasing along a direction from the first layer toward the second layer.

3. The display device of claim 2, wherein at least one of mutually facing inner walls of the depression is inclined at a predetermined angle with respect to an interface between the first layer and the second layer.

4. The display device of claim 3, wherein an angle defined between the at least one of mutually facing inner walls of the depression and the interface is an obtuse angle.

5. The display device of claim 1, wherein the first hole is surrounded by the depression in a plan view.

6. The display device of claim 1, wherein the first hole overlaps the depression.

7. The display device of claim 1, wherein the first hole, the second hole, the third hole, and the depression are located in at least one of a display area and a non-display area of the substrate.

8. The display device of claim 7, wherein the first hole, the second hole, the third hole, and the depression are located between a high potential line and a data line disposed in the display area and are adjacent to each other.

9. The display device of claim 7, further comprising a driving circuit unit located in the non-display area and connected to a scan line or an emission control line of the pixel circuit unit.

10. The display device of claim 9, further comprising a plurality of clock lines disposed in the non-display area and connected to the driving circuit unit, wherein the first hole, the second hole, the third hole, and the depression are located between adjacent clock lines of the plurality of clock lines.

11. The display device of claim 1, wherein one of mutually facing inner walls of the depression and one of mutually facing inner walls of the second hole are located on a straight line.

12. The display device of claim 1, wherein one of the first layer and the second layer comprises an organic material, and the other of the first layer and the second layer comprises an inorganic material.

13. The display device of claim 1, wherein the second hole include a buffer hole penetrating the buffer layer, a gate hole penetrating the gate insulating layer, a first interlayer hole penetrating the first insulating interlayer, a second interlayer hole penetrating the second insulating interlayer and a planarization hole penetrating the planarization layer.

14. A display device comprising:
    a substrate;
    a switching element on the substrate;
    a pixel electrode connected to the switching element;
    a light emitting layer on the pixel electrode;
    a sealing portion comprising a cover portion on the light emitting layer and an extension portion extending from the cover portion toward the substrate;
    wherein the extension portion comprises:
        a first portion; and
        a second portion being closer to the cover portion than the first portion,
        the first portion has a larger width than the second portion.

15. The display device of claim 14, further comprising:
    a pixel circuit unit in which the switching element is disposed; and a light blocking layer defining a light emitting region of the light emitting layer, wherein:

the pixel circuit unit has a second hole, the light blocking layer has a third hole corresponding to the second hole, the substrate comprises a first layer and a second layer, the second layer being disposed between the first layer and the pixel circuit unit, the first layer has a depression corresponding to the second hole, the second layer has a first hole disposed between the depression and the second hole, the extension portion of the sealing portion is inserted into the first hole, the second hole, the third hole and the depression, and the first portion of the sealing portion is disposed corresponding to the depression, the second portion of the sealing portion is disposed corresponding to the first hole, the depression has a width larger than a width of the first hole.

\* \* \* \* \*